(12) United States Patent
Hayami et al.

(10) Patent No.: US 7,003,046 B2
(45) Date of Patent: Feb. 21, 2006

(54) MODULATION SYSTEM

(75) Inventors: Atsushi Hayami, Yokohama (JP); Takayuki Sugahara, Yokosuka (JP)

(73) Assignee: Victor Company of Japan, Ltd., Yokohama (JP)

(*) Notice: Subject to any disclaimer, the term of this patent is extended or adjusted under 35 U.S.C. 154(b) by 730 days.

(21) Appl. No.: 09/987,034

(22) Filed: Nov. 13, 2001

(65) Prior Publication Data
US 2002/0085644 A1 Jul. 4, 2002

(30) Foreign Application Priority Data
Dec. 28, 2000 (JP) ............................. 2000-400671
Jan. 22, 2001 (JP) ............................. 2001-013313

(51) Int. Cl.
*H03K 7/06* (2006.01)
(52) U.S. Cl. ..................................................... 375/271
(58) Field of Classification Search ............ 375/240.27, 375/240.24, 240.23, 246, 265, 341; 714/759, 714/762, 795, 758; 341/59; 386/81
See application file for complete search history.

(56) References Cited

U.S. PATENT DOCUMENTS

| 4,056,828 A | * | 11/1977 | Furuta ........................ 382/245 |
| 4,942,467 A | * | 7/1990 | Waldman et al. ...... 375/240.14 |
| 5,574,448 A | * | 11/1996 | Weng et al. ................... 341/59 |
| 5,631,909 A | * | 5/1997 | Weng et al. ................. 714/704 |
| 5,995,707 A | * | 11/1999 | Lee ............................... 386/91 |
| 6,118,904 A | * | 9/2000 | Detch et al. ................ 382/245 |
| 6,263,466 B1 | * | 7/2001 | Hinedi et al. ............... 714/755 |
| 6,288,655 B1 | * | 9/2001 | Tsang et al. .................. 341/59 |
| 2003/0115533 A1 | * | 6/2003 | Asada et al. ................ 714/758 |

FOREIGN PATENT DOCUMENTS

| JP | 10-269289 | 10/1998 |
| JP | 10-283268 | 10/1998 |
| JP | 11-120633 | 4/1999 |
| JP | 2000-286709 | 10/2000 |

* cited by examiner

Primary Examiner—Emmanuel Bayard
(74) Attorney, Agent, or Firm—Louis Woo

(57) ABSTRACT

A final 15-bit output code word is generated in response to every 8-bit input code word by referring to a set of encoding tables. The encoding tables contain output code words assigned to input code words, and contain state information accompanying each output code word. The state information designates an encoding table among the encoding tables which is used next to generate an output code word immediately following the output code word accompanied with the state information. When given conditions are satisfied, first and second candidate current output code words generated in response to a current input code word by referring to first and second specified ones of the encoding tables. One is selected from the first and second candidate current output code words as a final current output code word in response to DSV calculation results. Auxiliary information is superimposed on a sequence of final output code words.

34 Claims, 25 Drawing Sheets

FIG. 2

| RECORDING SECTOR | 0 | 1 | 2 | 3 | 4 | ... |
|---|---|---|---|---|---|---|
| MAX RUN SETTING | 1 | 0 | 0 | 1 | 1 | ... |
| Tmax | 12 | 11 | 11 | 12 | 12 | ... |

| INPUT | S=0 CODE | S=0 WORD | S=0 Snext | S=1 CODE | S=1 WORD | S=1 Snext | S=3 CODE | S=3 WORD | S=3 Snext | S=4 CODE | S=4 WORD | S=4 Snext | S=5 CODE | S=5 WORD | S=5 Snext |
|---|---|---|---|---|---|---|---|---|---|---|---|---|---|---|---|
| 50 | 578 | 0000010010000010 | 3 | 1092 | 0000100010001100 | 4 | 8338 | 0100000100010010 | 3 | 16450 | 1000000001000010 | 1 | 17409 | 1000100000000001 | 0 |
| 51 | 584 | 0000010010001000 | 1 | 1092 | 0000100010001100 | 5 | 8200 | 0100000000001000 | 1 | 16450 | 1000000001000010 | 2 | 17409 | 1000100000000001 | 1 |
| 52 | 584 | 0000010010001000 | 0 | 1096 | 0000100010001000 | 1 | 8200 | 0100000000001000 | 3 | 16450 | 1000000001000010 | 3 | 17410 | 1000100000000010 | 2 |
| 53 | 584 | 0000010010001000 | 4 | 1096 | 0000100010001000 | 3 | 8200 | 0100000000001000 | 4 | 16452 | 1000000001000100 | 4 | 17410 | 1000100000000010 | 3 |
| 54 | 584 | 0000010010001000 | 5 | 1096 | 0000100010001000 | 4 | 8200 | 0100000000001000 | 5 | 16452 | 1000000001000100 | 3 | 17410 | 1000100000000010 | 1 |
| 55 | 585 | 0000010010001001 | 0 | 1096 | 0000100010001000 | 5 | 8201 | 0100000000001001 | 1 | 16452 | 1000000001000100 | 0 | 17412 | 1000100000000100 | 3 |
| 56 | 585 | 0000010010001001 | 1 | 1097 | 0000100010001001 | 1 | 8201 | 0100000000001001 | 0 | 16452 | 1000000001000100 | 5 | 17412 | 1000100000000100 | 4 |
| 57 | 34  | 0000000000100010 | 2 | 1097 | 0000100010001001 | 2 | 8322 | 0100000100000010 | 2 | 16513 | 1000000010000001 | 1 | 17412 | 1000100000000100 | 0 |
| 58 | 34  | 0000000000100010 | 3 | 1152 | 0000100010000000 | 3 | 8322 | 0100000100000010 | 3 | 16513 | 1000000010000001 | 2 | 17412 | 1000100000000100 | 1 |
| 59 | 34  | 0000000000100010 | 4 | 1152 | 0000100010000000 | 5 | 8322 | 0100000100000010 | 5 | 16514 | 1000000010000010 | 3 | 17416 | 1000100000001000 | 3 |
| 60 | 128 | 0000000010000000 | 5 | 1152 | 0000100010000000 | 1 | 8320 | 0100000100000000 | 0 | 16514 | 1000000010000010 | 2 | 17416 | 1000100000001000 | 4 |
| 61 | 128 | 0000000010000000 | 4 | 1153 | 0000100010000001 | 0 | 8320 | 0100000100000000 | 1 | 16400 | 1000000000010000 | 3 | 17416 | 1000100000001000 | 5 |
| 62 | 128 | 0000000010000000 | 1 | 1153 | 0000100010000001 | 1 | 8320 | 0100000100000000 | 2 | 16400 | 1000000000010000 | 0 | 17416 | 1000100000001000 | 1 |
| 63 | 129 | 0000000010000001 | 2 | 1154 | 0000100010000010 | 2 | 8257 | 0100000010000001 | 0 | 16416 | 1000000000100000 | 1 | 17417 | 1000100000001001 | 3 |
| 64 | 129 | 0000000010000001 | 3 | 1154 | 0000100010000010 | 3 | 8257 | 0100000010000001 | 2 | 16416 | 1000000000100000 | 2 | 17417 | 1000100000001001 | 4 |
| 65 | 130 | 0000000010000010 | 1 | 1154 | 0000100010000010 | 4 | 8258 | 0100000010000010 | 3 | 16416 | 1000000000100000 | 3 | 17424 | 1000100000010000 | 5 |
| 66 | 130 | 0000000010000010 | 2 | 1156 | 0000100010000100 | 2 | 8258 | 0100000010000010 | 4 | 16416 | 1000000000100000 | 5 | 17424 | 1000100000010000 | 3 |
| 67 | 130 | 0000000010000010 | 3 | 1156 | 0000100010000100 | 3 | 8258 | 0100000010000010 | 5 | 16417 | 1000000000100001 | 3 | 17424 | 1000100000010000 | 4 |
| 68 | 132 | 0000000010000100 | 4 | 1156 | 0000100010000100 | 5 | 8228 | 0100000000100100 | 1 | 16530 | 1000000010010010 | 5 | 17440 | 1000100000100000 | 5 |
| 69 | 132 | 0000000010000100 | 5 | 1156 | 0000100010000100 | 1 | 8228 | 0100000000100100 | 3 | 16530 | 1000000010010010 | 3 | 17440 | 1000100000100000 | 3 |
| 70 | 132 | 0000000010000100 | 1 | 1156 | 0000100010000100 | 4 | 8228 | 0100000000100100 | 4 | 16420 | 1000000000100100 | 4 | 17440 | 1000100000100000 | 4 |
| 71 | 132 | 0000000010000100 | 5 | 1160 | 0000100010001000 | 5 | 8260 | 0100000001000100 | 0 | 16420 | 1000000000100100 | 0 | 17441 | 1000100000100001 | 1 |
| 72 | 144 | 0000000010010000 | 3 | 1160 | 0000100010001000 | 1 | 8260 | 0100000001000100 | 1 | 16420 | 1000000000100100 | 1 | 17442 | 1000100000100010 | 3 |
| 73 | 144 | 0000000010010000 | 4 | 1160 | 0000100010001000 | 2 | 8260 | 0100000001000100 | 2 | 16448 | 1000000001000000 | 2 | 17442 | 1000100000100010 | 4 |
| 74 | 144 | 0000000010010000 | 5 | 1161 | 0000100010001001 | 3 | 8448 | 0100001000000000 | 3 | 16448 | 1000000001000000 | 4 | 17442 | 1000100000100010 | 1 |
| 75 | 256 | 0000000100000000 | 4 | 1161 | 0000100010001001 | 4 | 8448 | 0100001000000000 | 5 | 16448 | 1000000001000000 | 5 | 17444 | 1000100000100100 | 5 |
| 76 | 256 | 0000000100000000 | 3 | 1168 | 0000100010010000 | 3 | 8264 | 0100000001001000 | 0 | 16640 | 1000000100000000 | 3 | 17444 | 1000100000100100 | 1 |
| 77 | 256 | 0000000100000000 | 5 | 1168 | 0000100010010000 | 4 | 8264 | 0100000001001000 | 2 | 16640 | 1000000100000000 | 4 | 17444 | 1000100000100100 | 4 |
| 78 | 256 | 0000000100000000 | 4 | 1168 | 0000100010010000 | 5 | 8264 | 0100000001001000 | 3 | 16640 | 1000000100000000 | 5 | 17444 | 1000100000100100 | 0 |
| 79 | 257 | 0000000100000001 | 0 | 1168 | 0000100010010000 | 0 | 8321 | 0100000100000001 | 1 | 16457 | 1000000001001001 | 0 | 17444 | 1000100000100100 | 2 |
| 80 | 257 | 0000000100000001 | 1 | 1169 | 0000100010010001 | 1 | 8321 | 0100000100000001 | 0 | 16457 | 1000000001001001 | 1 | 17472 | 1000100001000000 | 3 |
| 81 | 258 | 0000000100000010 | 2 | 1170 | 0000100010010010 | 2 | 8226 | 0100000000100010 | 2 | 16456 | 1000000001001000 | 2 | 17442 | 1000100000100010 | 1 |
| 82 | 258 | 0000000100000010 | 3 | 1170 | 0000100010010010 | 3 | 8226 | 0100000000100010 | 3 | 16456 | 1000000001001000 | 4 | 17442 | 1000100000100010 | 2 |
| 83 | 258 | 0000000100000010 | 1 | 2049 | 0000100000000001 | 2 | 8324 | 0100000100000100 | 0 | 16640 | 1000000100000000 | 3 | 17472 | 1000100001000000 | 4 |
| 84 | 260 | 0000000100000100 | 3 | 2049 | 0000100000000001 | 3 | 8324 | 0100000100000100 | 1 | 16640 | 1000000100000000 | 4 | 17472 | 1000100001000000 | 1 |
| 85 | 260 | 0000000100000100 | 0 | 2050 | 0000100000000010 | 0 | 8324 | 0100000100000100 | 4 | 16457 | 1000000001001001 | 0 | 17473 | 1000100001000001 | 0 |
| 86 | 260 | 0000000100000100 | 1 | 2050 | 0000100000000010 | 1 | 8265 | 0100000001001001 | 1 | 16642 | 1000000100000010 | 1 | 17474 | 1000100001000010 | 2 |
| 87 | 264 | 0000000100001000 | 2 | 2057 | 0000100000001001 | 2 | 8328 | 0100000100001000 | 2 | 16642 | 1000000100000010 | 2 | 17474 | 1000100001000010 | 1 |
| 88 | 264 | 0000000100001000 | 3 | 2081 | 0000100000100001 | 3 | 8328 | 0100000100001000 | 3 | 16642 | 1000000100000010 | 4 | 17474 | 1000100001000010 | 3 |
| 89 | 264 | 0000000100001000 | 0 | 2081 | 0000100000100001 | 0 | 8328 | 0100000100001000 | 4 | 16528 | 1000000010010000 | 3 | 17474 | 1000100001000010 | 4 |
| 90 | 264 | 0000000100001000 | 4 | 2306 | 0000100100000010 | 0 | 8337 | 0100000100010001 | 3 | 16528 | 1000000010010000 | 1 | 17474 | 1000100001000010 | 5 |
| 91 | 265 | 0000000100001001 | 5 | 2306 | 0000100100000010 | 1 | 8336 | 0100000100010000 | 4 | 16528 | 1000000010010000 | 5 | 17476 | 1000100001000100 | 1 |
| 92 | 272 | 0000000100010000 | 3 | 2320 | 0000100100010000 | 2 | 8328 | 0100000100001000 | 3 | 16642 | 1000000100000010 | 3 | 17476 | 1000100001000100 | 3 |
| 93 | 272 | 0000000100010000 | 4 | 2320 | 0000100100010000 | 3 | 8328 | 0100000100001000 | 5 | 16528 | 1000000010010000 | 1 | 17476 | 1000100001000100 | 4 |
| 94 | 272 | 0000000100010000 | 1 | 2320 | 0000100100010000 | 4 | 8337 | 0100000100010001 | 3 | 16528 | 1000000010010000 | 4 | 17476 | 1000100001000100 | 0 |
| 95 | 273 | 0000000100010001 | 2 | 2320 | 0000100100010000 | 0 | 8336 | 0100000100010000 | 0 | 16528 | 1000000010010000 | 3 | 17474 | 1000100001000010 | 2 |
| 96 | 273 | 0000000100010001 | 3 | 2336 | 0000100100100000 | 0 | 8336 | 0100000100010000 | 3 | 16528 | 1000000010010000 | 1 | 17474 | 1000100001000010 | 1 |
| 97 | 273 | 0000000100010001 | 4 | 2336 | 0000100100100000 | 1 | 8336 | 0100000100010000 | 1 | 16516 | 1000000010000100 | 2 | 17476 | 1000100001000100 | 3 |
| 98 | 288 | 0000000100100000 | 5 | 2336 | 0000100100100000 | 2 | 8336 | 0100000100010000 | 3 | 16516 | 1000000010000100 | 4 | 17476 | 1000100001000100 | 4 |
| 99 | 288 | 0000000100100000 | 3 | 2336 | 0000100100100000 | 3 | 8336 | 0100000100010000 | 5 | 16516 | 1000000010000100 | 3 | 17480 | 1000100001001000 | 3 |
| 100 | 288 | 0000000100100000 | 1 | 2336 | 0000100100100000 | 4 | 8336 | 0100000100010000 | 1 | 16516 | 1000000010000100 | 1 | 17480 | 1000100001001000 | 4 |
| 101 | 288 | 0000000100100000 | 2 | 2336 | 0000100100100000 | 5 | 8336 | 0100000100010000 | 4 | 16516 | 1000000010000100 | 0 | 17480 | 1000100001001000 | 1 |
| 102 | 288 | 0000000100100000 | 0 | 2336 | 0000100100100000 | 1 | 8336 | 0100000100010000 | 2 | 16516 | 1000000010000100 | 3 | 17480 | 1000100001001000 | 4 |
| 103 | 288 | 0000000100100000 | 4 | 2336 | 0000100100100000 | 3 | 8336 | 0100000100010000 | 3 | 16516 | 1000000010000100 | 5 | 17480 | 1000100001001000 | 5 |

| INPUT | S=0 CODE | S=0 WORD | Snext | CODE | S=1 WORD | Snext | CODE | S=3 WORD | CODE | S=4 WORD | Snext | CODE | S=5 WORD | Snext |
|---|---|---|---|---|---|---|---|---|---|---|---|---|---|---|
| 212 | 4361 | 0010001000001001 | 0 | 4100 | 0010000000000100 | 5 | | | 9220 | 0100100000000100 | 5 | 18577 | 1001001000010001 | 1 |
| 213 | 4361 | 0010001000001001 | 1 | 4129 | 0010000000100001 | 0 | | | 9224 | 0100100000001000 | 1 | 18578 | 1001001000010010 | 1 |
| 214 | 4368 | 0010001000010000 | 1 | 4129 | 0010000000100001 | 1 | | | 9224 | 0100100000001000 | 3 | 18578 | 1001001000010010 | 2 |
| 215 | 4368 | 0010001000010000 | 3 | 4104 | 0010000000001000 | 1 | | | 9224 | 0100100000001000 | 4 | 18578 | 1001001000010010 | 3 |
| 216 | 4368 | 0010001000010000 | 4 | 4104 | 0010000000001000 | 3 | | | 9224 | 0100100000001000 | 5 | 18688 | 1001001010000000 | 3 |
| 217 | 4368 | 0010001000010000 | 5 | 4104 | 0010000000001000 | 4 | | | 9225 | 0100100000001001 | 0 | 18688 | 1001001010000000 | 5 |
| 218 | 4369 | 0010001000010001 | 0 | 4104 | 0010000000001000 | 5 | | | 9225 | 0100100000001001 | 1 | 18688 | 1001001010000000 | 0 |
| 219 | 4369 | 0010001000010001 | 1 | 4105 | 0010000000001001 | 0 | | | 9232 | 0100100000010000 | 1 | 18689 | 1001001010000001 | 1 |
| 220 | 4370 | 0010001000010010 | 1 | 4105 | 0010000000001001 | 1 | | | 9232 | 0100100000010000 | 3 | 18689 | 1001001010000001 | 3 |
| 221 | 4370 | 0010001000010010 | 2 | 4130 | 0010000000100010 | 1 | | | 9232 | 0100100000010000 | 4 | 18690 | 1001001010000010 | 1 |
| 222 | 4370 | 0010001000010010 | 3 | 4130 | 0010000000100010 | 2 | | | 9232 | 0100100000010000 | 5 | 18690 | 1001001010000010 | 2 |
| 223 | 4384 | 0010001000100000 | 1 | 4130 | 0010000000100010 | 3 | | | 9233 | 0100100000010001 | 0 | 18690 | 1001001010000010 | 3 |
| 224 | 4384 | 0010001000100000 | 3 | 2340 | 0000100100100100 | 1 | | | 9233 | 0100100000010001 | 1 | 18692 | 1001001010000100 | 1 |
| 225 | 4384 | 0010001000100000 | 4 | 2340 | 0000100100100100 | 3 | | | 9234 | 0100100000010010 | 1 | 18692 | 1001001010000100 | 3 |
| 226 | 4384 | 0010001000100000 | 5 | 2340 | 0000100100100100 | 4 | | | 9234 | 0100100000010010 | 2 | 18692 | 1001001010000100 | 4 |
| 227 | 4385 | 0010001000100001 | 0 | 2340 | 0000100100100100 | 5 | | | 9234 | 0100100000010010 | 3 | 18692 | 1001001010000100 | 5 |
| 228 | 4385 | 0010001000100001 | 1 | 4113 | 0010000000010001 | 0 | | | 9248 | 0100100000100000 | 1 | 18696 | 1001001010001000 | 1 |
| 229 | 4386 | 0010001000100010 | 1 | 4113 | 0010000000010001 | 1 | | | 9248 | 0100100000100000 | 3 | 18696 | 1001001010001000 | 3 |
| 230 | 4386 | 0010001000100010 | 2 | 4162 | 0010000001000010 | 1 | | | 9248 | 0100100000100000 | 4 | 18696 | 1001001010001000 | 4 |
| 231 | 4386 | 0010001000100010 | 3 | 4162 | 0010000001000010 | 2 | | | 9249 | 0100100000100001 | 0 | 18696 | 1001001010001000 | 5 |
| 232 | 4388 | 0010001000100100 | 1 | 4162 | 0010000001000010 | 3 | | | 9249 | 0100100000100001 | 1 | 18697 | 1001001010001001 | 1 |
| 233 | 4388 | 0010001000100100 | 3 | 4164 | 0010000001000100 | 1 | | | 9250 | 0100100000100010 | 1 | 18704 | 1001001010010000 | 1 |
| 234 | 4388 | 0010001000100100 | 4 | 4164 | 0010000001000100 | 3 | | | 9250 | 0100100000100010 | 2 | 18704 | 1001001010010000 | 2 |
| 235 | 4388 | 0010001000100100 | 5 | 4164 | 0010000001000100 | 4 | | | 9250 | 0100100000100010 | 3 | 18704 | 1001001010010000 | 3 |
| 236 | 4609 | 0010010000000001 | 0 | 4164 | 0010000001000100 | 5 | | | 9252 | 0100100000100100 | 1 | 18704 | 1001001010010000 | 4 |
| 237 | 4609 | 0010010000000001 | 1 | 2337 | 0000100100000001 | 1 | | | 9252 | 0100100000100100 | 3 | 18705 | 1001001010010001 | 1 |
| 238 | 4610 | 0010010000000010 | 1 | 2337 | 0000100100000001 | 3 | | | 9252 | 0100100000100100 | 4 | 18705 | 1001001010010001 | 3 |
| 239 | 4610 | 0010010000000010 | 2 | 2338 | 0000100100000010 | 1 | | | 9280 | 0100100001000000 | 1 | 18706 | 1001001010010010 | 1 |
| 240 | 4610 | 0010010000000010 | 3 | 2338 | 0000100100000010 | 2 | | | 9280 | 0100100001000000 | 3 | 18706 | 1001001010010010 | 2 |
| 241 | 4612 | 0010010000000100 | 1 | 2338 | 0000100100000010 | 3 | | | 9280 | 0100100001000000 | 4 | 18706 | 1001001010010010 | 3 |
| 242 | 4612 | 0010010000000100 | 3 | 4112 | 0010000000010000 | 1 | | | 9281 | 0100100001000001 | 0 | 18720 | 1001001010100000 | 3 |
| 243 | 4612 | 0010010000000100 | 4 | 4112 | 0010000000010000 | 3 | | | 9281 | 0100100001000001 | 1 | 18720 | 1001001010100000 | 4 |
| 244 | 4612 | 0010010000000100 | 5 | 4112 | 0010000000010000 | 4 | | | 9282 | 0100100001000010 | 1 | 18720 | 1001001010100000 | 5 |
| 245 | 4616 | 0010010000001000 | 0 | 4128 | 0010000000100000 | 1 | | | 9282 | 0100100001000010 | 2 | 18721 | 1001001010100001 | 0 |
| 246 | 4616 | 0010010000001000 | 1 | 4128 | 0010000000100000 | 3 | | | 9282 | 0100100001000010 | 3 | 18721 | 1001001010100001 | 1 |
| 247 | 4616 | 0010010000001000 | 3 | 4128 | 0010000000100000 | 5 | | | 9289 | 0100100001001001 | 0 | 18722 | 1001001010100010 | 1 |
| 248 | 4617 | 0010010000001001 | 0 | 4161 | 0010000001000001 | 1 | | | 9289 | 0100100001001001 | 1 | 18722 | 1001001010100010 | 2 |
| 249 | 4617 | 0010010000001001 | 1 | 4161 | 0010000001000001 | 3 | | | 9344 | 0100100010000000 | 3 | 18722 | 1001001010100010 | 3 |
| 250 | 4624 | 0010010000010000 | 1 | 4160 | 0010000001000000 | 4 | | | 9344 | 0100100010000000 | 4 | 18724 | 1001001010100100 | 1 |
| 251 | 4624 | 0010010000010000 | 3 | 4160 | 0010000001000000 | 5 | | | 9344 | 0100100010000000 | 5 | 18724 | 1001001010100100 | 3 |
| 252 | 4624 | 0010010000010000 | 4 | 4160 | 0010000001000000 | 0 | | | 9216 | 0100100000000000 | 0 | 18724 | 1001001010100100 | 4 |
| 253 | 4624 | 0010010000010000 | 5 | 4224 | 0010000100000000 | 1 | | | 9216 | 0100100000000000 | 1 | 18724 | 1001001010100100 | 5 |
| 254 | 1024 | 0000010000000000 | 0 | | | | | | | | | | | |
| 255 | | | | | | | | | *If pre zero run > 6 then 9216 | | | if pre zero run == 7 or 8 then 4224 | | |

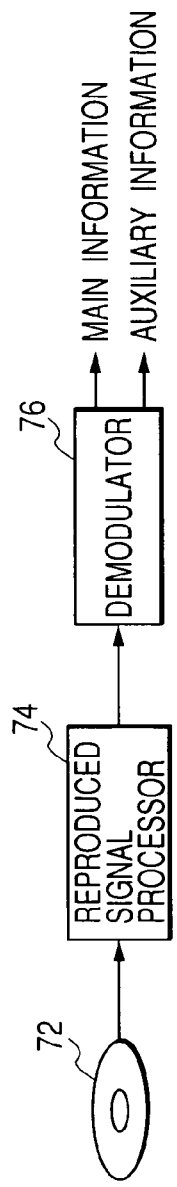
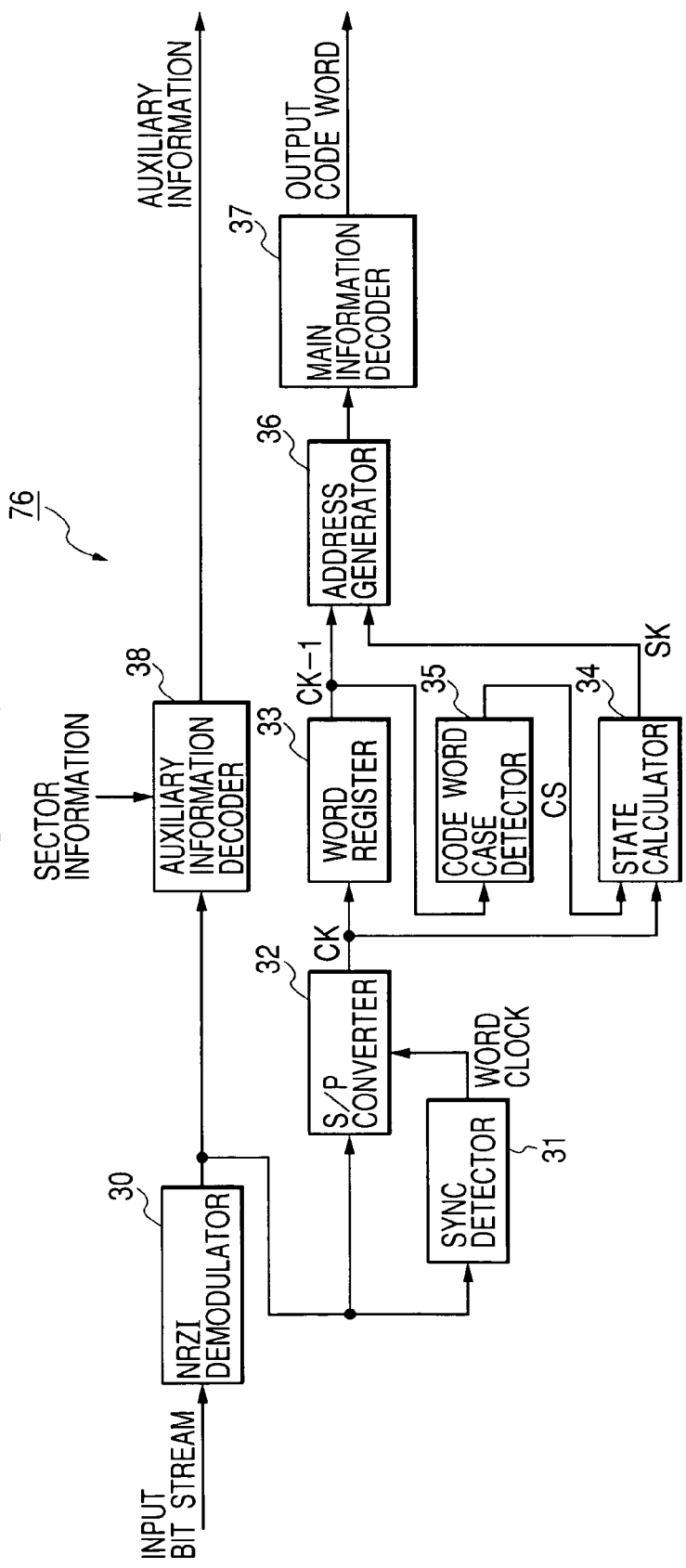

FIG. 18

| Sk=0 | | Sk=1 | | Sk=2 | | Sk=3 | | Sk=4 | | Sk=5 | |
|---|---|---|---|---|---|---|---|---|---|---|---|
| Ck-1 | Dk-1 | Ck-1 | Dk-1 | Ck-1 | Dk-1 | Ck-1 | Dk-1 | Ck-1 | Dk-1 | Ck-1 | Dk-1 |
| 17 | 161 | 16 | 157 | 18 | 164 | 16 | 158 | 16 | 159 | 16 | 160 |
| 33 | 2 | 17 | 162 | 34 | 58 | 18 | 165 | 32 | 0 | 32 | 1 |
| 65 | 39 | 18 | 163 | 66 | 42 | 32 | 156 | 36 | 6 | 36 | 7 |
| 73 | 16 | 32 | 155 | 130 | 66 | 34 | 59 | 64 | 10 | 64 | 11 |
| 129 | 63 | 33 | 3 | 146 | 24 | 36 | 5 | 68 | 143 | 68 | 144 |
| 137 | 21 | 34 | 57 | 258 | 82 | 64 | 9 | 72 | 147 | 72 | 148 |
| 145 | 30 | 36 | 4 | 274 | 19 | 66 | 43 | 128 | 62 | 128 | 61 |
| 257 | 79 | 64 | 8 | 290 | 33 | 68 | 142 | 132 | 70 | 132 | 71 |
| 265 | 92 | 65 | 40 | 514 | 109 | 72 | 146 | 136 | 151 | 136 | 152 |
| 273 | 98 | 66 | 41 | 530 | 128 | 128 | 60 | 144 | 74 | 144 | 75 |
| 289 | 104 | 68 | 141 | 546 | 137 | 130 | 67 | 256 | 78 | 256 | 77 |
| 513 | 106 | 72 | 145 | 578 | 49 | 132 | 69 | 260 | 86 | 260 | 87 |
| 521 | 119 | 73 | 17 | 1026 | 5 | 136 | 150 | 264 | 90 | 264 | 91 |
| 529 | 125 | 129 | 64 | 1042 | 24 | 144 | 73 | 272 | 96 | 272 | 97 |
| 545 | 134 | 130 | 65 | 1058 | 33 | 146 | 25 | 288 | 102 | 288 | 103 |
| 577 | 139 | 132 | 68 | 1090 | 46 | 256 | 76 | 292 | 28 | 292 | 29 |
| 585 | 55 | 136 | 149 | 1154 | 64 | 258 | 83 | 512 | 153 | 512 | 154 |
| 1025 | 2 | 137 | 22 | 1170 | 83 | 260 | 85 | 516 | 113 | 516 | 114 |
| 1033 | 15 | 144 | 72 | 2050 | 88 | 264 | 89 | 520 | 117 | 520 | 118 |
| 1041 | 21 | 145 | 31 | 2066 | 106 | 272 | 95 | 528 | 123 | 528 | 124 |
| 1057 | 30 | 146 | 23 | 2082 | 109 | 274 | 20 | 544 | 132 | 544 | 133 |
| 1089 | 43 | 257 | 80 | 2114 | 152 | 288 | 101 | 548 | 37 | 548 | 38 |
| 1097 | 56 | 258 | 81 | 2178 | 129 | 290 | 34 | 576 | 14 | 576 | 15 |
| 1153 | 61 | 260 | 84 | 2194 | 161 | 292 | 27 | 580 | 46 | 580 | 47 |
| 1161 | 74 | 264 | 88 | 2306 | 95 | 514 | 110 | 584 | 53 | 584 | 54 |
| 1169 | 80 | 265 | 93 | 2322 | 176 | 516 | 112 | 1028 | 9 | 1024 | 255 |
| 2049 | 85 | 272 | 94 | 2338 | 240 | 520 | 116 | 1032 | 13 | 1028 | 10 |
| 2057 | 90 | 273 | 99 | 4098 | 203 | 528 | 122 | 1040 | 165 | 1032 | 14 |
| 2065 | 149 | 274 | 18 | 4114 | 195 | 530 | 129 | 1056 | 28 | 1040 | 166 |
| 2081 | 92 | 288 | 100 | 4130 | 222 | 544 | 131 | 1060 | 37 | 1056 | 29 |
| 2113 | 171 | 289 | 105 | 4162 | 231 | 546 | 138 | 1088 | 41 | 1060 | 38 |
| 2121 | 123 | 290 | 32 | 4226 | 175 | 548 | 36 | 1092 | 50 | 1088 | 42 |
| 2177 | 186 | 292 | 26 | 4242 | 194 | 576 | 13 | 1096 | 54 | 1092 | 51 |
| 2185 | 139 | 513 | 107 | 4354 | 202 | 578 | 50 | 1152 | 60 | 1096 | 55 |
| 2193 | 158 | 514 | 108 | 4370 | 221 | 580 | 45 | 1156 | 68 | 1152 | 59 |
| 2305 | 192 | 516 | 111 | 4386 | 230 | 584 | 52 | 1160 | 72 | 1156 | 69 |
| 2313 | 173 | 520 | 115 | 4610 | 239 | 1026 | 6 | 1168 | 78 | 1160 | 73 |
| 2321 | 200 | 521 | 120 | 4626 | 19 | 1028 | 8 | 2052 | 169 | 1168 | 79 |
| 2337 | 237 | 528 | 121 | 4642 | 24 | 1032 | 12 | 2056 | 180 | 2052 | 170 |
| 4105 | 219 | 529 | 126 | 4674 | 33 | 1040 | 164 | 2064 | 190 | 2056 | 181 |
| 4113 | 228 | 530 | 127 | 8210 | 42 | 1042 | 25 | 2080 | 184 | 2064 | 191 |
| 4129 | 213 | 544 | 130 | 8226 | 82 | 1056 | 27 | 2084 | 113 | 2080 | 185 |
| 4161 | 250 | 545 | 135 | 8258 | 66 | 1058 | 34 | 2112 | 207 | 2084 | 114 |
| 4169 | 170 | 546 | 136 | 8322 | 58 | 1060 | 36 | 2116 | 117 | 2112 | 208 |
| 4225 | 172 | 548 | 35 | 8338 | 49 | 1088 | 40 | 2120 | 121 | 2116 | 118 |
| 4233 | 185 | 576 | 12 | 8450 | 109 | 1090 | 47 | 2176 | 127 | 2120 | 122 |
| 4241 | 191 | 577 | 140 | 8466 | 128 | 1092 | 49 | 2180 | 133 | 2176 | 126 |
| 4353 | 199 | 578 | 48 | 8482 | 137 | 1096 | 53 | 2184 | 137 | 2180 | 134 |
| 4361 | 212 | 580 | 44 | 8706 | 160 | 1152 | 58 | 2192 | 156 | 2184 | 138 |
| 4369 | 218 | 584 | 51 | 8722 | 170 | 1154 | 65 | 2304 | 199 | 2192 | 157 |
| 4385 | 227 | 585 | 56 | 8738 | 179 | 1156 | 67 | 2308 | 143 | 2304 | 198 |
| 4609 | 236 | 1025 | 3 | 8770 | 192 | 1160 | 71 | 2312 | 147 | 2308 | 144 |
| 4617 | 249 | 1026 | 4 | 9218 | 207 | 1168 | 77 | 2320 | 99 | 2312 | 148 |
| 4625 | 16 | 1028 | 7 | 9234 | 226 | 1170 | 84 | 2336 | 103 | 2320 | 100 |
| 4641 | 21 | 1032 | 11 | 9250 | 235 | 2050 | 89 | 2340 | 226 | 2336 | 104 |
| 4673 | 30 | 1033 | 16 | 9282 | 248 | 2052 | 168 | 4100 | 211 | 2340 | 227 |
| 4681 | 2 | 1040 | 163 | 9346 | 42 | 2056 | 179 | 4104 | 217 | 4100 | 212 |
| 8201 | 55 | 1041 | 22 | 9362 | 33 | 2064 | 189 | 4112 | 244 | 4104 | 218 |
| 8209 | 39 | 1042 | 23 | 16402 | 19 | 2066 | 107 | 4128 | 248 | 4112 | 245 |
| 8225 | 202 | 1056 | 26 | 16418 | 24 | 2080 | 183 | 4132 | 19 | 4128 | 249 |
| 8257 | 63 | 1057 | 31 | 16450 | 51 | 2082 | 110 | 4160 | 254 | 4132 | 20 |
| 8265 | 92 | 1058 | 32 | 16514 | 60 | 2084 | 112 | 4164 | 235 | 4164 | 236 |
| 8321 | 79 | 1060 | 35 | 16530 | 76 | 2112 | 206 | 4168 | 168 | 4168 | 169 |
| 8329 | 104 | 1088 | 39 | 16642 | 96 | 2114 | 153 | 4224 | 0 | 4224 | 255 |
| 8337 | 98 | 1089 | 44 | 16658 | 123 | 2116 | 116 | 4228 | 179 | 4228 | 180 |
| 8449 | 106 | 1090 | 45 | 16674 | 142 | 2120 | 120 | 4232 | 183 | 4232 | 184 |

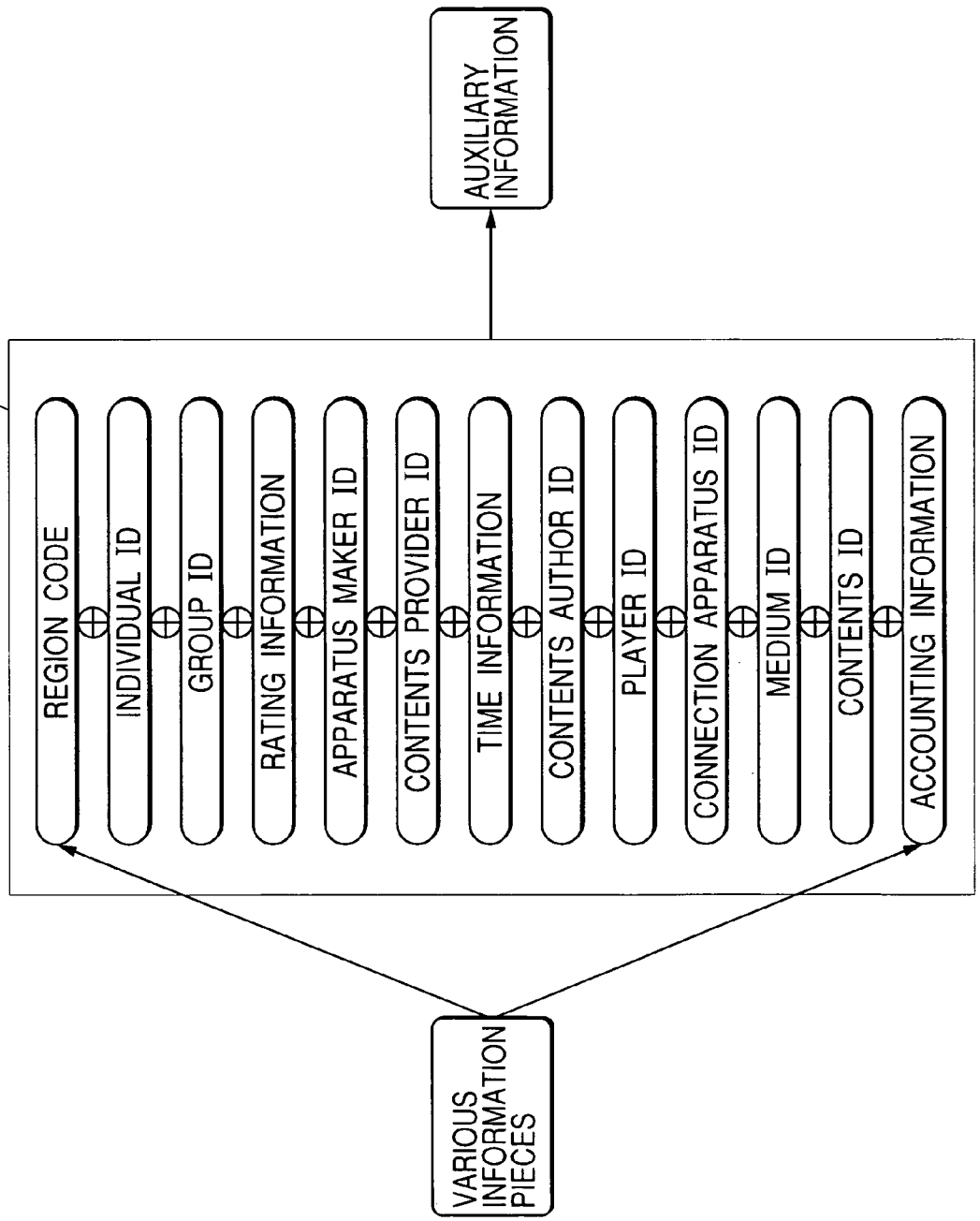

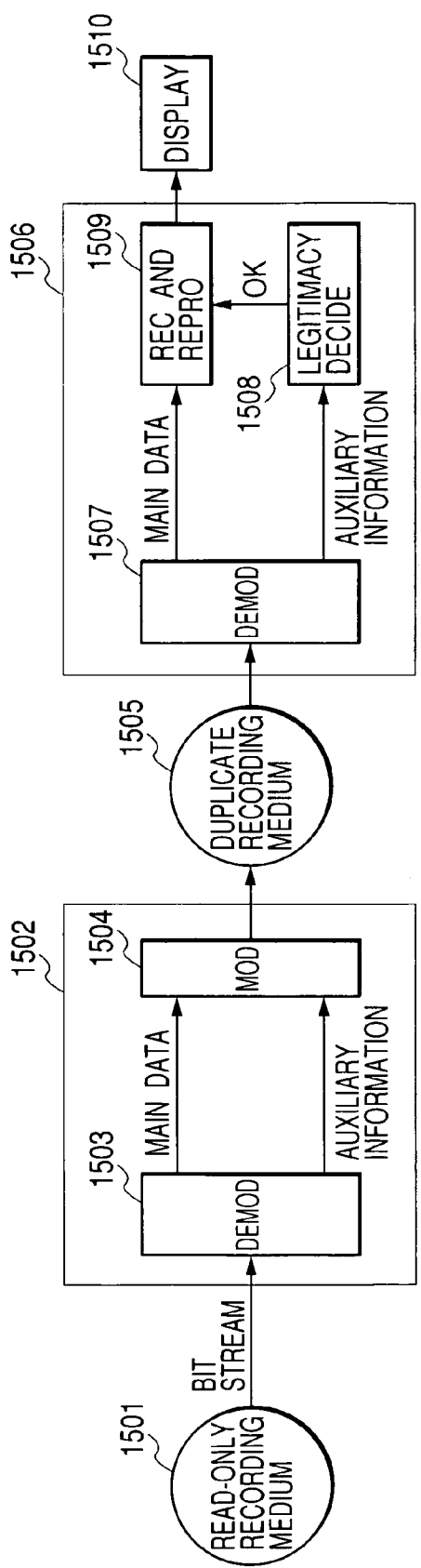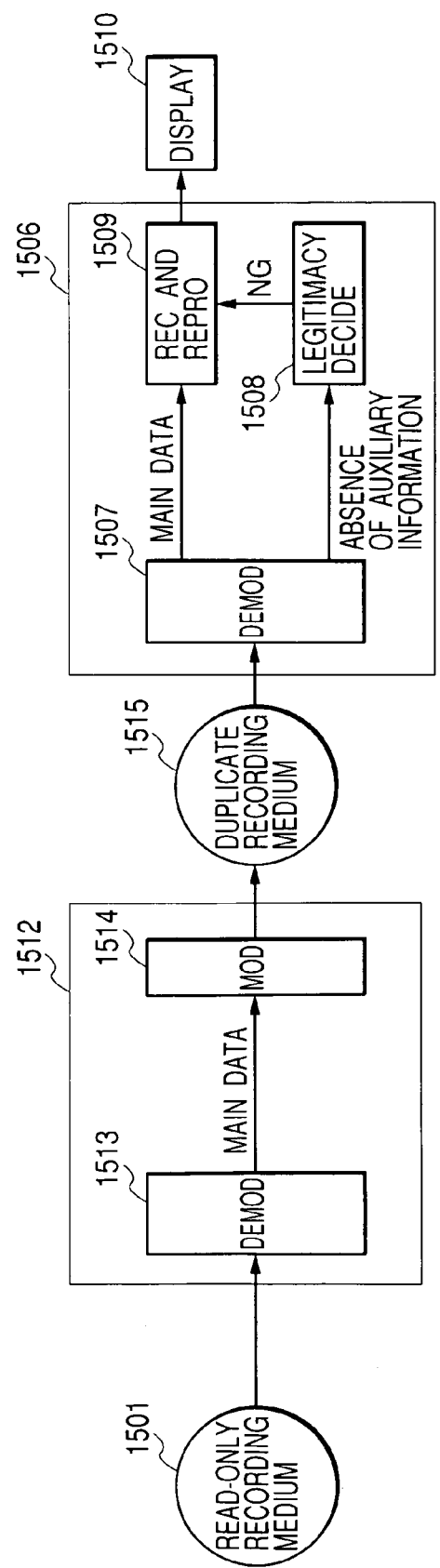

MODULATION SYSTEM

BACKGROUND OF THE INVENTION

1. Field of the Invention

This invention relates to a modulation method, a modulation apparatus, a demodulation method, a demodulation apparatus, a recording medium, a transmission apparatus, and a transmission method. In addition, this invention relates to a method of recording auxiliary information, an apparatus for recording auxiliary information, a method of reproducing auxiliary information, an apparatus for reproducing auxiliary information, a method of reproducing data, and an apparatus for reproducing data.

2. Description of the Related Art

EFM (eight to fourteen modulation or 8–14 modulation) is used for digital signals recorded on CDs (compact discs). EFM converts every 8-bit block of an input digital signal into a 14-bit code word, and adds 3 margin bits to the 14-bit code word to form a 17-bit block of an output bit stream (a modulation-resultant bit stream). The used 14-bit code words are chosen to follow run length limiting rules "RLL(2, 10)" such that 2 to 10 successive bits of "0" should be between bits of "1". Also, the added margin bits are chosen so that portions of the modulation-resultant bit stream between the 14-bit code words will follow the run length limiting rules "RLL(2, 10)". The run length limiting rules "RLL(2, 10)" reduce DC and low-frequency components of the modulation-resultant bit stream.

EFM+ (8–16 modulation) is used for digital signals recorded on DVDs (digital versatile discs). EFM+ converts every 8-bit block of an input digital signal into a 16-bit code word forming a 16-bit block of an output bit stream (a modulation-resultant bit stream). The used 16-bit code words are chosen to follow the run length limiting rules "RLL(2, 10)". Also, the used 16-bit code words are designed to enable the combination of the 16-bit code words, that is, the modulation-resultant bit stream, to follow the run length limiting rules "RLL(2, 10)".

Japanese patent application publication number P2000-286709A discloses a modulation system which includes a formatter, an 8–15 modulator, and an NRZI converter. The formatter converts an input digital signal into a second digital signal of a predetermined format. The formatter outputs the second digital signal to the 8–15 modulator. The 8–15 modulator contains a set of 7 different encoding tables. The 8–15 modulator converts or encodes every 8-bit block of the output digital signal from the formatter into a 15-bit code word by referring to the set of the encoding tables. The 15-bit code word forms a 15-bit block of a modulation-resultant bit stream (a modulation-resultant digital signal). The 15-bit code word is chosen to enable its NRZI conversion result to follow run length limiting rules such that a minimum run length is 3T and a maximum run length is 11T where T denotes the length or period of one bit (one channel bit). The 8–15 modulator outputs the modulation-resultant bit stream (the modulation-resultant digital signal) to the NRZI converter. The NRZI converter subjects the output digital signal of the 8–15 modulator to NRZI modulation, thereby generating a digital signal of an NRZI code.

In the modulation system of Japanese application P2000-5286709A, each of the encoding tables stores 15-bit code words assigned to different states of an input 8-bit block. In addition, each of the encoding tables contains state information for selecting one from the encoding tables which will be used to convert a next input 8-bit block. This design is to enable the NRZI conversion result of a succession of two 15-bit code words to follow the run length limiting rules. The contents of the encoding tables are optimized in view of information about the frequencies of occurrence of different states of an input 8-bit block. Furthermore, first and second specified ones of the encoding tables are designed so that the NRZI modulation results of 15-bit code words in the first specified encoding table which correspond to prescribed input 8-bit blocks will be opposite in polarity ("odd-even" in the number of "1") to those of 15-bit code words in the second specified encoding table.

In the modulation system of Japanese application P2000-286709A, since there is a plurality of the encoding tables, two candidate 15-bit code words may be selected in response to one input 8-bit block. DSVs (digital sum variations) are calculated for the candidate 15-bit code words, respectively. The absolute values of the DSVs are compared. One of the candidate 15-bit code words which corresponds to the smaller of the absolute values of the DSVs is finally selected as an output 15-bit code word. In this way, DSV control is implemented.

Japanese patent application publication number 10-269289/1998 discloses a digital contents distribution managing system in which a distributor side encrypts and compresses original digital contents information into encryption-resultant contents information. The distributor side transmits the encryption-resultant contents information, encryption-resultant key information, and encryption-resultant accounting information to a communication opposite party, that is, a user side. The distributor side receives contents-use information from the user side. The distributor side implements a process of collecting a charge for using the original contents information on the basis of the received contents-use information. The distributor side also implements a process of dividing the collected charge among the parties concerned which include the holder of the copyright of the original contents information. The user side decrypts the encryption-resultant key information to recover the original key information. The user side decrypts the encryption-resultant contents information in response to the recovered original key information, and expands the decryption-resultant contents information into the original contents information. The user side decrypts the encryption-resultant accounting information to recover the original accounting information. The user side updates the original accounting information in accordance with use of the original contents information. The user side transmits the related contents-use information to the distributor side. The user side can install the original contents information on a portable storage medium or a removable storage medium.

Japanese patent application publication number 10-283268/1998 discloses a recording medium which stores an encrypted version of main information and an encrypted version of key information. The key information can be used in decrypting the encrypted version of the main information. The encrypted version of the key information has a non-encrypted portion containing control information. The control information represents conditions for permitting the decryption of the encrypted version of the main information. The control information has machine information and region information. The control information prevents a user side from copying the encrypted version of the main information onto a hard disk or an optical disk.

In general, the inner portion of the disc member of each DVD is formed with a burst cutting area (BCA) for copy protection.

Japanese patent application publication number 11-120633/1999 discloses an optical disc having watermarks which are visible from the reproducing surface side of the disc, and which can be hardly formed on a forged disc. The optical disc includes a main transparent substrate on which a reflection layer, an adhesive layer, and a dummy transparent substrate are successively laminated. The adhesive layer is made of adhesive agent whose curing rate depends on the rate of the exposure to electromagnetic radiations. The reflection layer and the adhesive layer are located between an information-signal recording surface of the main transparent substrate and a first surface of the dummy transparent substrate. During the fabrication of the optical disc, a mask with a pattern for making the watermarks is placed above a second surface of the dummy transparent substrate which is remote from the adhesive layer. Electromagnetic radiations are applied via the mask to the adhesive layer. The curing rate of the adhesive agent spatially varies in accordance with a pattern of the mask so that a distribution of stresses which depends on the pattern of the mask occurs on the reflection layer. As a result, the reflection layer slightly deforms in accordance with the pattern of the mask. The deformation of the reflection layer forms the watermarks. Such watermarks enables legitimate discs and forged discs to be discriminated from each other.

SUMMARY OF THE INVENTION

It is a first object of this invention to provide a modulation method which is excellent in encoding rate (encoding efficiency) and copy protection.

It is a second object of this invention to provide a modulation apparatus which is excellent in encoding rate and copy protection.

It is a third object of this invention to provide a demodulation method which is excellent in encoding rate and copy protection.

It is a fourth object of this invention to provide a demodulation apparatus which is excellent in encoding rate and copy protection.

It is a fifth object of this invention to provide a recording medium which is excellent in encoding rate and copy protection.

It is a sixth object of this invention to provide a transmission apparatus which is excellent in encoding rate and copy protection.

It is a seventh object of this invention to provide a transmission method which is excellent in encoding rate and copy protection.

It is an eighth object of this invention to provide a method of recording auxiliary information which is excellent in encoding rate and copy protection.

It is a ninth object of this invention to provide an apparatus for recording auxiliary information which is excellent in encoding rate and copy protection.

It is a tenth object of this invention to provide a method of reproducing auxiliary information which is excellent in encoding rate and copy protection.

It is an eleventh object of this invention to provide an apparatus for reproducing auxiliary information which is excellent in encoding rate and copy protection.

It is a twelfth object of this invention to provide a method of reproducing data which is excellent in encoding rate and copy protection.

It is a thirteenth object of this invention to provide an apparatus for reproducing data which is excellent in encoding rate and copy protection.

A first aspect of this invention provides a modulation method comprising the steps of generating a final 15-bit output code word in response to every 8-bit input code word by referring to a set of encoding tables, wherein the encoding tables contain output code words assigned to input code words, and contain state information accompanying each output code word, wherein the state information designates an encoding table among the encoding tables which is used next to generate an output code word immediately following the output code word accompanied with the state information in a manner such that a resultant succession of the output code words follows predetermined run length limiting rules, and wherein NRZI conversion results of output code words in first specified one of the encoding tables which are assigned to prescribed input code words are opposite in polarity to NRZI conversion results of output code words in second specified one of the encoding tables which are assigned to the prescribed input code words; generating a first candidate current output code word in response to a current input code word equal to one of the prescribed input code words by referring to the first specified one of the encoding tables; generating a second candidate current output code word in response to the current input code word equal to said one of the prescribed input code words by referring to the second specified one of the encoding tables; calculating a first DSV from the first candidate current output code word and previous final output code words; calculating a second DSV from the second candidate current output code word and previous final output code words; determining which of an absolute value of the first DSV and an absolute value of the second DSV is smaller; selecting one from the first and second candidate current output code words which corresponds to the smaller DSV absolute value as a final current output code word; and superimposing auxiliary information on a sequence of final output code words; wherein the predetermined run length limiting rules causes a minimum run length in a result of NRZI conversion of the sequence of the final output code words except a sync signal to be equal to 3T, and causes a maximum run length therein to be equal to 14T or less, where T denotes a channel bit period related to the final output code words.

A second aspect of this invention is based on the first aspect thereof, and provides a modulation method further comprising the step of selectively setting the maximum run length to either 11T or 14T.

A third aspect of this invention is based on the first aspect thereof, and provides a modulation method wherein the superimposing step comprises changing the predetermined run length limiting rules to change the maximum run length in response to the auxiliary information.

A fourth aspect of this invention is based on the first aspect thereof, and provides a modulation method wherein the auxiliary information comprises a sequence of unit blocks each having a predetermined number of bits.

A fifth aspect of this invention provides a modulation apparatus for modulating input code words in the modulation method in the first aspect of this invention.

A sixth aspect of this invention provides a demodulation method of demodulating a sequence of code words which is generated by the modulation method in the first aspect of this invention. The demodulation method comprises the steps of recovering encoding-state information from the code-word sequence, the encoding-state information representing which of encoding tables has been used in generating a code word immediately following a code word of interest; demodulating the code word of interest into an original code word by referring to a decoding table in response to the generated encoding-state information; and reproducing auxiliary information from the code-word sequence.

A seventh aspect of this invention provides a demodulation apparatus for demodulating a sequence of code words which is generated by the modulation method in the first aspect of this invention. The demodulation apparatus comprises means for recovering encoding-state information from the code-word sequence, the encoding-state information representing which of encoding tables has been used in generating a code word immediately following a code word of interest; means for demodulating the code word of interest into an original code word by referring to an encoding table in response to the generated encoding-state information; and means for reproducing auxiliary information from the code-word sequence.

An eighth aspect of this invention provides a recording medium storing a sequence of code words which is generated by the modulation method in the first aspect of this invention.

A ninth aspect of this invention provides a recording medium storing a sequence of code words which is generated by the modulation apparatus in the fifth aspect of this invention.

A tenth aspect of this invention provides a transmission apparatus for transmitting a sequence of code words which is generated by the modulation method in the first aspect of this invention.

An eleventh aspect of this invention provides a transmission apparatus for transmitting a sequence of code words which is generated by the modulation apparatus in the fifth aspect of this invention.

A twelfth aspect of this invention provides a transmission method of transmitting a sequence of code words which is generated by the modulation method in the first aspect of this invention.

A thirteenth aspect of this invention provides a transmission method of transmitting a sequence of code words which is generated by the modulation apparatus in the fifth aspect of this invention.

A fourteenth aspect of this invention provides a method of recording auxiliary information. The method comprises the steps of generating a final 15-bit output code word in response to every 8-bit input code word by referring to a set of encoding tables, wherein the encoding tables contain output code words assigned to input code words, and contain state information accompanying each output code word, wherein the state information designates an encoding table among the encoding tables which is used next to generate an output code word immediately following the output code word accompanied with the state information in a manner such that a resultant succession of the output code words follows predetermined run length limiting rules, and wherein NRZI conversion results of output code words in first specified one of the encoding tables which are assigned to prescribed input code words are opposite in polarity to NRZI conversion results of output code words in second specified one of the encoding tables which are assigned to the prescribed input code words; generating a first candidate current output code word in response to a current input code word equal to one of the prescribed input code words by referring to the first specified one of the encoding tables; generating a second candidate current output code word in response to the current input code word equal to said one of the prescribed input code words by referring to the second specified one of the encoding tables; calculating a first DSV from the first candidate current output code word and previous final output code words; calculating a second DSV from the second candidate current output code word and previous final output code words; determining which of an absolute value of the first DSV and an absolute value of the second DSV is smaller; selecting one from the first and second candidate current output code words which corresponds to the smaller DSV absolute value as a final current output code word; and superimposing auxiliary information on a sequence of final output code words; wherein the auxiliary information contains at least one of 1) an information piece about an encryption key, 2) an information piece being a base of an encryption key, 3) a designating information piece for identifying an encryption key, 4) a designating information piece for identifying a base of an encryption key, 5) an information piece about a region or regions corresponding to one or more countries, one or more zones, or one or more spaces, 6) an information piece about identification of an individual, 7) an information piece about identification of a group of persons, 8) an information piece about a rating, 9) an information piece about identification of an apparatus maker or a device maker, 10) an information piece about identification of a contents provider, 11) an information piece about time, 12) an information piece about contents authors, 13) an information piece about identification of a reproducing apparatus or a reproducing device, 14) an information piece about identification of a connection apparatus or a connection device, 15) an information piece about identification of a medium on which contents information is recorded, 16) an information piece about identification of contents information, 17) an information piece about accounting, 18) an information piece about playback control, 19) an information piece about an address to be accessed, 20) an information piece about recording control, 21) an information piece about a URL address related to contents information, 22) an information piece representing characters, 23) an information piece representing an auxiliary picture, 24) an information piece about audio, 25) an information piece about a copyright, and 26) an information piece about legitimacy of a recording medium storing data.

A fifteenth aspect of this invention is based on the fourteenth aspect thereof, and provides a method wherein the predetermined run length limiting rules causes a minimum run length in a result of NRZI conversion of the sequence of the final output code words except a sync signal to be equal to 3T, and causes a maximum run length therein to be equal to 14T or less, where T denotes a channel bit period related to the final output code words, and further comprising the step of selectively setting the maximum run length to either 11T or 14T.

A sixteenth aspect of this invention is based on the fourteenth aspect thereof, and provides a method wherein the superimposing step comprises changing the predetermined run length limiting rules to change the maximum run length in response to the auxiliary information.

A seventeenth aspect of this invention is based on the fourteenth aspect thereof, and provides a modulation method wherein the auxiliary information comprises a sequence of unit blocks each having a predetermined number of bits.

An eighteenth aspect of this invention provides an apparatus for recording auxiliary information. The apparatus comprises means for generating a final 15-bit output code word in response to every 8-bit input code word by referring to a set of encoding tables, wherein the encoding tables contain output code words assigned to input code words, and contain state information accompanying each output code word, wherein the state information designates an encoding table among the encoding tables which is used next to generate an output code word immediately following the output code word accompanied with the state information in a manner such that a resultant succession of the output code words follows predetermined run length limiting rules, and wherein NRZI conversion results of output code words in first specified one of the encoding tables which are assigned to prescribed input code words are opposite in polarity to NRZI conversion results of output code words in second specified one of the encoding tables which are assigned to the prescribed input code words; means for generating a first candidate current output code word in response to a current input code word equal to one of the prescribed input code words by referring to the first specified one of the encoding tables; means for generating a second candidate current output code word in response to the current input code word equal to said one of the prescribed input code words by referring to the second specified one of the encoding tables; means for calculating a first DSV from the first candidate current output code word and previous final output code words; means for calculating a second DSV from the second candidate current output code word and previous final output code words; means for determining which of an absolute value of the first DSV and an absolute value of the second DSV is smaller; means for selecting one from the first and second candidate current output code words which corresponds to the smaller DSV absolute value as a final current output code word; and means for superimposing auxiliary information on a sequence of final output code words; wherein the auxiliary information contains at least one of 1) an information piece about an encryption key, 2) an information piece being a base of an encryption key, 3) a designating information piece for identifying an encryption key, 4) a designating information piece for identifying a base of an encryption key, 5) an information piece about a region or regions corresponding to one or more countries, one or more zones, or one or more spaces, 6) an information piece about identification of an individual, 7) an information piece about identification of a group of persons, 8) an information piece about a rating, 9) an information piece about identification of an apparatus maker or a device maker, 10) an information piece about identification of a contents provider, 11) an information piece about time, 12) an information piece about contents authors, 13) an information piece about identification of a reproducing apparatus or a reproducing device, 14) an information piece about identification of a connection apparatus or a connection device, 15) an information piece about identification of a medium on which contents information is recorded, 16) an information piece about identification of contents information, 17) an information piece about accounting, 18) an information piece about playback control, 19) an information piece about an address to be accessed, 20) an information piece about recording control, 21) an information piece about a URL address related to contents information, 22) an information piece representing characters, 23) an information piece representing an auxiliary picture, 24) an information piece about audio, 25) an information piece about a copyright, and 26) an information piece about legitimacy of a recording medium storing data.

A nineteenth aspect of this invention is based on the eighteenth aspect thereof, and provides an apparatus wherein the predetermined run length limiting rules causes a minimum run length in a result of NRZI conversion of the sequence of the final output code words except a sync signal to be equal to 3T, and causes a maximum run length therein to be equal to 14T or less, where T denotes a channel bit period related to the final output code words, and further comprising means for selectively setting the maximum run length to either 11T or 14T.

A twentieth aspect of this invention is based on the eighteenth aspect thereof, and provides an apparatus wherein the superimposing means comprises means for changing the predetermined run length limiting rules to change the maximum run length in response to the auxiliary information.

A twenty-first aspect of this invention is based on the eighteenth aspect thereof, and provides an apparatus wherein the auxiliary information comprises a sequence of unit blocks each having a predetermined number of bits.

A twenty-second aspect of this invention provides a method of reproducing an auxiliary information from a sequence of code words which is generated by the method in the fourteenth aspect of this invention. The reproducing method comprises the steps of recovering encoding-state information from the code-word sequence, the encoding-state information representing which of encoding tables has been used in generating a code word immediately following a code word of interest; demodulating the code word of interest into an original code word by referring to a decoding table in response to the generated encoding-state information; and reproducing auxiliary information from the code-word sequence.

A twenty-third aspect of this invention provides an apparatus for reproducing an auxiliary information from a sequence of code words which is generated by the apparatus in the eighteenth aspect of this invention. The reproducing apparatus comprises means for recovering encoding-state information from the code-word sequence, the encoding-state information representing which of encoding tables has been used in generating a code word immediately following a code word of interest; means for demodulating the code word of interest into an original code word by referring to a decoding table in response to the generated encoding-state information; and means for reproducing auxiliary information from the code-word sequence.

A twenty-fourth aspect of this invention provides a recording medium storing a sequence of code words which is generated by the method in the fourteenth aspect of this invention.

A twenty-fifth aspect of this invention provides a transmission apparatus for transmitting a sequence of code words which is generated by the apparatus in the eighteenth aspect of this invention.

A twenty-sixth aspect of this invention provides a transmission method of transmitting a sequence of code words which is generated by the method in the fourteenth aspect of this invention.

A twenty-seventh aspect of this invention provides a method of reproducing data from a sequence of code words which is generated by the method in the fourteenth aspect of this invention. The reproducing method comprises the steps of recovering encoding-state information from the code-word sequence, the encoding-state information representing which of encoding tables has been used in generating a code word immediately following a code word of interest; demodulating the code word of interest into an original code word by referring to a decoding table in response to the generated encoding-state information; reproducing auxiliary information from the code-word sequence; and executing, in response to the reproduced auxiliary information, at least one of 1) generation of an encryption key, 2) identification of an encryption key, 3) identification of a base of an encryption key, 4) control of playback on the basis of a region, 5) control of playback on the basis of a rating, 6) control of recording and playback on the basis of identification information, 7) control of recording and playback on the basis of recording and playback control information, 8) decision about an address to be accessed, 9) access to an URL address related to contents information, 10) playback of character information, 11) playback of an auxiliary-picture information, 12) playback of audio visual information, and 13) authentication as to whether or not a recording medium is legitimate.

A twenty-eighth aspect of this invention provides an apparatus for reproducing an auxiliary information from a sequence of code words which is generated by the apparatus in the eighteenth aspect of this invention. The reproducing apparatus comprises means for recovering encoding-state information from the code-word sequence, the encoding-state information representing which of encoding tables has been used in generating a code word immediately following a code word of interest; means for demodulating the code word of interest into an original code word by referring to a decoding table in response to the generated encoding-state information; means for reproducing auxiliary information from the code-word sequence; and means for executing, in response to the reproduced auxiliary information, at least one of 1) generation of an encryption key, 2) identification of an encryption key, 3) identification of a base of an encryption key, 4) control of playback on the basis of a region, 5) control of playback on the basis of a rating, 6) control of recording and playback on the basis of identification information, 7) control of recording and playback on the basis of recording and playback control information, 8) decision about an address to be accessed, 9) access to an URL address related to contents information, 10) playback of character information, 11) playback of an auxiliary-picture information, 12) playback of audio visual information, and 13) authentication as to whether or not a recording medium is legitimate.

A twenty-ninth aspect of this invention provides a modulation apparatus comprising means for generating a final 15-bit output code word in response to every 8-bit input code word by referring to a set of encoding tables, wherein the encoding tables contain output code words assigned to input code words, and contain state information accompanying each output code word, wherein the state information designates an encoding table among the encoding tables which is used next to generate an output code word immediately following the output code word accompanied with the state information; means for generating a first candidate current output code word in response to a current input code word equal to one of prescribed input code words by referring to one of first and second specified encoding tables among the encoding tables which is designated by state information accompanying an immediately-preceding final output code word; means for generating a second candidate current output code word in response to the current input code word equal to said one of the prescribed input code words by referring to the other of the first and second specified encoding tables under conditions where a succession of the second candidate current output code word and the immediately-preceding final output code word follows a run length limiting rule; means for calculating a first DSV from the first candidate current output code word and previous final output code words; means for calculating a second DSV from the second candidate current output code word and previous final output code words; means for determining which of an absolute value of the first DSV and an absolute value of the second DSV is smaller; means for selecting one from the first and second candidate current output code words which corresponds to the smaller DSV absolute value as a final current output code word; and means for changing the run length limiting rule to change a maximum run length in a sequence of final output code words in response to auxiliary information to superimpose the auxiliary information on the sequence of the final output code words.

A thirtieth aspect of this invention is based on the twenty-ninth aspect thereof, and provides a modulation apparatus wherein the sequence of the final output code words represents encryption-resultant main information, and the auxiliary information contains an information piece for decrypting the encryption-resultant main information.

A thirty-first aspect of this invention is based on the twenty-ninth aspect thereof, and provides a modulation apparatus wherein the sequence of the final output code words represents scrambling-resultant main information, and the auxiliary information contains an information piece for descrambling the scrambling-resultant main information.

A thirty-second aspect of this invention provides a modulation method comprising the steps of generating a final 15-bit output code word in response to every 8-bit input code word by referring to a set of encoding tables, wherein the encoding tables contain output code words assigned to input code words, and contain state information accompanying each output code word, wherein the state information designates an encoding table among the encoding tables which is used next to generate an output code word immediately following the output code word accompanied with the state information; generating a first candidate current output code word in response to a current input code word equal to one of prescribed input code words by referring to one of first and second specified encoding tables among the encoding tables which is designated by state information accompanying an immediately-preceding final output code word; generating a second candidate current output code word in response to the current input code word equal to said one of the prescribed input code words by referring to the other of the first and second specified encoding tables under conditions where a succession of the second candidate current output code word and the immediately-preceding final output code word follows a run length limiting rule; calculating a first DSV from the first candidate current output code word and previous final output code words; calculating a second DSV from the second candidate current output code word and previous final output code words; determining which of an absolute value of the first DSV and an absolute value of the second DSV is smaller; selecting one from the first and second candidate current output code words which corresponds to the smaller DSV absolute value as a final current output code word; and changing the run length limiting rule to change a maximum run length in a sequence of final output code words in response to auxiliary information to superimpose the auxiliary information on the sequence of the final output code words.

A thirty-third aspect of this invention is based on the thirty-second aspect thereof, and provides a modulation method wherein the sequence of the final output code words represents encryption-resultant main information, and the auxiliary information contains an information piece for decrypting the encryption-resultant main information.

A thirty-fourth aspect of this invention is based on the thirty-second aspect thereof, and provides a modulation method wherein the sequence of the final output code words represents scrambling-resultant main information, and the auxiliary information contains an information piece for descrambling the scrambling-resultant main information.

A thirty-fifth aspect of this invention provides a demodulation apparatus comprising means for recovering state information from a sequence of code words, the state information representing which of encoding tables has been used in generating a code word immediately following every code word of interest; means for demodulating the code word of interest into an original code word by referring to a decoding table in response to the generated state information; means for detecting a frequency of occurrence of a specified run length in the sequence of code words; and means for reproducing auxiliary information from the sequence of code words in response to the detected occurrence frequency.

A thirty-sixth aspect of this invention is based on the thirty-fifth aspect thereof, and provides a demodulation apparatus further comprising means for decrypting encryption-resultant main information represented by a sequence of original code words in response to the reproduced auxiliary information.

A thirty-seventh aspect of this invention is based on the thirty-fifth aspect thereof, and provides a demodulation apparatus further comprising means for descrambling scrambling-resultant main information represented by a sequence of original code words in response to the reproduced auxiliary information.

A thirty-eighth aspect of this invention provides a demodulation method comprising the steps of recovering state information from a sequence of code words, the state information representing which of encoding tables has been used in generating a code word immediately following every code word of interest; demodulating the code word of interest into an original code word by referring to a decoding table in response to the generated state information; detecting a frequency of occurrence of a specified run length in the sequence of code words; and reproducing auxiliary information from the sequence of code words in response to the detected occurrence frequency.

A thirty-ninth aspect of this invention is based on the thirty-eighth aspect thereof, and provides a demodulation method further comprising the step of decrypting encryption-resultant main information represented by a sequence of original code words in response to the reproduced auxiliary information.

A fortieth aspect of this invention is based on the thirty-eighth aspect thereof, and provides a demodulation method further comprising the step of descrambling scrambling-resultant main information represented by a sequence of original code words in response to the reproduced auxiliary information.

BRIEF DESCRIPTION OF THE DRAWINGS

FIG. 2 is a diagram of an example of the relation among recording sectors, states of a maximum-run-length setting signal, and maximum run lengths Tmax.

Figure 4:
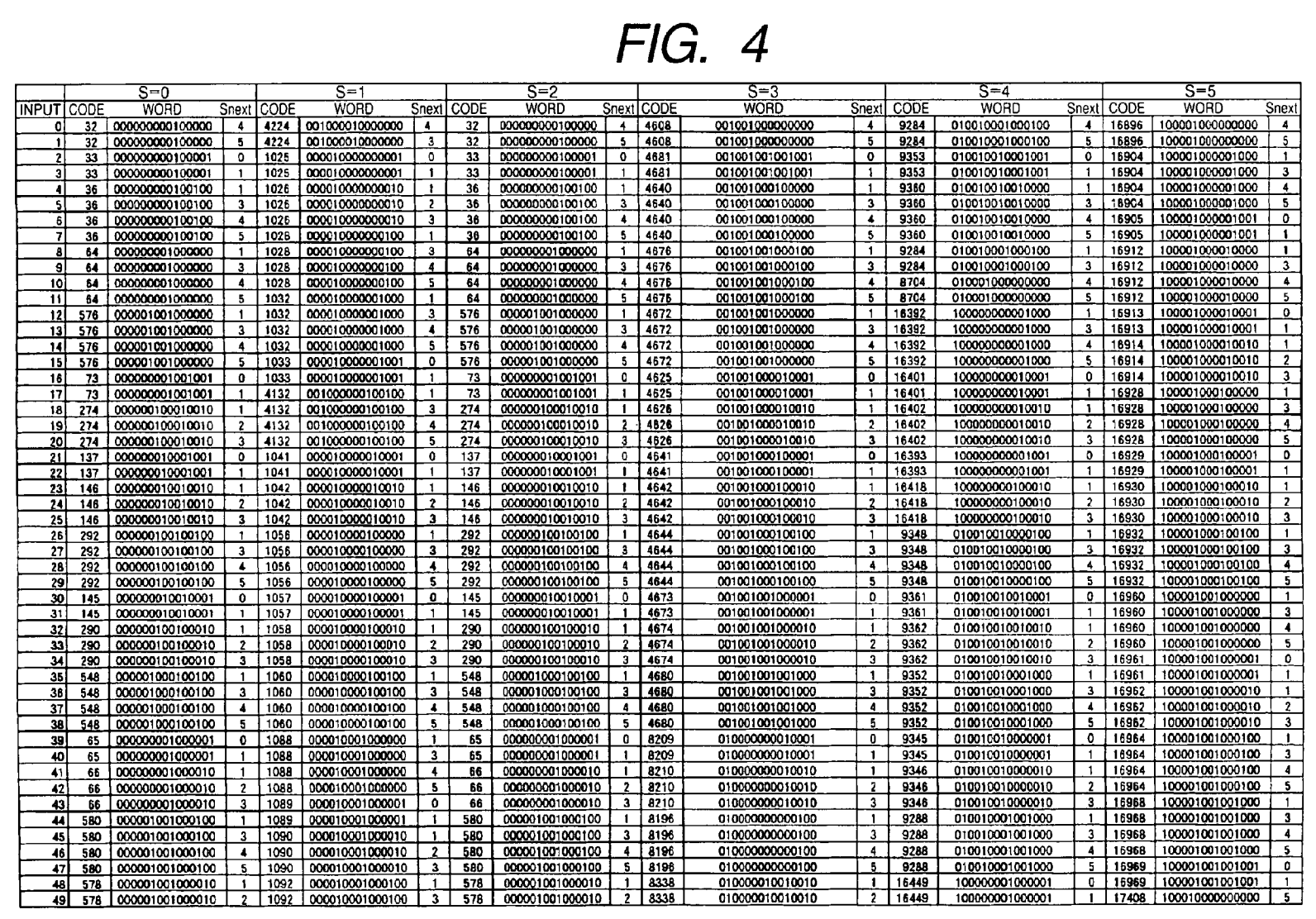
Figure 5:
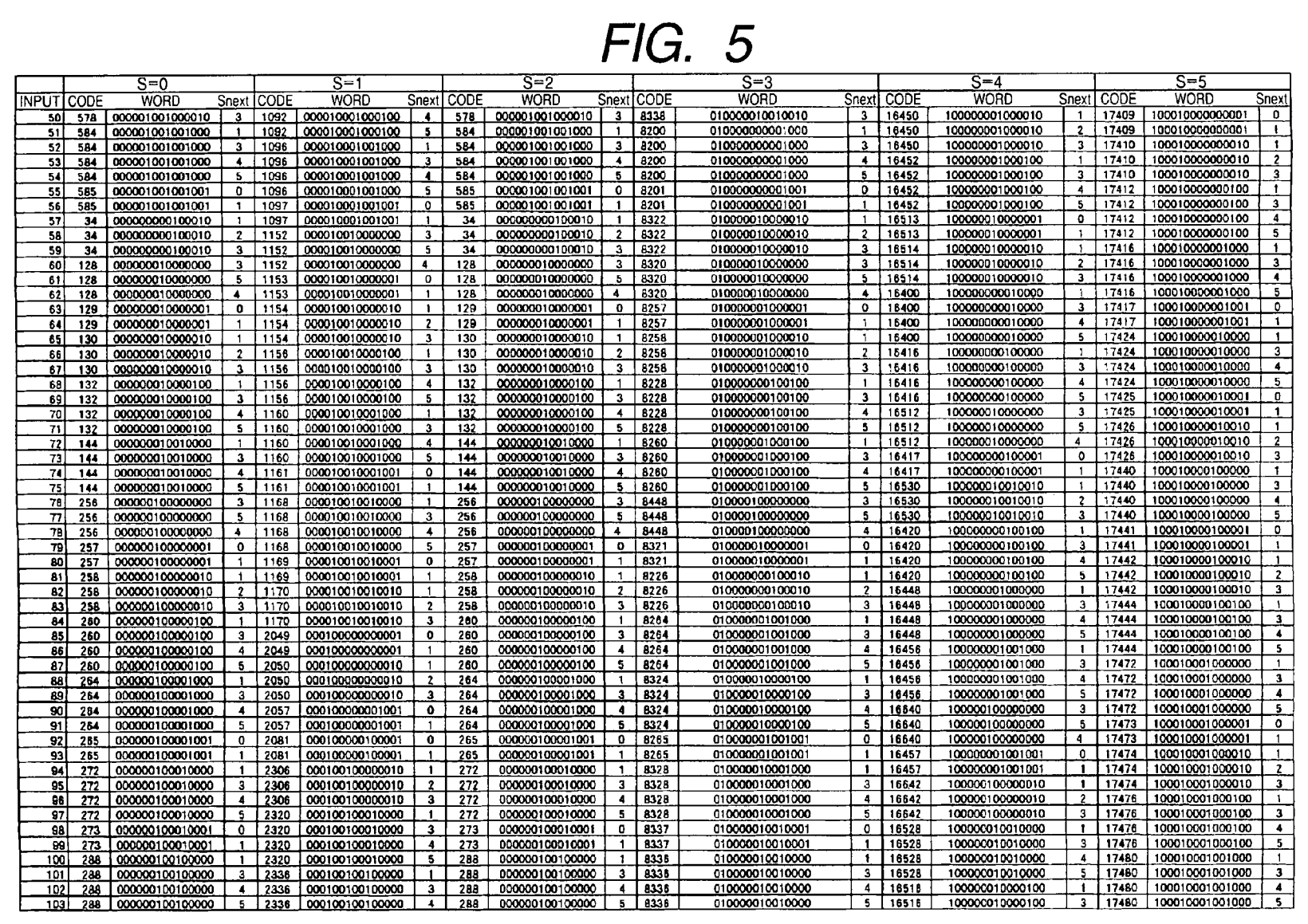
Figure 6:
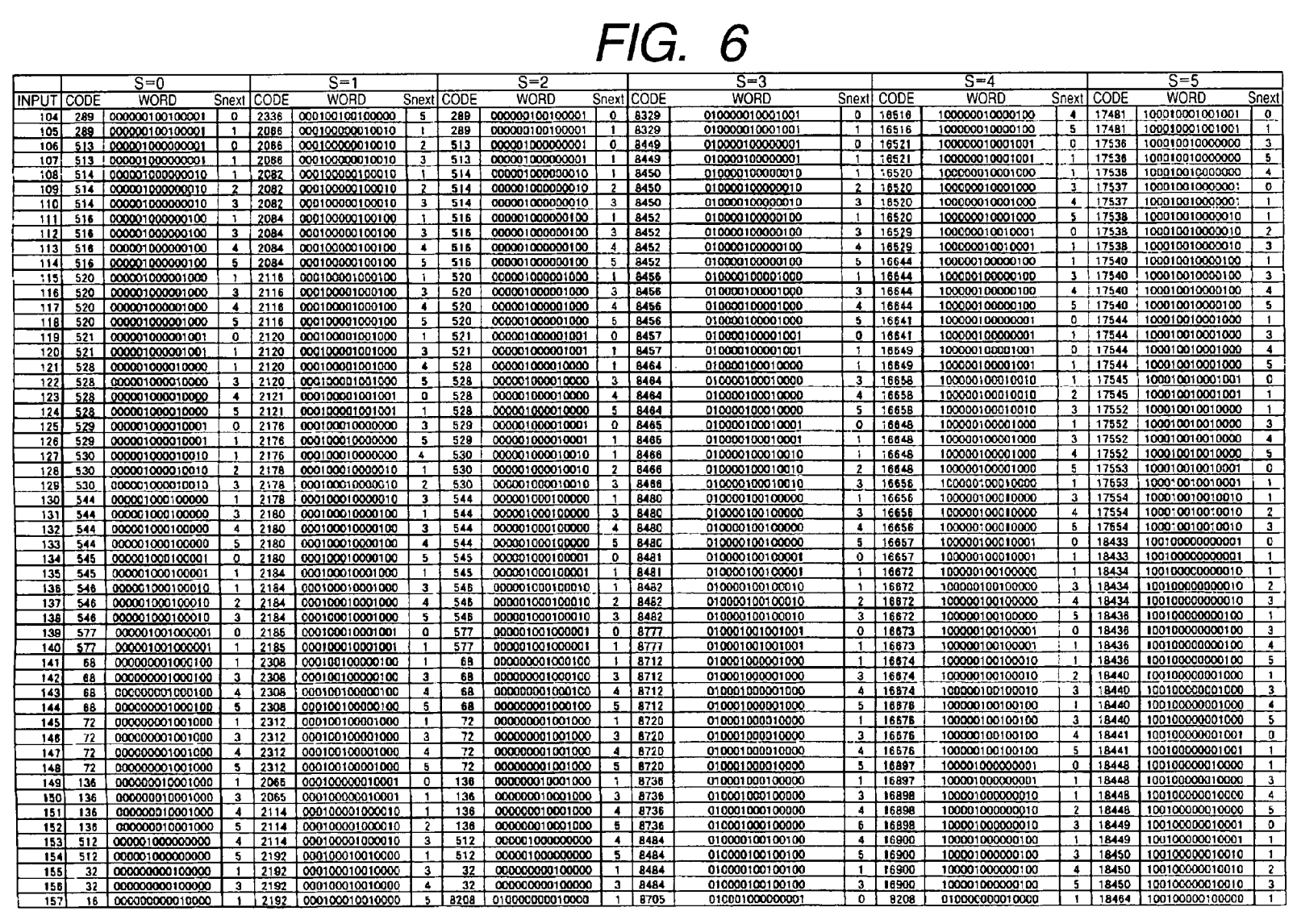
Figure 7:
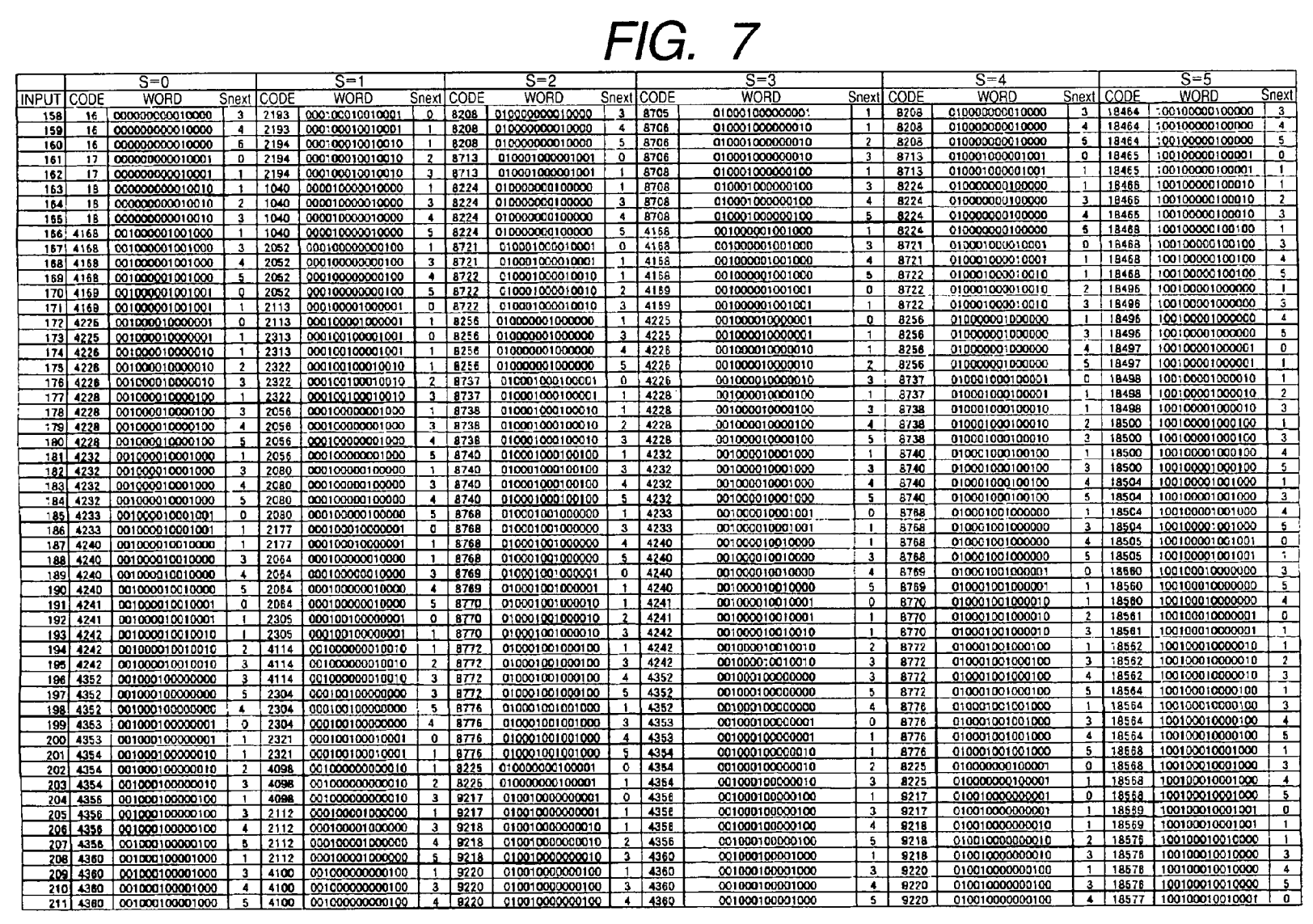
Figure 8:
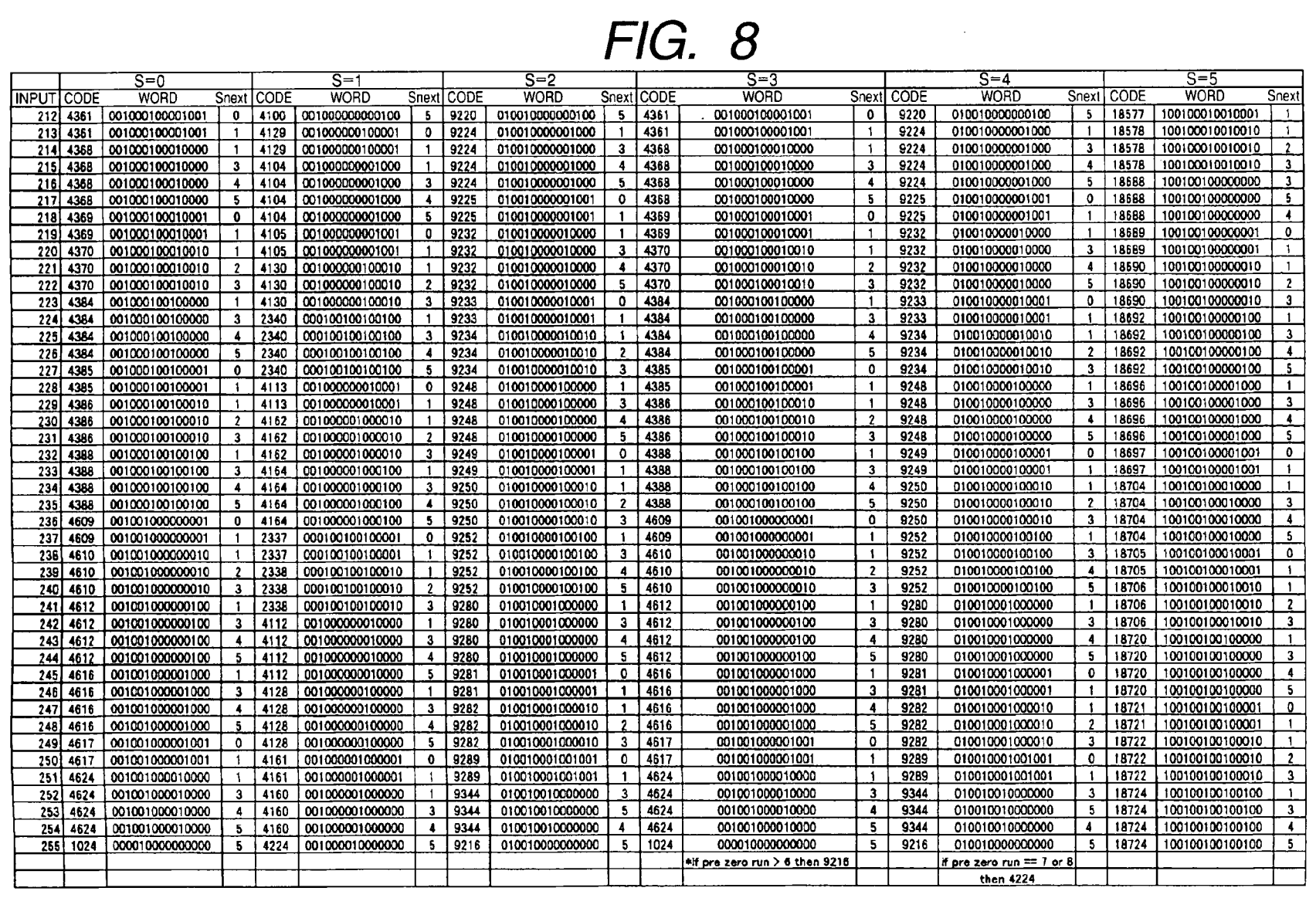

FIGS. 4, 5, 6, 7, and 8 are diagrams of a first example of the contents of an encoding table in FIGS. 1 and 3.

Figure 10:
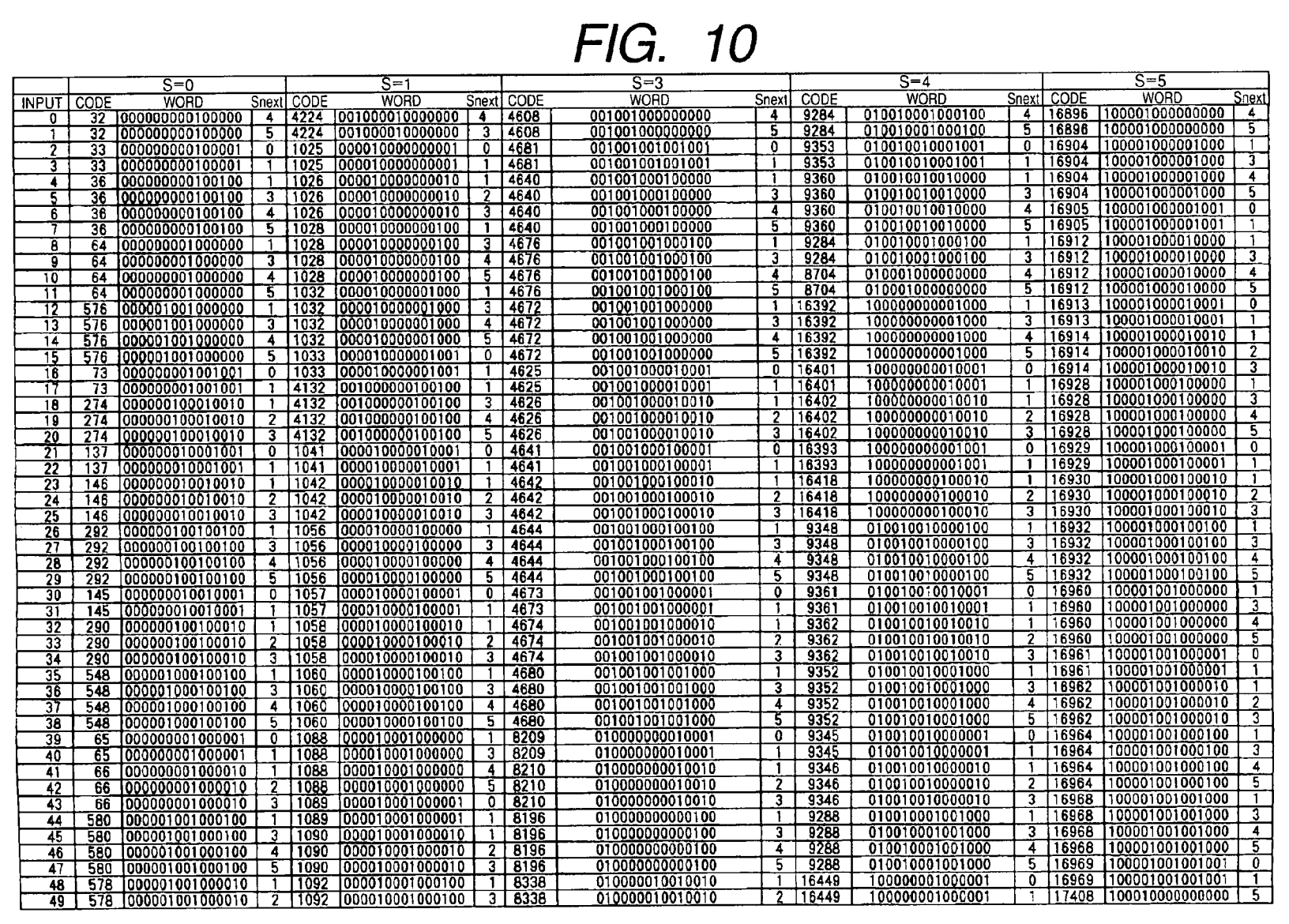
Figure 12:
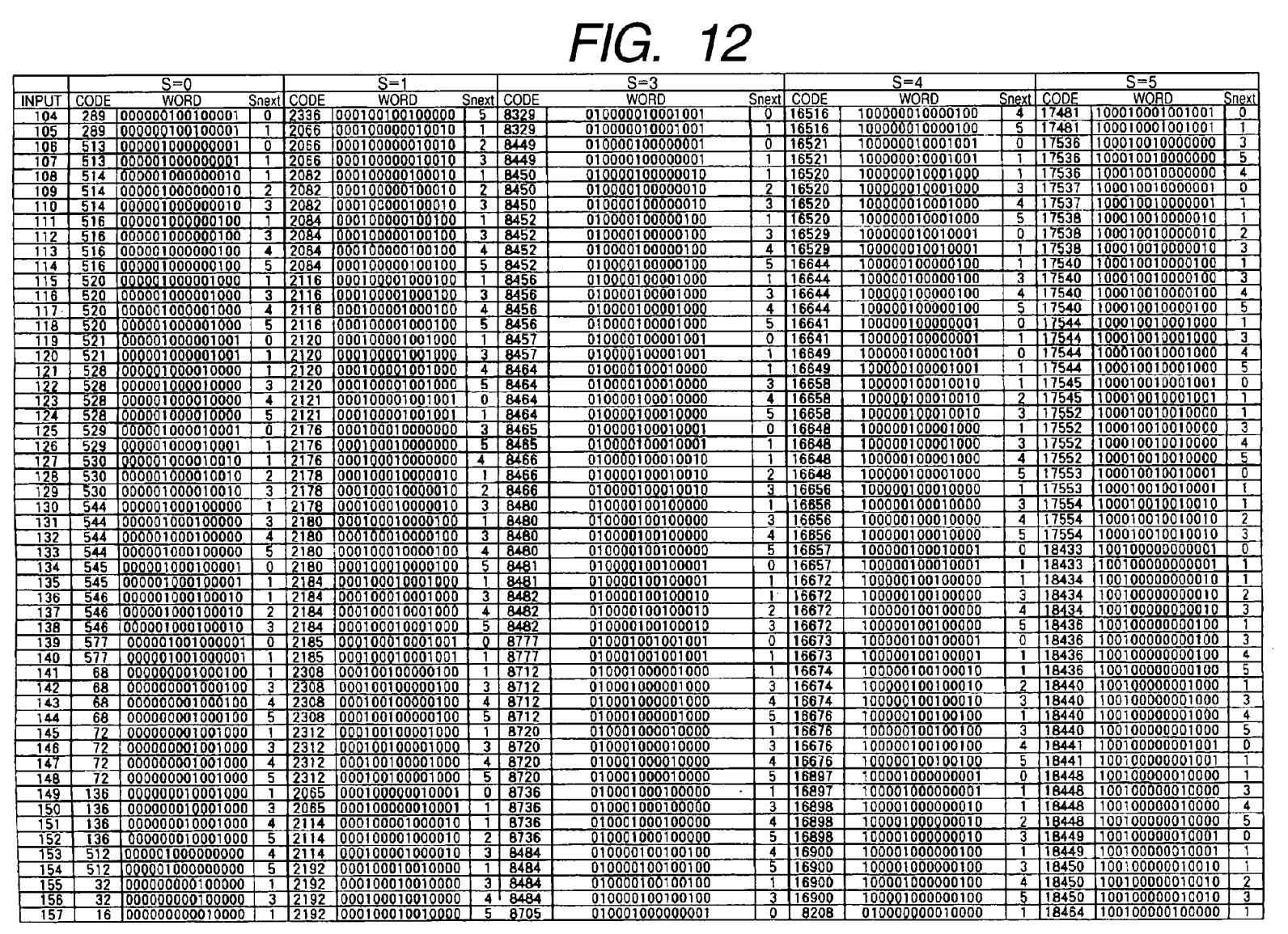
Figure 13:
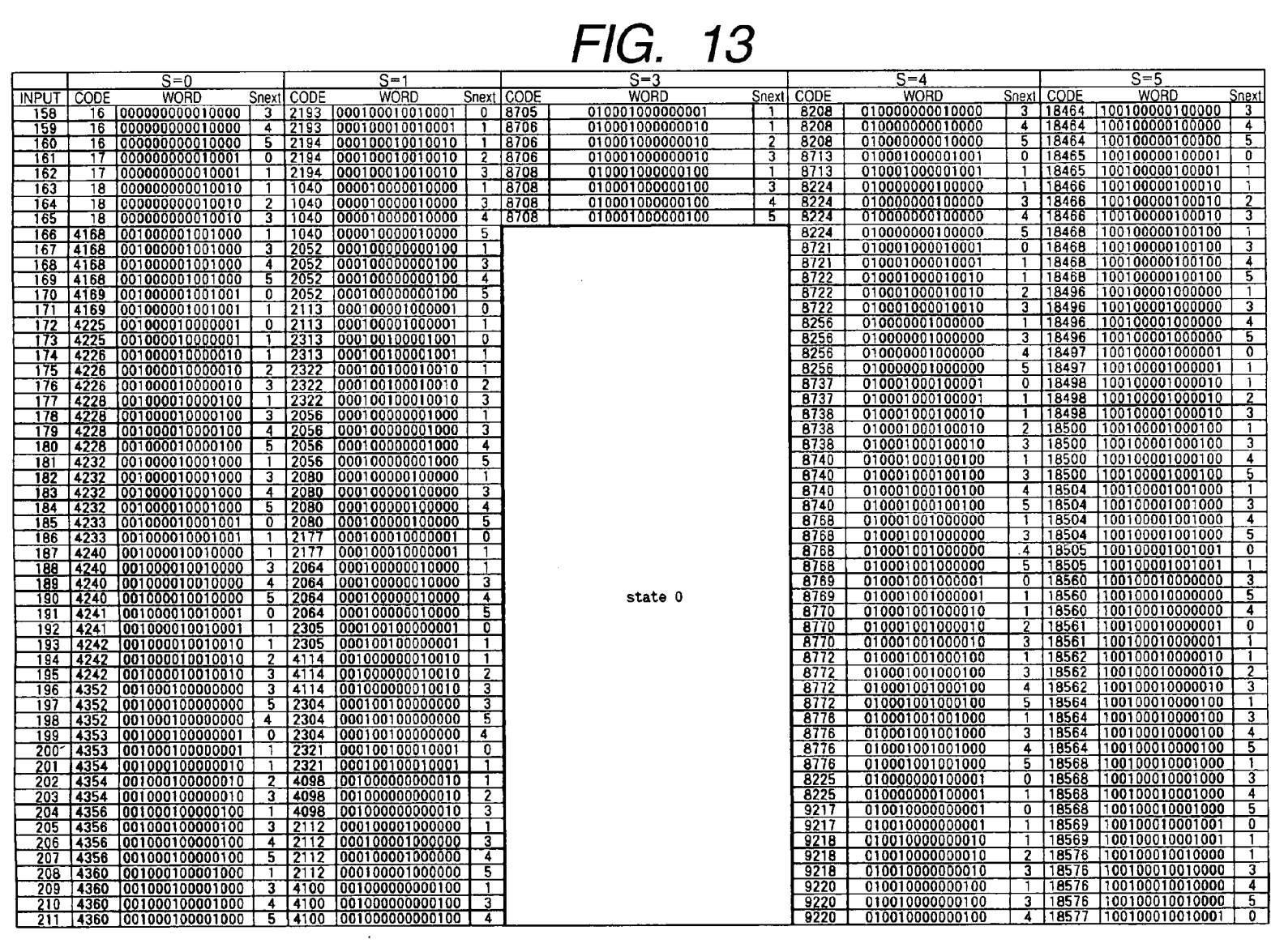

FIGS. 10, 11, 12, 13, and 14 are diagrams of a second example of the contents of the encoding table in FIGS. 1 and 3.

FIG. 15 is a block diagram of an information reproducing apparatus including a demodulator according to a second embodiment of this invention.

FIG. 16 is a block diagram of a demodulator in FIG. 15.

FIG. 18 is a diagram of a portion of the contents of a decoding table provided in a main-information decoder in FIG. 16.

FIG. 22 is a diagram of a calculator for generating auxiliary information from basic information pieces.

FIG. 23 is a block diagram of an information processing system according to a fifth embodiment of this invention.

FIG. 24 is a block diagram of an illegitimate information processing system.

DETAILED DESCRIPTION OF THE INVENTION

First Embodiment

Figure 1:
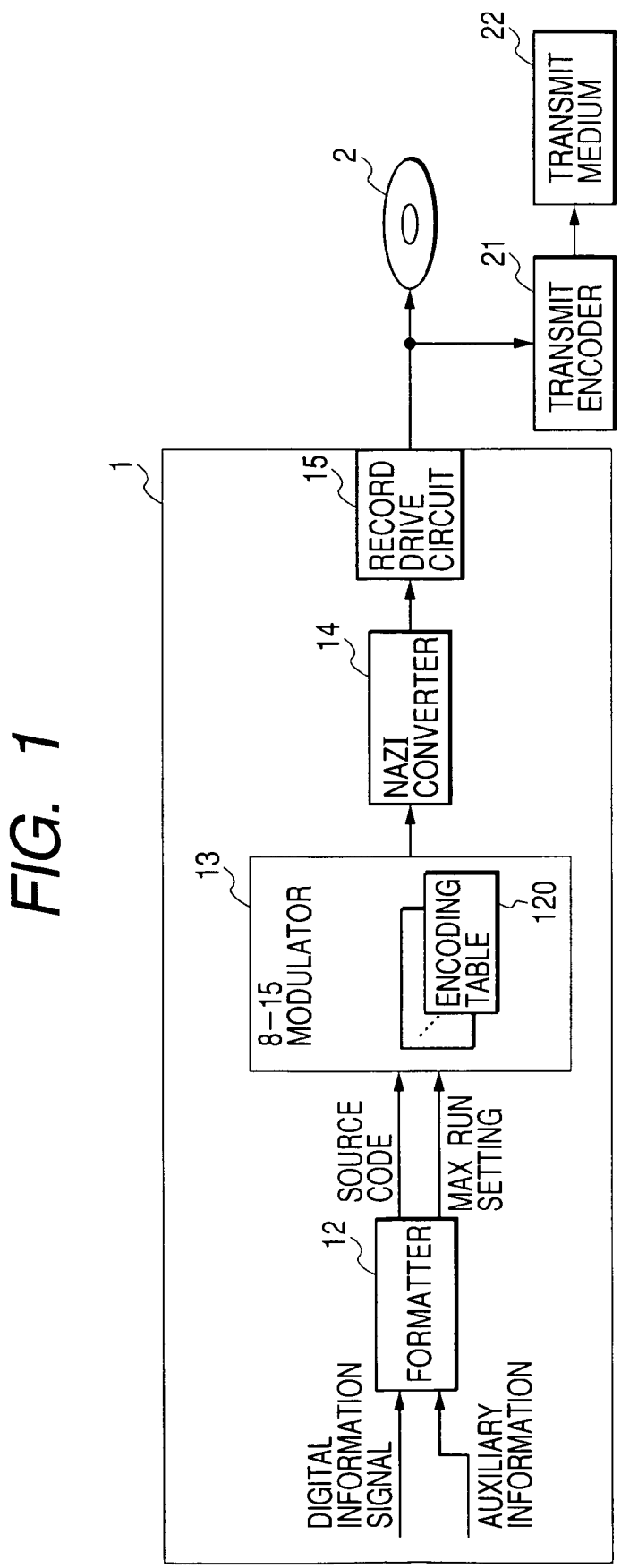
FIG. 1 is a block diagram of an information recording apparatus including a modulator according to a first embodiment of this invention.

FIG. 1 shows an apparatus 1 for recording information on a recording medium 2. The recording apparatus 1 includes a modulator according to a first embodiment of this invention. The recording apparatus 1 is also referred to as the modulator 1.

As shown in FIG. 1, the recording apparatus 1 includes a formatter 12, an 8–15 modulator 13, an NRZI (non-return-to-zero invert) converter 14, and a recording and driving circuit 15 which are sequentially connected in that order. The recording apparatus 1 receives an input digital signal, and records the received digital signal on the recording medium 2. The input digital signal represents main information such as video information, audio information, or audio visual information. The recording medium 2 includes, for example, an optical disc.

The formatter 12 receives the input digital signal, and also a control signal to be recorded together with the input digital signal. The formatter 12 adds an error correction code signal and a sync signal to the received digital signal, and combines the addition-resultant signal and the received control signal into a second digital signal of a predetermined control format conforming with a recording format used by the recording medium 2. The formatter 12 outputs the second digital signal to the 8–15 modulator 13. The second digital signal is also referred to as the source code signal. The output digital signal from the formatter 12 is divided by segments whose heads are occupied by the sync signal.

In addition, the formatter 12 receives auxiliary information together with the input digital signal. The formatter 12 generates a maximum-run-length setting signal from the received auxiliary information. The formatter 12 outputs the maximum-run-length setting signal to the 8–15 modulator 13.

As shown in FIG. 2, the maximum-run-length setting signal includes a binary signal which assumes either "1" or "0" for every recording sector. The 8–15 modulator 13 responds to the maximum-run-length setting signal. When the maximum-run-length setting signal is "1", the 8–15 modulator 13 implements modulation with a run length limiting procedure designed to equalize a maximum run length Tmax of the NRZI-modulation-resultant signal except a sync to a first prescribed value, for example, "12" (12T), and to equalize a minimum run length Tmin thereof to "3" (3T). Here, T denotes the length or period of one bit (one channel bit). In this case, the run length limiting rules providing the run length range of 3T–12T are effected. The effected run length limiting rules correspond to the before-NRZI-conversion rules "RLL(2, 11)". When the maximum-run-length setting signal is "0", the 8–15 modulator 13 implements modulation with a run length limiting procedure designed to equalize the maximum run length Tmax to a second prescribed value, for example, "11" (11T), and to equalize the minimum run length Tmin to "3" (3T). In this case, the run length limiting rules providing the run length range of 3T–11T are effected. The effected run length limiting rules correspond to the before-NRZI-conversion rules "RLL(2, 10)".

It should be noted that auxiliary information which assumes either "1" or "0" for every recording sector may be directly fed to the 8–15 modulator 13. In this case, the 8–15 modulator 13 responds to the directly-fed auxiliary information.

It should be noted that the first prescribed value may be equal to "13" (13T) or more. The second prescribed value may differ from "11" (11T). Preferably, the first and second prescribed values are equal to "14" (14T) or less. Most preferably, the first and second prescribed values are in the range of "11" to "14" (11T to 14T). For example, 2048 bytes of the input digital signal are assigned to one recording sector. Another number of bytes of the input digital signal may be assigned to one recording sector.

The 8–15 modulator 13 subjects the second digital signal (the source code signal) to 8–15 modulation responsive to the maximum-run-length setting signal, thereby converting the second digital signal into a third digital signal. The 8–15 modulator 13 outputs the third digital signal to the NRZI converter 14.

The NRZI converter 14 subjects the third digital signal (the output digital signal from the 8–15 modulator 13) to NRZI modulation, thereby converting the third digital signal into a fourth digital signal which is of an NRZI code. The NRZI converter 14 outputs the fourth digital signal to the recording and driving circuit 15. The recording and driving circuit 15 records the fourth digital signal (the output digital signal from the NRZI converter 14) on the recording medium 2 via a recording head such as an optical head.

The fourth digital signal can be fed to a transmission encoder 21 via the recording and driving circuit 15. The device 21 encodes the fourth digital signal into a fifth digital signal which is of a code suited for transmission. The transmission encoder 21 outputs the fifth digital signal to a transmission medium 22. The fifth digital signal propagates along the transmission medium 22.

Figure 3:
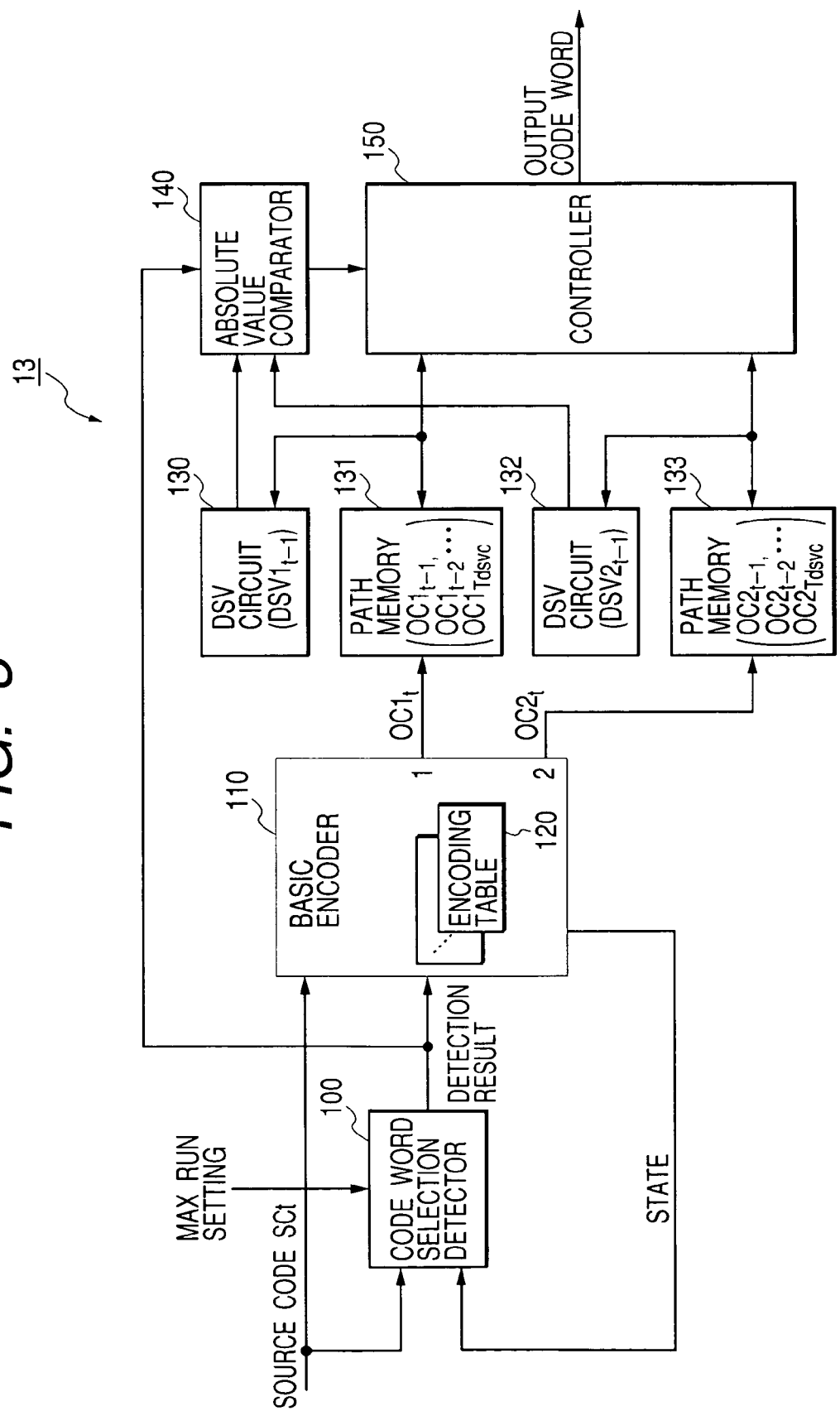
FIG. 3 is a block diagram of an 8–15 modulator in FIG. 1.

As shown in FIG. 3, the 8–15 modulator 13 includes two path memories 131 and 133. The 8–15 modulator 13 may include more path memories. The 8–15 modulator 13 further includes a code-word selection detector 100 and a basic encoder 110. The code-word selection detector 100 is connected with the basic encoder 110. The basic encoder 110 is connected with the path memories 131 and 133. The code-word selection detector 100 receives the maximum-run-length setting signal from the formatter 12. The code-word selection detector 100 derives a desired maximum run length from the maximum-run-length setting signal.

The basic encoder 110 receives the source code signal from the formatter 12. The basic encoder 110 handles every 8-bit block of the source code signal as an input code word. The basic encoder 110 includes an encoding table 120 used for converting or encoding every 8-bit input code word into a 15-bit output code word. The basic encoder 110 also includes an address generator for producing an address signal in response to every 8-bit input code word. The address signal designates one of cells in the encoding table 120 which should be accessed. The encoding table 120 has a set of six sub encoding tables denoted by state information S of "0", "1", "2", "3", "4", and "5" respectively. Each of the six sub encoding tables stores 15-bit output code words assigned to 8-bit input code words. The encoding table 120 has an array of cells at different addresses which contain the 15-bit output code words respectively. The 15-bit output code words in the encoding table 120 are designed so that the NRZI modulation result of successive output code words selected therefrom will follow predetermined run length limiting rules such that a minimum run length is 3T and a maximum run length is 11T. The predetermined run length limiting rules correspond to the before-NRZI-conversion rules "RLL(2, 10)".

FIGS. 4, 5, 6, 7, and 8 show a first example of the contents of the sub encoding tables denoted by state information S of "0", "1", "2", "3", "4", and "5" respectively. These sub encoding tables contain arrays of cells each having a set of an input code word, an output code word assigned to the input code word, and a value Snext assigned to the output code word. In FIGS. 4-8, each input code word is expressed by the decimal notation while each output code word is expressed by both the decimal notation and the binary notation. In FIGS. 4-8, each output code word is followed by and accompanied with a value Snext which designates a sub encoding table used next. Under normal conditions, when the value Snext accompanying the current output code word is "0", the sub encoding table denoted by state information S of "0" is used to generate a next output code word. When the value Snext accompanying the current output code word is "1", the sub encoding table denoted by state information S of "1" is used to generate a next output code word. When the value Snext accompanying the current output code word is "2", the sub encoding table denoted by state information S of "2" is used to generate a next output code word. When the value Snext accompanying the current output code word is "3", the sub encoding table denoted by state information S of "3" is used to generate a next output code word. When the value Snext accompanying the current output code word is "4", the sub encoding table denoted by state information S of "4" is used to generate a next output code word. When the value Snext accompanying the current output code word is "5", the sub encoding table denoted by state information S of "5" is used to generate a next output code word. The values Snext are referred to as the state-indicating values Snext or the next-table-designating values Snext. The state-indicating values Snext are designed so that the NRZI modulation result of a sequence of selected output code words will follow the predetermined run length limiting rules providing the run length range of, for example, 3T–11T (corresponding to, for example, the before-NRZI-conversion rules "RLL(2, 10)").

According to the sub encoding table denoted by state information S of "0": an output code word assigned to an input code word of "0" is accompanied with a state-indicating value Snext of "4"; an output code word assigned to an input code word of "1" is accompanied with a state-indicating value Snext of "5"; and an output code word assigned to an input code word of "2" is accompanied with a state-indicating value Snext of "0". Thus, in the case where an input code word of "0" is converted into an output code word by referring to the sub encoding table denoted by state information S of "0", since the state-indicating value Snext accompanying the output code word is "4", a next input code word is converted into an output code word by referring to the sub encoding table denoted by state information S of "4".

The sub encoding table denoted by state information S of "0" and the sub encoding table denoted by state information S of "3" are in a prescribed relation as follows. The NRZI modulation results (the NRZI conversion results) of output code words assigned to input code words of "0" to "38" in the sub encoding table denoted by state information S of "0" are opposite in polarity ("odd-even" in the number of "1", that is, DSV-related polarity) to those of output code words in the sub encoding table denoted by state information of "3". Thereby, initial values at the time of NRZI conversion of a next output code word which relate to the sub encoding tables can be different from each other. In addition, the opposite polarities cause a DSV (digital sum variation) in an increasing direction and a DSV in a decreasing direction, respectively.

The six sub encoding tables are designed to satisfy conditions as follows. The zero run length of the LSB side of each of output code words accompanied with state-indicating values Snext of "0" in the six sub encoding tables is equal to "0". In other words, each of output code words accompanied with state-indicating values Snext of "0" ends at a bit of "1". The zero run length of the MSB side of each of output code words assigned to input code words of "0" to "38" in the sub encoding table denoted by state information S of "3" is equal to "2". In other words, three former bits of each of output code words assigned to input code words of "0" to "38" in the sub encoding table denoted by state information S of "3" are "0", "0", and "1", respectively. Thus, even in cases where output code words assigned to input code words of "0" to "38" in the sub encoding table denoted by state information S of "3" are used instead of output code words assigned to input code words of "0" to "38" in the sub encoding table denoted by state information S of "0", an NRZI-conversion-resultant bit stream follows desired run length limiting rules such that the run length is in the range of 3T–11T.

The sub encoding table denoted by state information S of "2" and the sub encoding table denoted by state information S of "4" are in a prescribed relation as follows. The NRZI modulation results (the NRZI conversion results) of output code words assigned to input code words of "0" to "11" and "26" to "47" in the sub encoding table denoted by state information S of "2" are opposite in polarity ("odd-even" in the number of "1", that is, DSV-related polarity) to those of output code words in the sub encoding table denoted by state information of "4". Thereby, initial values at the time of NRZI conversion of a next output code word which relate to the sub encoding tables can be different from each other. In addition, the opposite polarities cause a DSV (digital sum variation) in an increasing direction and a DSV in a decreasing direction, respectively.

The six sub encoding tables are designed to satisfy conditions as follows. The zero run length of the LSB side of each of output code words accompanied with state-indicating values Snext of "2" in the six sub encoding tables is equal to "1". In other words, two end bits of each of output code words accompanied with state-indicating values Snext of "2" are "1" and "0", respectively. The zero run length of the MSB side of each of output code words assigned to input code words of "0" to "11" and "26" to "47" in the sub encoding table denoted by state information S of "4" is equal to "1". In other words, two former bits of each of output code words assigned to input code words of "0" to "11" and "26" to "47" in the sub encoding table denoted by state information S of "4" are "0" and "1", respectively. Thus, even in cases where output code words assigned to input code words of "0" to "11" and "26" to "47" in the sub encoding table denoted by state information S of "4" are used instead of output code words assigned to input code words of "0" to "11" and "26" to "47" in the sub encoding table denoted by state information S of "2", an NRZI-conversion-resultant bit stream follows desired run length limiting rules such that the run length is in the range of 3T–11T.

In the six sub encoding tables of FIGS. 4, 5, 6, 7, and 8, each of some output code words is assigned in common to a plurality of input code words, and the common output code words in the respective cells are accompanied with different state-indicating values Snext respectively. This design is advantageous in reducing the volume of the encoding table 120. The assignment of state-indicating values Snext to output code words follows predetermined rules. State-indicating values Snext accompanying transmitted output code words are not positively transmitted to a decoder side (a demodulation side). The decoder side utilizes the predetermined assignment rules, and thereby recovers a state-indicating value Snext accompanying a code word of interest and then uses the recovered state-indicating value Snext in decoding the code word of interest rather than decoding a code word immediately following the code word of interest. This design simplifies the decoding procedure.

As shown in FIG. 3, the 8–15 modulator 13 further includes DSV circuits 130 and 132, a comparator 140, and a controller 150. The DSV circuit 130 is connected with the path memory 131, the comparator 140, and the controller 150. The DSV circuit 132 is connected with the path memory 133, the comparator 140, and the controller 150. The comparator 140 is connected with the codeword selection detector 100 and the controller 150. The controller 150 is connected with the path memories 131 and 133. The controller 150 is followed by the NRZI converter 14 (see FIG. 1).

As previously mentioned, the 8–15 modulator 13 responds to the maximum-run-length setting signal fed from the formatter 12. When the maximum-run-length setting signal is "0", the run length limiting rules providing the run length range of 3T–11T are effected with respect to the NRZI conversion result. On the other hand, when the maximum-run-length setting signal is "1", the run length limiting rules providing the run length range of 3T–12T are effected with respect to the NRZI conversion result.

The 8–15 modulator 13 operates as follows. The basic encoder 110 receives the source code signal from the formatter 12. The basic encoder 110 handles every 8-bit block of the source code signal as an input code word SCt. In addition, the basic encoder 110 implements frame-by-frame signal processing. Here, "frame" means a sync frame corresponding to each segment of the source code signal whose head is occupied by the sync signal. A given number of sync frames compose one recording sector. The basic encoder 110 has an initial table in addition to the encoding table 120. The initial table contains a predetermined sync bit pattern and a predetermined initial value of the state-indicating value (the next-table-designating value) Snext for a specified input code word SCt. First, the basic encoder 110 selects the initial table with respect to an input code word SCt representative of a specified signal such as the sync signal. The basic encoder 110 reads out the initial value from the initial table, and sets the state-indicating value (the next-table-designating value) Snext to the read-out initial value. The basic encoder 110 reads out the sync bit pattern from the initial table, and outputs the read-out sync bit pattern to the next stage, that is, the path memories 131 and 133. The code-word selection detector 100 receives the source code signal from the formatter 12. The code-word selection detector 100 handles every 8-bit block of the source code signal as a current input code word SCt. The code-word selection detector 100 receives a signal representative of the state-indicating value (the next-table-designating value) Snext from the basic encoder 110. First, the state-indicating value Snext is equal to the initial value. In addition, the code-word selection detector 100 is informed of an output code word finally selected and decided by the basic encoder 110. The code-word selection detector 100 receives the maximum-run-length setting signal from the formatter 12. The code-word selection detector 100 detects whether or not an output code word corresponding to the current input code word SCt is uniquely decided, that is, whether or not selecting one from candidate output code words as a final output code word corresponding to the current input code word SCt is required on the basis of the current input code word SCt, the state-indicating value Snext, the latest selected output code word, and the maximum-run-length setting signal. The code-word selection detector 100 outputs a signal representative of a result of the detection to the basic encoder 110 and the comparator 140.

As previously mentioned, even in cases where output code words assigned to input code words of "0" to "38" in the sub encoding table denoted by state information S of "3" are used instead of output code words assigned to input code words of "0" to "38" in the sub encoding table denoted by state information S of "0", an NRZI-conversion-resultant bit stream follows the desired run length limiting rules. Similarly, even in cases where output code words assigned to input code words of "0" to "11" and "26" to "47" in the sub encoding table denoted by state information S of "4" are used instead of output code words assigned to input code words of "0" to "11" and "26" to "47" in the sub encoding table denoted by state information S of "2", an NRZI-conversion-resultant bit stream follows the desired run length limiting rules. As previously mentioned, the NRZI modulation results (the NRZI conversion results) of output code words assigned to input code words of "0" to "38" in the sub encoding table denoted by state information S of "0" are opposite in polarity ("odd-even" in the number of "1") to those of output code words in the sub encoding table denoted by state information of "3". Similarly, the NRZI modulation results (the NRZI conversion results) of output code words assigned to input code words of "0" to "11" and "26" to "47" in the sub encoding table denoted by state information S of "2" are opposite in polarity ("odd-even" in the number of "1") to those of output code words in the sub encoding table denoted by state information of "4". Accordingly, for each of input code words of "0" to "38" originally directed to the sub encoding table denoted by state information S of "0", two candidate output code words are taken. The candidate output code words are read out from the sub encoding table denoted by state information S of "0" and the sub encoding table denoted by state information S of "3", respectively. The candidate output code words are assigned to a path "1" and a path "2", respectively. Also, for each of input code words of "0" to "11" and "26 to "47" originally directed to the sub encoding table denoted by state information S of "2", two candidate output code words are taken. The candidate output code words are read out from the sub encoding table denoted by state information S of "2" and the sub encoding table denoted by state information S of "4", respectively. The candidate output code words are assigned to the path "1" and the path "2", respectively. In these cases, DSVs (digital sum variations) are calculated for the paths "1" and "2", and optimal one is selected from the candidate output code words as a final output code word on the basis of the calculated DSVs. Therefore, DSV control is implemented.

Under specified conditions depending on the maximum-run-length setting signal are satisfied, for each of input code words originally directed to the sub encoding table denoted by state information S of "3", two candidate output code words are taken. The candidate output code words are read out from the sub encoding table denoted by state information S of "3" and the sub encoding table denoted by state information S of "0", respectively. The candidate output code words are assigned to the path "1" and the path "2", respectively. In these cases, DSVs (digital sum variations) are calculated for the paths "1" and "2", and optimal one is selected from the candidate output code words as a final output code word on the basis of the calculated DSVs. Therefore, DSV control is implemented.

The code-word selection detector 100 has a first detection circuit for detecting whether or not the state-indicating value (the next-table-designating value) Snext notified by the basic encoder 110 is "0", and a second detection circuit for detecting whether or not the current input code word SCt is in the range of "0" to "38". In the case where the state-indicating value Snext is "0" and the current input code word SCt is in the range of "0" to "38", the code-word selection detector 100 outputs a detection-result signal (a code-word selection signal) to the basic encoder 110 and the comparator 140 which represents that code-word selection is required. In this case, the basic encoder 110 generates two different addresses in response to the code-word selection signal, the current input code word SCt, and the state-indicating value Snext, and accesses two of the six sub encoding tables in response to the generated addresses. Specifically, the basic encoder 110 reads out an output code word OC1t assigned to the current input code word SCt from the sub encoding table denoted by state information S of "0". In addition, the basic encoder 110 reads out an output code word OC2t assigned to the current input code word SCt from the sub encoding table denoted by state information S of "3".

The code-word selection detector 100 has a third detection circuit for detecting whether or not the state-indicating value (the next-table-designating value) Snext notified by the basic encoder 110 is "2", and a fourth detection circuit for detecting whether or not the current input code word SCt is in the range of "0" to "11" and "26" to "47". In the case where the state-indicating value Snext is "2" and the current input code word SCt is in the range of "0" to "11" and "26" to "47", the code-word selection detector 100 outputs a detection-result signal (a code-word selection signal) to the basic encoder 110 and the comparator 140 which represents that code-word selection is required. In this case, the basic encoder 110 generates two different addresses in response to the code-word selection signal, the current input code word SCt, and the state-indicating value Snext, and accesses two of the six sub encoding tables in response to the generated addresses. Specifically, the basic encoder 110 reads out an output code word OC1t assigned to the current input code word SCt from the sub encoding table denoted by state information S of "2". In addition, the basic encoder 110 reads out an output code word OC2t assigned to the current input code word SCt from the sub encoding table denoted by state information S of "4".

The code-word selection detector 100 has a fifth detection circuit for detecting whether or not the state-indicating value (the next-table-designating value) Snext notified by the basic encoder 110 is "3", and a sixth detection circuit for detecting whether or not the zero run length of the LSB side of the latest selected output code word is in the range of "2" to "6". The code-word selection detector 100 further has a seventh detection circuit for reading out, from the sub encoding table in the basic encoder 110 which is denoted by state information of "0", an output code word assigned to the current input code word SCt, and for deciding whether or not the result of the NRZI conversion of a succession of the latest selected output code word and the read-out output code word follows the run length limiting rules determined by the maximum-run-length setting signal. The run length limiting rules are of the type providing the run length range of 3T–11T when the maximum-run-length setting signal is "0". The run length limiting rules are of the type providing the run length range of 3T–12T when the maximum-run-length setting signal is "1". In the case where the state-indicating value Snext is "3" and the zero run length of the LSB side of the latest selected output code word is in the range of "2" to "6" and where the NRZI-conversion result follows the run length limiting rules, the code-word selection detector 100 outputs a detection-result signal (a code-word selection signal) to the basic encoder 110 and the comparator 140 which represents that code-word selection is required. In this case, the basic encoder 110 generates two different addresses in response to the code-word selection signal, the current input code word SCt, and the state-indicating value Snext, and accesses two of the six sub encoding tables in response to the generated addresses. Specifically, the basic encoder 110 reads out an output code word OC1t assigned to the current input code word SCt from the sub encoding table denoted by state information S of "3". In addition, the basic encoder 110 reads out an output code word OC2t assigned to the current input code word SCt from the sub encoding table denoted by state information S of "0".

The basic encoder 110 stores the output code word OC1t into the path memory 131 as a candidate output code word. The basic encoder 110 stores the output code word OC2t into the path memory 133 as a candidate output code word. Preferably, storing the output code word OC1T into the path memory 131 and storing the output code word OC2t into the path memory 133 are executed on a time sharing basis.

In cases other than the previously-mentioned cases, the codeword selection detector 100 outputs a detection-result signal (a code-word non-selection signal) to the basic encoder 110 and the comparator 140 which represents that code-word selection is not required. In these cases, the basic encoder 110 generates only one address in response to the code-word non-selection signal, the current input code word SCt, and the state-indicating value Snext, and accesses one of the six sub encoding tables in response to the generated address. Specifically, the basic encoder 110 reads out an output code word OCt assigned to the current input code word SCt from the sub encoding table denoted by state information S having a value equal to the state-indicating value Snext. The basic encoder 110 stores the output code word OCt into the path memory 131 as a candidate output code word OC1t. The basic encoder 110 stores the output code word OCt into the path memory 133 as a candidate output code word OC2t. In this way, the same output code OCt is written into the path memories 131 and 133. Preferably, storing the output code word OCt into the path memory 131 and storing the output code word OCt into the path memory 133 are executed on a time sharing basis. The basic encoder 110 updates the state-indicating value Snext, which will be notified to the code-word selection detector 100, to the value accompanying the output code word OCt.

The path memory 131 stores the latest and previous output code words OC1t-1, OC1t-2, ..., and OC1t-Tdsvc, where OC1t-1 denotes the latest output code word while OC1t-Tdsvc denotes the oldest output code word. Similarly, the path memory 133 stores the latest and previous output code words OC2t-1, OC2t-2, ..., and OC2t-Tdsvc, where OC2t-1 denotes the latest output code word while OC2t-Tdsvc denotes the oldest output code word.

The DSV circuit 130 has a calculator for computing a DSV value DSV1t-1 from all the output code words (including the latest output code word OC1t-1) in the path memory 131. The DSV circuit 130 has a memory loaded with a signal representative of the computed DSV value DSV1t-1. The DSV circuit 130 informs the comparator 140 of the DSV value DSV1t-1. Similarly, the DSV circuit 132 has a calculator for computing a DSV value DSV2t-1 from all the output code words (including the latest output code word OC2t-1) in the path memory 133. The DSV circuit 132 has a memory loaded with a signal representative of the computed DSV value DSV2t-1. The DSV circuit 132 informs the comparator 140 of the DSV value DSV2t-1.

The comparator 140 calculates the absolute DSV values |DSV1t-1| and |DSV2t-1|. The device 140 compares the absolute DSV values |DSV1t-1| and |DSV2t-1| to decide which of the absolute DSV values |DSV1t-1| and |DSV2t-1| is smaller. The calculator 140 responds to the output signal from the code-word selection detector 100. When the output signal from the code-word selection detector 100 is equal to a code-word selection signal, the comparator 140 notifies the result of the comparison to the controller 150. When the output signal from the code-word selection detector 100 is equal to a code-word non-selection signal, the comparator 140 does not notify the comparison result to the controller 150.

In the case where the comparison result notified by the comparator 140 indicates |DSV1t-1|<|DSV2t-1|, the controller 150 reads out the output code words OC1t-1, OC1t-2, ..., and OC1t-Tdsvc from the path memory 131, and replaces the contents of the output code words OC2t-1, OC2t-2, ..., and OC2t-Tdsvc in the path memory 133 with the contents of the read-out output code words OC1t-1, OC1t-2, ..., and OC1t-Tdsvc. Thus, in this case, the contents of the output code words OC2t-1, OC2t-2, ..., and OC2t-Tdsvc in the path memory 133 are updated to the contents of the output code words OC1t-1, OC1t-2, ..., and OC1t-Tdsvc in the path memory 131. In addition, the controller 150 reads out the DSV value DSV1t-1 from the memory within the DSV circuit 130, and updates the DSV value DSV2t-1 in the memory within the DSV circuit 132 to the read-out DSV value DSV1t-1. Thus, in this case, the DSV value DSV2t-1 in the memory within the DSV circuit 132 is set to the DSV value DSV1t-1 in the memory within the DSV circuit 130. Furthermore, the controller 150 informs the basic encoder 110 that the output code word OC1t-1 has been selected. The basic encoder 110 updates the state-indicating value Snext, which will be notified to the code-word selection detector 100, to the value accompanying the output code word OC1t-1.

In the case where the comparison result notified by the comparator 140 indicates |DSV1t-1|≧|DSV2t-1|, the controller 150 reads out the output code words OC2t-1, OC2t-2, ..., and OC2t-Tdsvc from the path memory 133, and replaces the contents of the output code words OC1t-1, OC1t-2, ..., and OC1t-Tdsvc in the path memory 131 with the contents of the read-out output code words OC2t-1, OC2t-2, ..., and OC2t-Tdsvc. Thus, in this case, the contents of the output code words OC1t-1, OC1t-2, ..., and OC1t-Tdsvc in the path memory 131 are updated to the contents of the output code words OC2t-1, OC2t-2, ..., and OC2t-Tdsv in the path memory 133. In addition, the controller 150 reads out the DSV value DSV2t-1 from the memory within the DSV circuit 132, and updates the DSV value DSV1t-1 in the memory within the DSV circuit 130 to the read-out DSV value DSV2t-1. Thus, in this case, the DSV value DSV1t-1 in the memory within the DSV circuit 130 is set to the DSV value DSV2t-1 in the memory within the DSV circuit 132. Furthermore, the controller 150 informs the basic encoder 110 that the output code word OC2t-1 has been selected. The basic encoder 110 updates the state-indicating value Snext, which will be notified to the code-word selection detector 100, to the value accompanying the output code word OC2t-1.

In the absence of the comparison result notified by the comparator 140, the controller 150 does not access the path memories 131 and 133 and the DSV circuits 130 and 132.

The above-mentioned sequence of steps is iterated until all the input code words are processed. After all the input code words have been processed, the controller 150 sequentially transmits all the output code words from the path memory 131 or the path memory 133 to the NRZI converter 14 as finally-selected output code words. Since the output code words transmitted to the NRZI converter 14 are generated by the previously-mentioned encoding procedure with the DSV control and the run length limiting function, the NRZI-conversion results thereof follow the desired run length limiting rules such that the run length is in the range of 3T–11T when the maximum-run-length setting signal is "0", and is in the range of 3T–12T when the maximum-run-length setting signal is "1".

In the case where the maximum-run-length setting signal is "1", the 8–15 modulator 13 processes the output digital signal (the source code signal) from the formatter 12 in such a way as to extend the effected run length limiting rules from the type providing the run length range of 3T–11T to the type providing the run length range of 3T–12T. According to the run length limiting rules providing the run length range of 3T–12T, a minimum run length is 3T and a maximum run length is 12T. In other points, operation of the 8–15 modulator 13 is similar to that occurring when the maximum-run-length setting signal is "0".

Thus, the 8–15 modulator 13 responds to the maximum-run-length setting signal. When the maximum-run-length setting signal is "1", the 8–15 modulator 13 implements such modulation as to effect the run length limiting rules providing the run length range of 3T–12T with respect to the NRZI conversion result. On the other hand, when the maximum-run-length setting signal is "0", the 8–15 modulator 13 implements such modulation as to effect the run length limiting rules providing the run length range of 3T–11T with respect to the NRZI conversion result. As previously mentioned, the run length limiting rules providing the run length range of 3T–12T correspond to the before-NRZI-conversion rules "RLL(2, 11)" while the run length limiting rules providing the run length range of 3T–11T correspond to the before-NRZI-conversion rules "RLL(2, 10)". Accordingly, the output digital signal from the 8–15 modulator 13 can be changed between the type corresponding to the run length limiting rules "RLL(2, 11)" and the type corresponding to the run length limiting rules "RLL(2, 10)" in response to the maximum-run-length setting signal. In other words, the auxiliary information corresponding to the maximum-run-length setting signal is superimposed on the output digital signal from the 8–15 modulator 13.

The 8–15 modulator 13 may be formed by a digital signal processor or a similar device including a combination of an input/output port, a processing section, a ROM, and a RAM. In this case, the 8–15 modulator 13 operates in accordance with a control program stored in the ROM. The encoding table 120 and the initial table are provided in the ROM while the path memories 131 and 133 are provided in the RAM.

Figure 9:
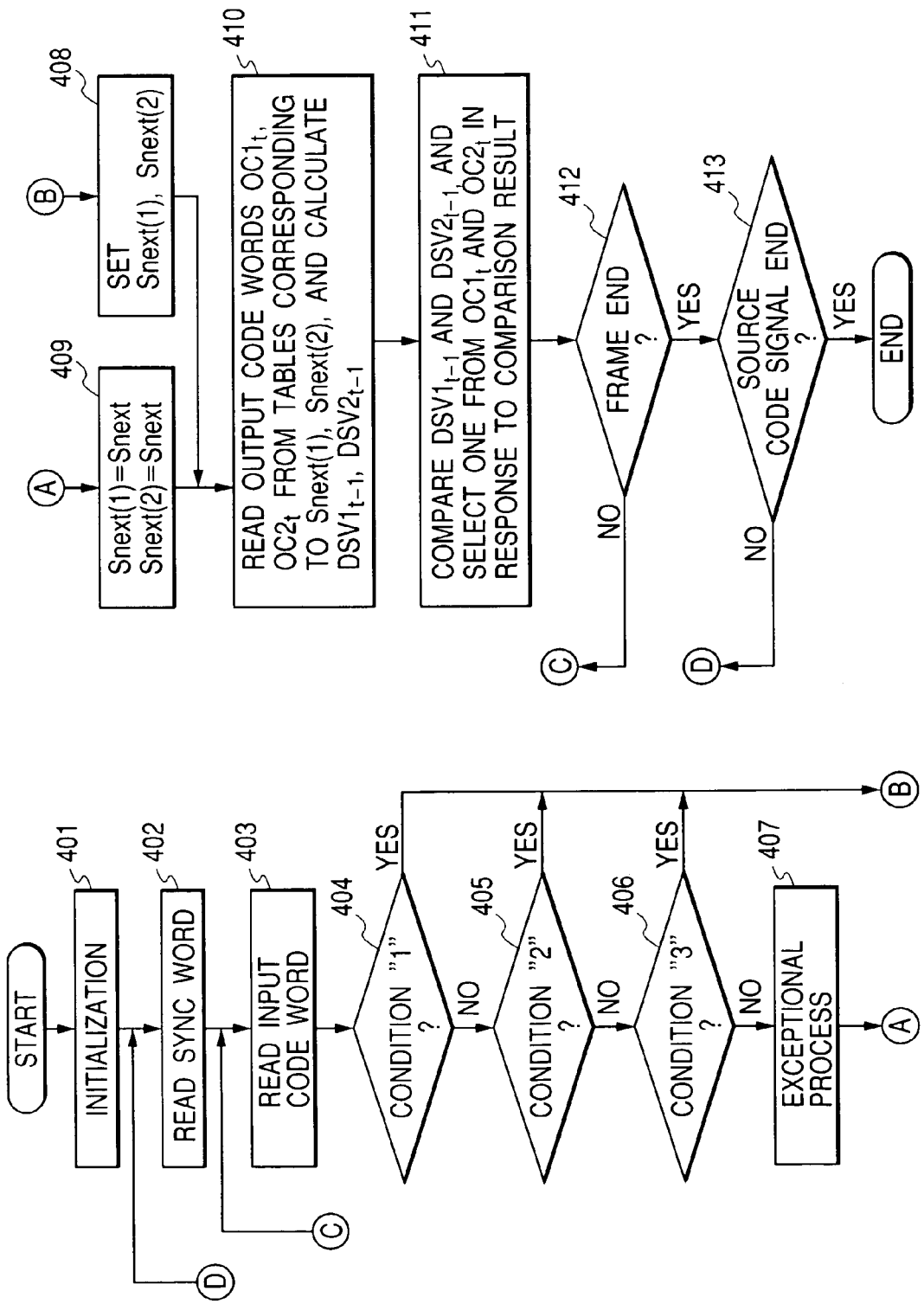
FIG. 9 is a flowchart of a segment of a control program for the 8–15 modulator in FIG. 1.

FIG. 9 is a flowchart of a segment of the control program for the 8–15 modulator 13. As shown in FIG. 9, a first step 401 of the program segment clears the path memories 131 and 133. In addition, the step 401 initializes the DSV values DSV1t-1 and DSV2t-1, and the state-indicating value (the next-table-designating value) Snext. After the step 401, the program advances to a step 402.

The step 402 receives an input code word SCt representative of the sync signal. In response to the reception of the input code word SCt representative of the sync signal, the step 402 selects the initial table. The step 402 reads out the initial value from the initial table, and updates the state-indicating value (the next-table-designating value) Snext to the read-out initial value. The step 402 reads out the sync bit pattern from the initial table, and stores the read-out sync bit pattern into the path memories 131 and 133. The step 402 updates the DSV values DSV1t-1 and DSV2t-1 in accordance with the sync bit pattern in the path memories 131 and 133. After the step 402, the program advances to a step 403.

The step 403 receives a next input code word SCt. A step 404 following the step 403 decides whether or not the received input code word SCt and the state-indicating value Snext satisfy a predetermined condition "1". The predetermined condition "1" is "(Snext=1)&&(SCt<39)", where "&&" denotes "and". Specifically, the predetermined condition "1" is that the state-indicating value Snext is "0" and the received input code word SCt is in the range of "0" to "38". When the predetermined condition "1" is satisfied, the program advances from the step 404 to a step 408. Otherwise, the program advances from the step 404 to a step 405.

The step 405 decides whether or not the received input code word SCt and the state-indicating value Snext satisfy a predetermined condition "2". The predetermined condition "2" is "(Snext=2)&&(SCt<12||((SCt>25)&&(SCt<48)))", where "||" denotes "or". Specifically, the predetermined condition "2" is that the state-indicating value Snext is "2" and the received input code word SCt is in the range of "0" to "11" and "26" to "47". When the predetermined condition "2" is satisfied, the program advances from the step 405 to the step 408. Otherwise, the program advances from the step 405 to a step 406.

The step 406 receives the maximum-run-length setting signal. The step 406 detects whether the maximum-run-length setting signal is "0" or "1". When the maximum-run-length setting signal is "0" which corresponds to the run length limiting rules providing the run length range of 3T–11T with respect to the NRZI conversion result, the step 406 selects a first given condition as a predetermined condition "3". The first given condition is "(ZR≧2)&&(Snext=3)&&(SCt<155)&&(NRZI conversion result satisfies run length limiting rules corresponding to k=10)", where "k" denotes one in "RLL(2, k)" and ZR denotes the zero run length of the LSB side of the latest selected output code word. Specifically, the first given condition is that the zero run length of the LSB side of the latest selected output code word is "2" or greater, the state-indicating value Snext is d"3", the received input code word SCt is smaller than "155", and the NRZI conversion result satisfies the run length limiting rules providing the run length range of 3T–11T. In this case, the NRZI conversion result is provided in, for example, the following way. Access is given to the sub encoding table denoted by state information of "0". The output code word assigned to the received input code word SCt is read out from the accessed sub encoding table. A succession of the latest selected output code word and the read-out output code word is subjected to NRZI conversion. On the other hand, when the maximum-run-length setting signal is "1" which corresponds to the run length limiting rules providing the run length range of 3T–12T with respect to the NRZI conversion result, the step 406 selects a second given condition as a predetermined condition "3". The second given condition is "(ZR≧2)&&(Snext=3)&&(SCt<155)&&(NRZI conversion result satisfies run length limiting rules providing the run length range of 3T–12T). Specifically, the second given condition is that the zero run length of the LSB side of the latest selected output code word is "2" or greater, the state-indicating value Snext is "3", the received input code word SCt is smaller than "155", and the NRZI conversion result satisfies the run length limiting rules providing the run length range of 3T–12T. In this case, the NRZI conversion result is provided in, for example, the following way. Access is given to the sub encoding table denoted by state information of "0". The output code word assigned to the received input code word SCt is read out from the accessed sub encoding table. A succession of the latest selected output code word and the read-out output code word is subjected to NRZI conversion. The step 406 decides whether or not the received input code word SCt and the other factors satisfy the predetermined condition "3". When the predetermined condition "3" is satisfied, the program advances from the step 406 to the step 408. Otherwise, the program advances from the step 406 to a step 407.

The step 407 decides whether or not each of exceptional conditions "1" and "2" is satisfied. The exceptional condition "1" is "(ZR>6)&&(Snext=3)&&(SCt=255)". Specifically, the exceptional condition "1" is that the zero run length of the LSB side of the latest selected output code word is greater than "6", and the state-indicating value Snext is "3" and the received input code word SCt is "255". The exceptional condition "2" is "(ZR=7 or 8)&&(Snext=4)&&(SCt=255)". Specifically, the exceptional condition "2" is that the zero run length of the LSB side of the latest selected output code word is "7" or "8", and the state-indicating value Snext is "4" and the received input code word SCt is "255". When the exceptional condition "1" is satisfied, the step 407 updates or changes the state-indicating value Snext to "2". When the exceptional condition "2" is satisfied, the step 407 updates or changes the state-indicating value Snext to "1". When neither the exceptional condition "1" nor the exceptional condition "2" is satisfied, the step 407 keeps the state-indicating value Snext unchanged.

A step 409 following the step 407 sets values Snext(1) and Snext(2) to the state-indicating value Snext. After the step 409, the program advances to a step 410.

The step 408 sets the value Snext(1) to the state-indicating value Snext. The step 408 sets the value Snext(2) to "3" in the case where the step 404 has decided that the predetermined condition "1" is satisfied. The step 408 sets the value Snext(2) to "4" in the case where the step 405 has decided that the predetermined condition "2" is satisfied. The step 408 sets the value Snext(2) to "0" in the case where the step 405 has decided that the predetermined condition "3" is satisfied. After the step 408, the program advances to the step 410.

The step 410 reads out an output code word OC1t assigned to the received input code word SCt from the sub encoding table denoted by state information S equal to the value Snext(1). In addition, the step 410 reads out an output code word OC2t assigned to the received input code word SCt from the sub encoding table denoted by state information S equal to the value Snext(2). The step 410 stores the output code word OC1t into the path memory 131 as a candidate output code word OC1t. The step 410 stores the output code word OC2t into the path memory 133 as a candidate output code word OC2t.

Furthermore, the step 410 calculates a DSV value DSV1t-1 from all the output code words (including the latest output code word OC1t-1) in the path memory 131. In addition, the step 410 calculates a DSV value DSV2t-1 from all the output code words (including the latest output code word OC2t-1) in the path memory 133.

A step 411 following the step 410 calculates the absolute DSV values |DSV1t-1| and |DSV2t-1|. The step 411 compares the absolute DSV values |DSV1t-1| and |DSV2t-1| to decide which of the absolute DSV values |DSV1t-1| and |DSV2t-1| is smaller. In the case where the absolute DSV value |DSV1t-1| is smaller than the absolute DSV value |DSV2t-1| (that is, |DSV1t-1|<|DSV2t-1|), the step 411 reads out the output code words OC1t-1, OC1t-2, . . . , and OC1t-Tdsvc from the path memory 131, and replaces the contents of the output code words OC2t-1, OC2t-2, . . . , and OC2t-Tdsvc in the path memory 133 with the contents of the read-out output code words OC1t-1, OC1t-2, . . . , and OC1t-Tdsvc. Thus, in this case, the contents of the output code words OC2t-1, OC2t-2, . . . , and OC2t-Tdsvc in the path memory 133 are updated to the contents of the output code words OC1t-1, OC1t-2, . . . , and OC1t-Tdsvc in the path memory 131. In addition, the step 411 updates the DSV value DSV2t-1 to the DSV value DSV1t-1. Thus, in this case, the DSV value DSV2t-1 is set to the DSV value DSV1t-1. Furthermore, the step 411 updates the state-indicating value Snext to the value accompanying the output code word OC1t-1.

In the case where the absolute DSV value |DSV1t-1| is equal to or greater than the absolute DSV value |DSV2t-1| (that is, |DSV1t-1|≧|DSV2t-1|), the step 411 reads out the output code words OC2t-1, OC2t-2, . . . , and OC2t-Tdsvc from the path memory 133, and replaces the contents of the output code words OC1t-1, OC1t-2, . . . , and OC1t-Tdsvc in the path memory 131 with the contents of the read-out output code words OC2t-1, OC2t-2, . . . , and OC2t-Tdsvc. Thus, in this case, the contents of the output code words OC1t-1, OC1t-2, . . . , and OC1t-Tdsvc in the path memory 131 are updated to the contents of the output code words OC2t-1, OC2t-2, . . . , and OC2t-Tdsv in the path memory 133. In addition, the step 411 updates the DSV value DSV1t-1 to the DSV value DSV2t-1. Thus, in this case, the DSV value DSV1t-1 is set to the DSV value DSV2t-1.

Furthermore, the step 411 updates the state-indicating value Snext to the value accompanying the output code word OC2t-1.

A step 412 subsequent to the step 411 decides whether or not the received input code word SCt corresponds to an end of a frame. When the received input code word SCt corresponds to an end of a frame, the program advances from the step 412 to a step 413. Otherwise, the program returns from the step 412 to the step 403.

The step 413 decides whether or not the received input code word SCt corresponds to an end of the source code signal. When the received input code word SCt corresponds to an end of the source code signal, the program exits from the step 413 and then the current execution cycle of the program segment ends. Otherwise, the program returns from the step 413 to the step 402.

A signal-outputting segment of the control program is started after all the input code words have been processed by the program segment in FIG. 9. According to the signal-outputting segment of the control program, all the output code words are transmitted from the path memory 131 or the path memory 133 to the NRZI converter 14 as finally-selected output code words.

FIGS. 10, 11, 12, 13, and 14 show a second example of the contents of the sub encoding tables denoted by state information S of "0", "1", "3", "4", and "5" respectively. It should be noted that the sub encoding table denoted by state information S of "2" is omitted from FIGS. 10–14. The sub encoding tables in FIGS. 10–14 may be used instead of those in FIGS. 4–8.

The sub encoding tables in FIGS. 10–14 are modified from those in FIGS. 4–8 in the following points. There are output code words in the sub encoding table denoted by state information S of "2" which are duplicate with respect to those in the sub encoding table denoted by state information S of "0". These duplicate output code words are those assigned to input code words of "0" to "156". These duplicate output code words are deleted from the sub encoding table denoted by state information S of "2". There are output code words in the sub encoding table denoted by state information S of "2" which are duplicate with respect to those in the sub encoding table denoted by state information S of "4". These duplicate output code words are those assigned to input code words of "157" to "255". These duplicate output code words are deleted from the sub encoding table denoted by state information S of "2". There are output code words in the sub encoding table denoted by state information S of "3" which are duplicate with respect to those in the sub encoding table denoted by state information S of "0". These duplicate output code words are those assigned to input code words of "166" to "255". These duplicate output code words are deleted from the sub encoding table denoted by state information S of "3".

In the case where the sub encoding tables of FIGS. 10–14 are used, the following steps are executed. When the current input code word SCt is in the range of "0" to "156" and the state-indicating value (the next-table-designating value) Snext accompanying the current input code word SCt is "2", the state-indicating value Snext is changed to "0" so that the sub encoding table denoted by state information S of "0" will be used next. When the current input code word SCt is in the range of "157" to "255" and the state-indicating value (the next-table-designating value) Snext accompanying the current input code word SCt is "2", the state-indicating value Snext is changed to "4" so that the sub encoding table denoted by state information S of "4" will be used next. When the current input code word SCt is in the range of "166" to "255" and the state-indicating value (the next-table-designating value) Snext accompanying the current input code word SCt is "3", the state-indicating value Snext is changed to "0" so that the sub encoding table denoted by state information S of "0" will be used next. When the zero run length of the LSB side of the latest selected output code word is greater than "6" and the state-indicating value Snext is "3" and the received input code word SCt is "255", the state-indicating value Snext is changed to "4" so that the sub encoding table denoted by state information S of "4" will be used next. These steps are executed by the basic encoder 110.

Second Embodiment

FIG. 15 shows an apparatus 70 for reproducing information from a recording medium 72. The reproducing apparatus 70 includes a demodulator according to a second embodiment of this invention. The recording medium 72 stores digital information which has been recorded by, for example, the recording apparatus 1 of FIG. 1. The recording medium 72 includes, for example, an optical disc.

With reference to FIG. 15, the reproducing apparatus 70 contains a reproducing head (not shown), a reproduced-signal processor 74, and a demodulator 76 which are sequentially connected in that order. The reproducing head uses, for example, an optical head. The reproducing head reproduces a signal representative of the digital information from the recording medium 72. The reproducing head feeds the reproduced signal to the reproduced-signal processor 74. The reproduced-signal processor 74 converts the reproduced signal into a binary signal (a digital signal) having a bit stream divided into segments representative of input code words. The reproduced-signal processor 74 outputs the binary signal (the digital signal or the bit stream) to the demodulator 76. The demodulator 76 recovers main information and auxiliary information from the output digital signal of the reproduced-signal processor 74. The demodulator 76 outputs the recovered main information and also the recovered auxiliary information.

As shown in FIG. 16, the demodulator 76 includes an NRZI demodulator 30, a sync detector 31, a serial-to-parallel (S/P) converter 32, a word register 33, a state calculator 34, a code-word case detector 35, an address generator 36, a main-information decoder 37, and an auxiliary-information decoder 38. The NRZI demodulator 30 follows the reproduced-signal processor 74. The NRZI demodulator 30 is connected with the sync detector 31, the S/P converter 32, and the auxiliary-information decoder 38. The sync detector 31 is connected with the S/P converter 32. The S/P converter 32 is connected with the word register 33 and the state calculator 34. The word register 33 is connected with the code-word case detector 35 and the address generator 36. The state calculator 34 is connected with the code-word case detector 35 and the address generator 36. The address generator 36 is connected with the main-information decoder 37.

The NRZI demodulator 30 receives the output digital signal of the reproduced-signal processor 74. The NRZI demodulator 30 subjects the output digital signal of the reproduced-signal processor 74 to NRZI demodulation (NRZI conversion). The NRZI demodulator 30 outputs the NRZI-demodulation-resultant signal (the NRZI-demodulation-resultant bit stream) to the sync detector 31, the S/P converter 32, and the auxiliary-information decoder 38.

The sync detector 31 detects every code word in the NRZI-demodulation-resultant signal which represents a sync bit pattern (a sync signal). The sync detector 31 generates a word clock signal in response to the detected sync-representing code words. The sync detector 31 feeds the generated word clock signal to the S/P converter 32. The S/P converter 32 subjects the NRZI-demodulation-resultant bit stream to serial-to-parallel conversion in response to the word clock signal, thereby periodically generating a 15-bit parallel-form signal segment handled as an input code word Ck. Thus, the S/P converter 32 changes the NRZI-demodulation-resultant bit stream into a sequence of input code words. The S/P converter 32 outputs the input code word Ck to the word register 33 and the state calculator 34. The input code word Ck is written into the word register 33. The input code word Ck is temporarily stored in the word register 33 before being outputted therefrom as a delayed input code word Ck-1. Specifically, the word register 33 delays the input code word by a time interval corresponding to one word. The delayed input code word Ck-1 is fed from the word register 33 to the code-word case detector 35 and the address generator 36.

The code-word case detector 35 detects a code-word-related case CS in response to the delayed input code word Ck-1. The code-word case detector 35 informs the state calculator 34 of the detected case CS. The state calculator 34 computes an encoding state Sk from the input code word Ck and the detected state CS. The computed encoding state Sk corresponds to the sub encoding table used in generating the input code word Ck. In other words, the computed encoding state Sk is equal to the state-indicating value Snext assigned to the delayed input code word Ck-1 and used in an encoder side. Thus, the state-indicating value Snext assigned to the delayed input code word Ck-1 is recovered. The state calculator 34 informs the address generator 36 of the encoding state Sk (the state-indicating value Snext assigned to the delayed input code word Ck-1). The address generator 36 produces an address signal in response to the delayed input code word Ck-1 and the encoding state Sk. The address generator 36 outputs the produced address signal to the main-information decoder 37. The main-information decoder 37 contains a decoding table having an array of 8-bit output code words at different addresses. The decoding table is accessed in response to the address signal. One output code word Dk-1 at an address corresponding to the address signal is selected from the output code words in the decoding table. The main-information decoder 37 feeds the selected output code word Dk-1 to an external as the main information.

Specifically, the decoding table includes an array of cells each having a set of an input code word Ck-1, an output code word Dk-1, and an encoding state Sk (a state-indicating value Snext assigned to the input code word Ck-1). Thus, an output code word Dk-1 can be decided in response to a set of an input code word Ck-1 and an encoding state Sk by referring to the decoding table.

Input code words can be grouped into five cases "0", "1", "2", "3", and "4" according to LSB-side zero run length. Specifically, input code words each having an LSB-side zero run length of "0" are assigned to the case "0". Input code words each having an LSB-side zero run length of "1" are assigned to the case "1". Input code words having LSB-side zero run lengths of "2" to "6" are assigned to the case "2". Input code words each having an LSB-side zero run length of "7" or "8" are assigned to the case "3". Input code words each having an LSB-side zero run length of "9" or "10" are assigned to the case "4". Each of the input code words in the case "0" is always followed by an input code word which results from an encoding procedure using the sub encoding table denoted by state information S of "0" or "1". Each of the input code words in the case "1" is always followed by an input code word which results from an encoding procedure using the sub encoding table denoted by state information S of "1", "2", or "3". Each of the input code words in the case "2" is always followed by an input code word which results from an encoding procedure using the sub encoding table denoted by state information S of "1", "3", "4", or "5". Each of the input code words in the case "3" is always followed by an input code word which results from an encoding procedure using the sub encoding table denoted by state information S of "3", "4", or "5". Each of the input code words in the case "4" is always followed by an input code word which results from an encoding procedure using the sub encoding table denoted by state information S of "4" or "5".

The code-word case detector 35 contains a table representative of the previously-mentioned assignment of the input code words to the cases "0", "1", "2", "3", and "4"which depends on LSB-side zero run length. The code-word case detector 35 detects the LSB-side zero run length of the delayed input code word Ck-1. The code-word case detector 35 accesses the assignment table in response to the detected zero run length, and thereby detects the case CS to which the delayed input code word Ck-1 is assigned. The code-word case detector 35 informs the state calculator 34 of the detected case CS. The state calculator 34 computes an encoding state Sk from the input code word Ck and the detected case CS according to a predetermined algorithm. The computed encoding state Sk corresponds to the sub encoding table used in generating the input code word Ck. In other words, the computed encoding state Sk is equal to the state-indicating value Snext assigned to the delayed input code word Ck-1. The state calculator 34 notifies the encoding state Sk (the state-indicating value Snext assigned to the delayed input code word Ck-1) to the address generator 36. The address generator 36 produces an address signal in response to the delayed input code word Ck-1 and the encoding state Sk. The address generator 36 outputs the produced address signal to the main-information decoder 37. The main-information decoder 37 accesses the decoding table in response to the address signal. An output code word Dk-1 corresponding to the address signal, that is, an output code word Dk-1 corresponding to a set of the delayed input code word Ck-1 and the encoding state Sk, is read out from the decoding table. The main-information decoder 37 feeds the read-out output code word Dk-1 to an external as the main information.

For example, in the case where the input code word Ck-1 of interest is "000000000100000" and the immediately-following input code word Ck is "010010001000100", the case CS to which the input code word Ck-1 is assigned is found to be the case "2" by referring to the previously-mentioned assignment table. The encoding state Sk, that is, the state-indicating value Snext assigned to the input code word Ck-1, is found to be "4" (the sub encoding table denoted by state information S of "4") according to the predetermined algorithm using the input code word Ck and the case "2". The input code word Ck-1 of interest is decoded into an output code word Dk-1 of "0" by referring to the decoding table.

In the case where the input code word Ck-1 of interest is "010010001000100" and the immediately-following input code word Ck is "100001000001000", the case CS to which the input code word Ck-1 is assigned is found to be the case "2" by referring to the previously-mentioned assignment table. The encoding state Sk, that is, the state-indicating value Snext assigned to the input code word Ck-1, is found to be "5" (the sub encoding table denoted by state information S of "5") according to the predetermined algorithm using the input code word Ck and the case "2". The input code word Ck-1 of interest is decoded into an output code word Dk-1 of "1" by referring to the decoding table.

In the case where the input code word Ck-1 of interest is "100001000001000" and the immediately-following input code word Ck is "000010000000001", the case CS to which the input code word Ck-1 is assigned is found to be the case "2" by referring to the previously-mentioned assignment table. The encoding state Sk, that is, the state-indicating value Snext assigned to the input code word Ck-1, is found to be "1" (the sub encoding table denoted by state information S of "1") according to the predetermined algorithm using the input code word Ck and the case "2". The input code word Ck-1 of interest is decoded into an output code word Dk-1 of "2" by referring to the decoding table.

An example of the predetermined algorithm used by the state calculator 34 is as follows.

Algorithm in C-Language-Based Version if     ((Ck==8208)||(Ck==8224)||(Ck==8225)||(Ck==8256)) flag=1;

if     ((Ck==8712)||(Ck==8720)||(Ck==8738)||(Ck==8777)) flag=2;

if (Case==0)[/* when Ck-1 LSB-side zero run=0 */ if ((Ck<=1024)||((Ck>=4168)&&(Ck!=4224))) Sk=0;

if ((1025<=Ck)&&(Ck<=4164)||(Ck==4224)) Sk=1;]

else if (Case==1)[/* when Ck-1 LSB-side zero run=1 */ if ((1025<=Ck)&&(Ck<=4164)||(Ck==4224)) Sk=1;

if     ((Ck<=585)||(Ck>=8712)&&(flag!=2)||(Ck==8704)|| (flag==1)) Sk=2;

if     ((Ck==1024)||((4168<=Ck)&&(Ck<=8708)&& (Ck!=4224)&&(Ck!=8704))&&(flag!=1)||(flag==2)) Sk=3;]

else if (Case==2)[/* when Ck-1 LSB-side zero run=2~6 */ if ((1025<=Ck)&&(Ck<=4164)||(Ck==4224)) Sk=1;

if     ((Ck<=1024)||((4168<=Ck)&&(Ck<=8708)&& (Ck!=4224)&&(Ck!=8704))||(flag==2)) Sk=3;

if     ((Ck==8704)||(8712<=Ck)&&(Ck<=16900)&& (Ck!=16896)&& (flag!=2))||(flag==1)) Sk=4;

if ((Ck==16896)||(Ck>=16904)) Sk=5;]

else if (Case==3)[/* when Ck-1 LSB-side zero run=7 or 8 */ if ((Ck<=1024)||((Ck==9216)||((4168<=Ck)&&(Ck<=8708) &&(Ck!=4224)&&(Ck!=8704))||(flag==2)) Sk=3;

if ((Ck==16896)||(Ck>=16904)) Sk=5;

if     ((Ck==8704)||((8712<=Ck)&&(Ck<=16900)&& (Ck!=9216)&&     (Ck!=16896)&&(flag!=2))||(flag==1)|| (Ck==4224)) Sk=4;]

else if (Case==4)[/* when Ck-1 LSB-side zero run=9 or 10 */ if     ((Ck==8704)||((8712<=Ck)&&(Ck<=16900)&& (Ck!=16896)&& (flag!=2))||(flag==1)) Sk=4;

if ((Ck==16896)||(Ck>=16904)) Sk=5;] return Sk;

In the above algorithm: "Case" denotes the case CS; "==" denotes "equal to"; "<=" denotes "smaller than or equal to"; ">=" denotes "greater than or equal to"; and "!=" denotes "not equal to".

The demodulator 76 may be at least partially formed by a digital signal processor or a similar device including a combination of an input/output port, a processing section, a ROM, and a RAM. In this case, the related portion of the demodulator 76 operates in accordance with a control program stored in the ROM. The control program contains the predetermined algorithm for calculating the encoding state Sk. The decoding table and the assignment table are provided in the ROM.

Figure 17:
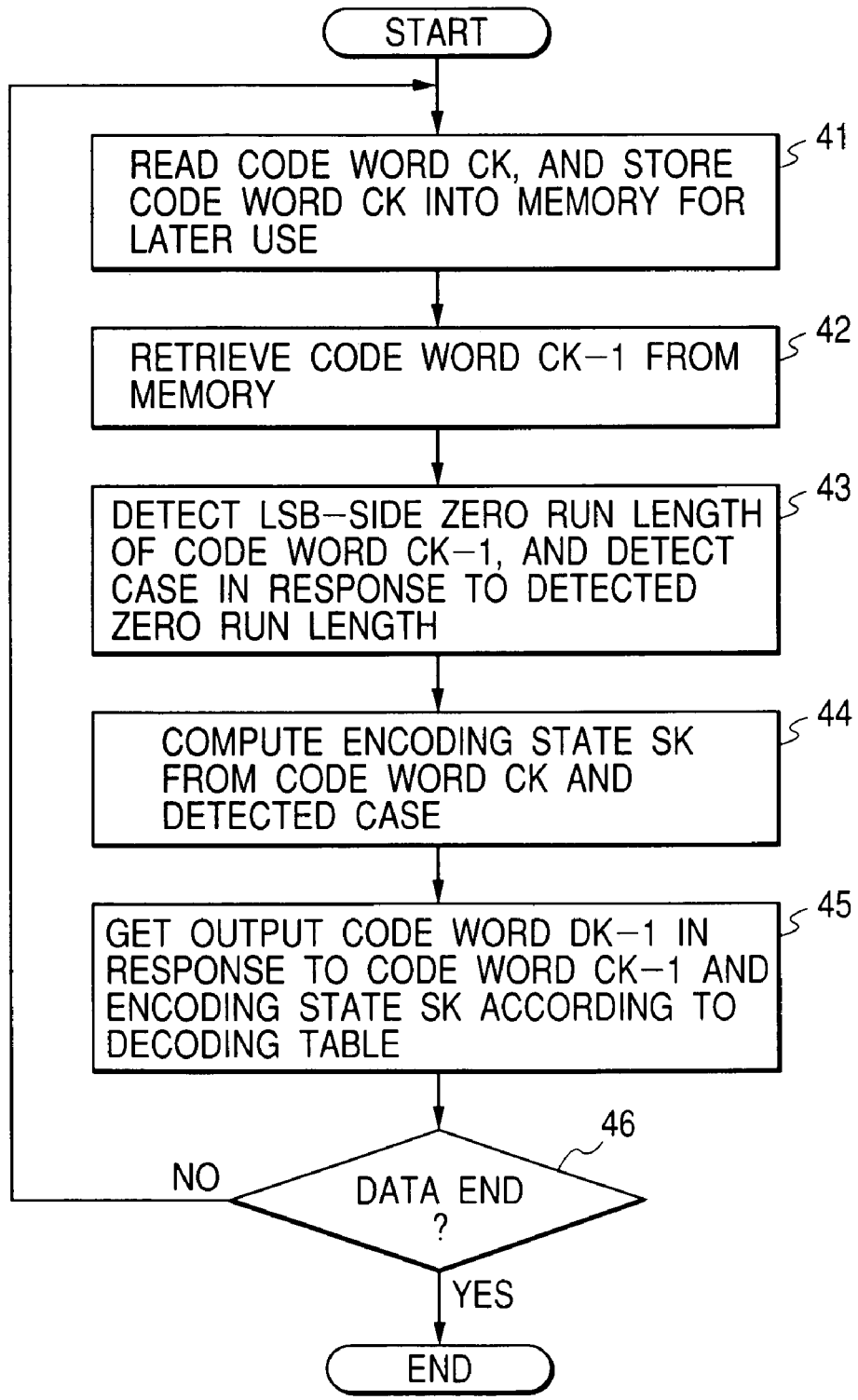
FIG. 17 is a flowchart of a segment of a control program for the demodulator in FIG. 15.

FIG. 17 is a flowchart of a segment of the control program for the demodulator 76. The program segment in FIG. 17 is designed to process the output signal from the S/P converter 32. As shown in FIG. 17, a first step 41 of the program segment receives a current input code word Ck which is a current 15-bit segment of the output signal from the S/P converter 32. The step 41 stores the current input code word Ck into the RAM for later use as an input code word Ck-1 of interest (an input code word Ck-1 immediately following the current input code word Ck).

A step 42 following the step 41 retrieves an input code word Ck-1 of interest (an input code word Ck-1 immediately following the current input code word Ck) from the RAM.

A step 43 subsequent to the step 42 detects the LSB-side zero run length of the input code word Ck-1 of interest. The step 43 accesses the assignment table in response to the detected zero run length, and thereby detects the case CS to which the input code word Ck-1 of interest is assigned.

A step 44 following the step 43 computes an encoding state Sk from the current input code word Ck (the input code word immediately following the input code word Ck-1 of interest) and the detected case CS according to the predetermined algorithm. The computed encoding state Sk is equal to the state-indicating value Snext assigned to the input code word Ck-1 of interest.

A step 45 subsequent to the step 44 generates an address signal in response to the input code word Ck-1 of interest and the encoding state Sk (the state-indicating value Snext assigned to the input code word Ck-1 of interest). The step 45 accesses the decoding table in response to the address signal to get an output code word Dk-1 assigned to the input code word Ck-1 of interest.

A step 46 following the step 45 decides whether or not the current input code word Ck corresponds to an end of the effective output signal from the S/P converter 32. When the current input code word Ck corresponds to an end, the program exits from the step 46 and then the current execution cycle of the program segment ends. Otherwise, the program returns from the step 46 to the step 41.

FIG. 18 shows an example of a portion of the contents of the decoding table. The decoding table in FIG. 18 has an array of cells containing output code words Dk-1 assigned to input code words Ck-1. In FIG. 18, the output code words Dk-1 and the input code words Ck-1 are expressed by the decimal notation. The cells are separated into six groups corresponding to encoding states Sk of "0", "1", "2", "3", "4", and "5" respectively (that is, corresponding to Ck-1-related state-indicating values Snext of "0", "1", "2", "3", "4", and "5" respectively).

With reference back to FIG. 16, the auxiliary-information decoder 38 receives the bit stream from the NRZI demodulator 30. In addition, the auxiliary-information decoder 38 receives sector information from a suitable device (not shown). The sector information indicates the boundaries between recording blocks with respect to the signal reproduced from the recording medium 72. The sector information can be generated by a sync detector for sensing a specified bit pattern in the bit stream outputted from the NRZI demodulator 30. The sector information can also be generated by a signal processor following the main-information decoder 37.

Figure 19:
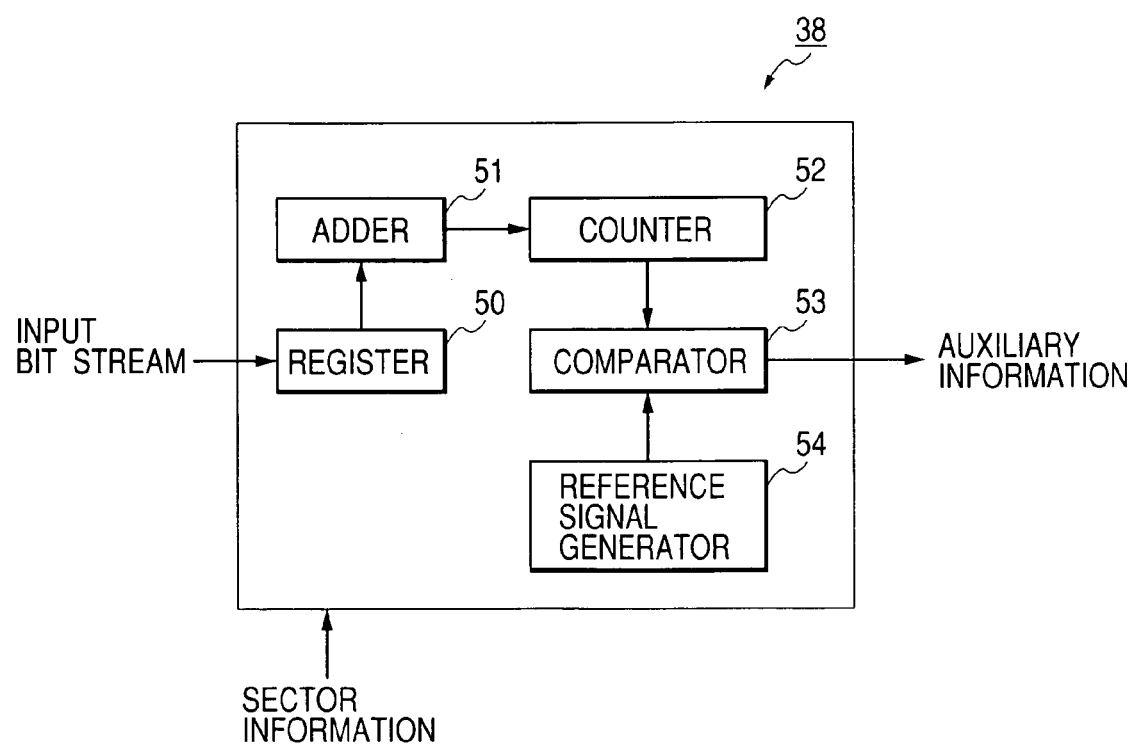
FIG. 19 is a block diagram of an auxiliary-information decoder in FIG. 16.

As shown in FIG. 19, the auxiliary-information decoder 38 includes a register 50, an adder 51, a counter 52, a comparator 53, and a reference signal generator 54. The register 50 is connected with the NRZI demodulator 30. In addition, the register 50 is connected with the adder 51. The adder 51 is connected with the counter 52. The counter 52 is connected with the comparator 53. The comparator 53 is connected with the reference signal generator 54.

The register 50 is of a shift type. The bit stream from the NRZI demodulator 30 is propagated through the register 50. The adder 51 accesses 1-bit-corresponding storage segments in the register 50, thereby detecting every succession of 11 bits of "0" in the bit stream from the NRZI demodulator 30. The adder 51 outputs a signal representative of the detection result to the counter 52. The device 52 counts successions each of 11 bits of "0" in response to the output signal from the adder 51 during every 1-sector-corresponding time interval determined by the sector information. In other words, the counter 52 detects the frequency of the occurrence of a succession of 11 bits of "0". The counter 52 outputs a signal representative of the count-result number to the comparator 53. The reference signal generator 54 outputs a signal representative of a predetermined reference number to the comparator 53. The device 53 compares the count-result number with the reference number. When the count-result number is greater than the reference number, the comparator 53 outputs a signal of "1" as a recovered maximum-run-length setting signal (recovered auxiliary information). Otherwise, the comparator 53 outputs a signal of "0" as a recovered maximum-run-length setting signal (recovered auxiliary information). The counter 52 is periodically reset in response to the sector information.

Third Embodiment

An auxiliary-information application system of a third embodiment of this invention includes the recording apparatus 1 of FIG. 1 and the reproducing apparatus 70 of FIG. 15.

In the case where a digital information signal can be recorded on the recording medium 2 (see FIG. 1) at a data rate of 50 Mbps and every recording sector of the digital information signal has 2048 bytes, the auxiliary information can be recorded on the recording medium 2 at a data rate of about 3 kbps. For example, the auxiliary information includes picture encoding information which conforms with the H. 261 standards, the H. 263 standards, or the MPEG4 standards. Alternatively, the auxiliary information may include audio encoding information which conforms with the H. 723 standards or the AAC standards. The auxiliary information may include information which results from run length encoding or quantization of auxiliary-picture character information represented by bit map data in, for example, DVDs. The auxiliary information may include closed caption information such as character code information used in digital broadcasting, for example, ATSC.

The auxiliary information may include information representative of an URL address related to contents information. The auxiliary information may include address information representative of the name of a source in which each of prescribed portions of contents information is written. In these cases, information provided by accessing an Internet address or a file name can be indicated when contents information is displayed. Preferably, the address information is of a prescribed format structure in which about 8 bits indicating the number of used characters are followed by the characters representing an address such as an URL-name-indicating address.

Figure 20:
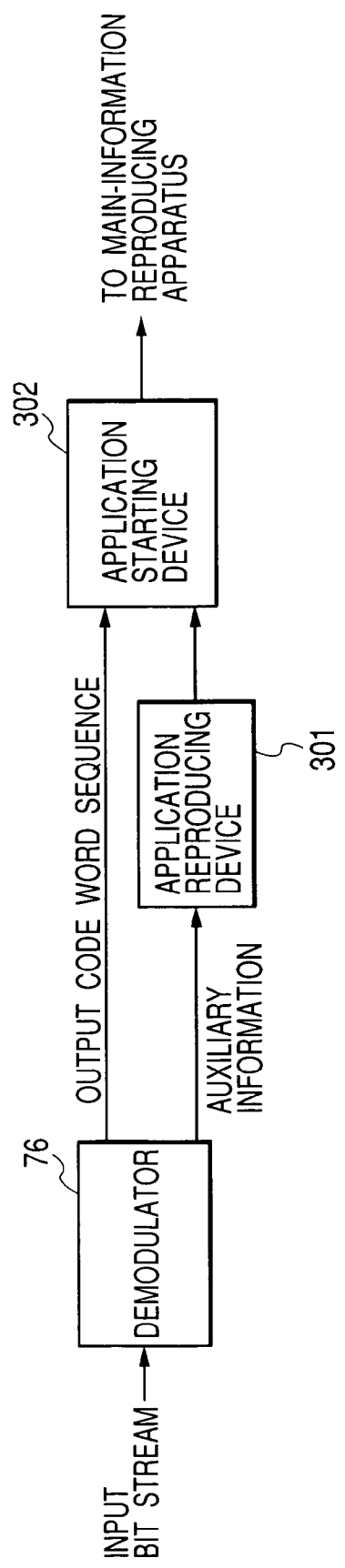
FIG. 20 is a block diagram of an auxiliary-information application system according to a third embodiment of this invention.

As shown in FIG. 20, the auxiliary-information application system includes the demodulator 76, an application reproducing device 301, and an application starting device 302. The demodulator 76 recovers main information and auxiliary information from a bit stream or a sequence of code words outputted by the reproduced-signal processor 74 (see FIG. 15). The demodulator 76 outputs the recovered main information to the application starting device 302. The demodulator 76 outputs the recovered auxiliary information to the application reproducing device 301. The application reproducing device 301 reproduces application-related information from the auxiliary information. The application reproducing device 301 outputs the reproduced application-related information to the application starting device 302. In response to the application-related information, the application starting device 302 starts an application procedure of processing the main information. The application starting device 302 outputs application-procedure-resultant information to an external such as a main-information player or a main-information reproducing apparatus.

Examples of the application procedure are as follows.

(1) The main information contains encryption-resultant information. A key is generated from the auxiliary information. The encryption-resultant information is decrypted in response to the generated key.

(2) The auxiliary information is superimposed on or mixed with the main information. Alternatively, specified data in the main information are changed in response to the auxiliary information.

(3) The auxiliary information is used in deciding conditions related to the recording or the reproduction of the main information.

(4) The auxiliary information contains ID (identification) information representing a management number of the main information or a copyright thereon. The main information is protected and managed by referring to the ID information.

It should be noted that the auxiliary information may be independent of the main information. The auxiliary information can be detected before the contents of the main information are recovered.

Fourth Embodiment

Figure 21:
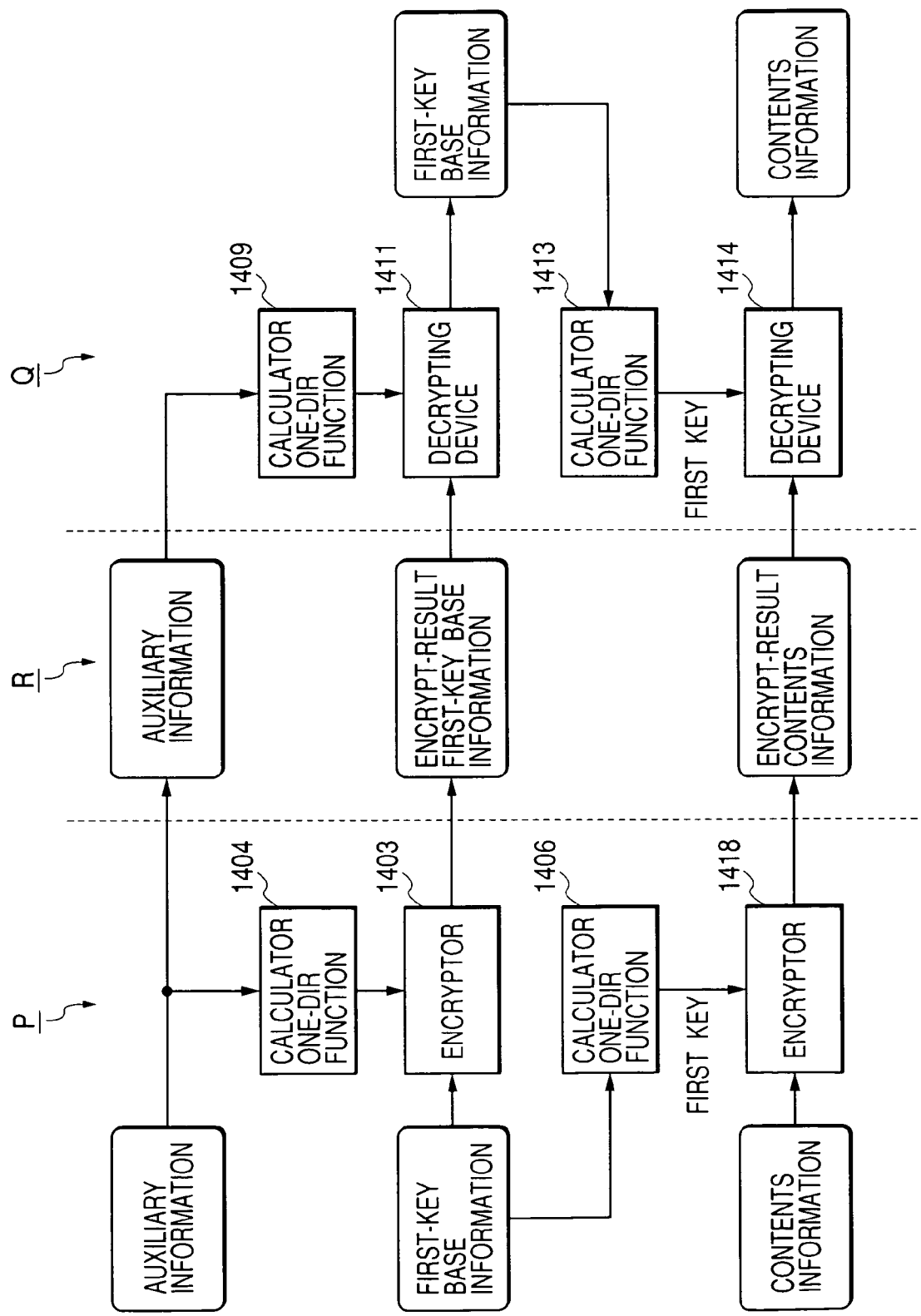
FIG. 21 is a block diagram of an information processing system according to a fourth embodiment of this invention.

FIG. 21 shows an information processing system according to a fourth embodiment of this invention. The information processing system of FIG. 21 is based on the recording apparatus 1 of FIG. 1, the reproducing apparatus 70 of FIG. 15, and the auxiliary-information application system of FIG. 20. The information processing system of FIG. 21 handles contents information (main information) and auxiliary information.

With reference to FIG. 21, the information processing system includes a primary section P, a secondary section Q, and an intermediate section R. The primary section P and the secondary section Q are connected to each other via the intermediate section R.

The primary section P includes an information recording apparatus or an information transmitting apparatus. The secondary section Q includes an information reproducing apparatus or an information receiving apparatus. An example of the information reproducing apparatus is an information player. The intermediate section R includes a recording medium or a transmission medium. Examples of the recording medium are a magnetic recording medium, an optical recording medium, and a semiconductor memory. Examples of the transmission medium are an optical fiber cable, electric wires, and a radio transmission line. The transmission medium is also referred to as a transmission line.

In the primary section P, auxiliary information being a base of a second key is fed from a suitable device (not shown). The primary section P outputs the auxiliary information to the intermediate section R. Specifically, the primary section P records the auxiliary information on the recording medium of the intermediate section R, or transmits the auxiliary information to the transmission line of the intermediate section R.

The primary section P includes a calculator 1404 which receives the auxiliary information being the base of the second key. The calculator 1404 generates a signal (data) representative of the second key from the auxiliary information according to a predetermined one-directional function. The calculator 1404 outputs the second-key signal (the second-key data) to an encryptor 1403.

The one-directional function is a one-directional hash function. The one-directional function means a function "h" designed to meet conditions as follows. When a certain value "x" is given in a domain of definition, it is difficult to calculate a value "y" which satisfies the relation as "h(x)=h(y)".

The encryptor 1403 receives information being a base of a first key different from the second key. The first-key base information is fed from a suitable device (not shown). The device 1403 encrypts the first-key base information into encryption-resultant first-key base information in response to the second-key signal. The encryptor 1403 outputs the encryption-resultant first-key base information to the intermediate section R.

Specifically, the primary section P records the encryption-resultant first-key base information on the recording medium of the intermediate section R, or transmits the encryption-resultant first-key base information to the transmission line of the intermediate section R.

The encryptor 1403 may encrypt a part of the first-key base information in response to the second-key signal. For example, the device 1403 encrypts only an important portion of the first-key base information. Alternatively, the device 1403 may encrypt the whole of the first-key base information.

The primary section P includes a calculator 1406 which receives the first-key base information. The calculator 1406 generates a signal (data) representative of the first key from the first-key base information according to a predetermined one-directional function. Preferably, the one-directional function used by the calculator 1406 differs from that used by the calculator 1404. The one-directional function used by the calculator 1406 may be the same as that used by the calculator 1404. The calculator 1406 outputs the first-key signal (the first-key data) to an encryptor 1418.

The encryptor 1418 receives contents information, that is, main information, from a suitable device (not shown). The device 1418 encrypts the received contents information into encryption-resultant contents information in response to the first-key signal. The encryptor 1418 outputs the encryption-resultant contents information to the intermediate section R.

Specifically, the primary section P records the encryption-resultant contents information on the recording medium of the intermediate section R, or transmits the encryption-resultant contents information to the transmission line of the intermediate section R.

The encryptor 1418 may additionally include a compressor. In this case, the compressor compresses the contents information, and then the encryptor 1418 encrypts the compression-resultant contents information. The compression of the contents information is executed in a predetermined compressing method such as an MPEG (Moving Picture Experts Group) compressing method. The encryption of the compression-resultant contents information is executed in an encrypting method such as DES (Data Encryption Standard).

According to DES, contents information is encrypted and decrypted 64 bits by 64 bits in response to a common key represented by a 56-bit signal.

It should be noted that compression-resultant contents information may be fed to the encryptor 1418 from an external device (not shown). In this case, the compressor is omitted from the encryptor 1418.

The encryption by the encryptor 1418 includes a step of dividing every 64-bit block of the contents information (or the compression-resultant contents information) into a pair of 32-bit sub blocks. The encryption includes additional steps for signal processing on a sub-block by sub-block basis. The additional steps contain a step of transposing data, a step of executing permutation of data, a step of processing data according to a nonlinear function, and a step of executing Exclusive-OR operation between data.

In the case of DES, an encrypting key is represented by data having 56 bits. Accordingly, specified 56-bit information peculiar to the primary section P (or the system) is set as first-key base information, that is, information being a base of a first key corresponding to a one-directional function having an output bit number of 56.

In the case where the contents of the one-directional function are open to the public and the first-key base information is required to be recorded on the recording medium of the intermediate section R or be outputted to the transmission line of the intermediate section R, it is preferable that the first-key base information is encrypted before being recorded on the recording medium or being outputted to the transmission line.

As previously mentioned, the auxiliary information is the second-key base information. Preferably, the second-key base information differs from the first-key base information. In this case, specified 56-bit information peculiar to the primary section P (or the system) which differs from the specified 56-bit information for the first key is set as the second-key base information. The calculator 1404 uses the auxiliary information (the second-key base information) in generating the second-key signal according to the predetermined one-directional function. Thus, the auxiliary information corresponds to a one-directional function having an output bit number of 56. In the case where the contents of the one-directional function are open to the public and the auxiliary information (the second-key base information) is required to be recorded on the recording medium of the intermediate section R or be outputted to the transmission line of the intermediate section R, it is preferable that the auxiliary information is concealed before being recorded on the recording medium or being outputted to the transmission line. The primary section P includes the modulator 1 (see FIG. 1) which superimposes the auxiliary information on the main information, that is, the contents information. It is difficult for a demodulation side to reproduce the auxiliary information without using the demodulator 76 (see FIG. 15).

As shown in FIG. 22, there is a calculator 1450 for generating the auxiliary information from a basic information piece or pieces. The basic information pieces include, for example, 1) an information piece about a region or regions corresponding to one or more countries, one or more zones, or one or more spaces, 2) an information piece about identification (ID) of an individual, 3) an information piece about identification of a group of persons, 4) an information piece about a rating, 5) an information piece about identification of an apparatus maker or a device maker, 6) an information piece about identification of a contents provider, 7) an information piece about time (a playback allowable term), 8) an information piece about contents authors, 9) an information piece about identification of a reproducing apparatus or a reproducing device (a player), 10) an information piece about identification of a connection apparatus or a connection device, 11) an information piece about identification of a medium on which contents information is recorded, 12) an information piece about identification of contents information, and 13) an information piece about accounting. The calculator 1450 executes Exclusive-OR operation among the information pieces 1) to 13), thereby generating the auxiliary information.

Preferably, the modulator 1 (see FIG. 1) in the primary section P receives the encryption-resultant contents information as main information. The modulator 1 (see FIG. 1) superimposes the auxiliary information on the main information before the main information is outputted to the intermediate section R.

The encryption-resultant contents information, the encryption-resultant first-key base information, and the auxiliary information (the second-key base information) are transmitted from the primary section P to the secondary section Q through the intermediate section R.

The secondary section Q includes the demodulator 76 (see FIG. 15) which separates the main information and the auxiliary information from each other. With reference back to FIG. 21, the secondary section Q includes a calculator 1409 which receives the the auxiliary information (the second-key base information) from the intermediate section R via the demodulator 76. The calculator 1409 generates a signal (data) representative of the second key from the second-key base information according to a predetermined one-directional function equal to that used by the calculator 1404 in the primary section P. The calculator 1409 outputs the second-key signal (the second-key data) to a decrypting device 1411.

The decrypting device 1411 receives the encryption-resultant first-key base information from the intermediate section R. The decrypting device 1411 decrypts the encryption-resultant first-key base information into the first-key base information in response to the second-key signal. The decrypting device 1411 outputs the first-key base information to a calculator 1413.

The calculator 1413 generates a signal (data) representative of the first key from the first-key base information according to a predetermined one-directional function equal to that used by the calculator 1406 in the primary section P. The calculator 1413 outputs the first-key signal (the first-key data) to a decrypting device 1414.

The decrypting device 1414 receives the encryption-resultant contents information from the intermediate section R via the demodulator 76 (see FIG. 15). The decrypting device 1414 decrypts the encryption-resultant contents information into the original contents information in response to the first-key signal. Thus, the decrypting device 1414 reproduces the original contents information. The decrypting device 1414 outputs the reproduced contents information.

It should be noted that the auxiliary information may be a simple set of the previously-mentioned information pieces 1) to 13). The auxiliary information may be recorded on a lead-in portion or another portion of a recording medium on a superimposition basis. The auxiliary information may be recorded on recording-medium sectors loaded with head portions of contents programs.

The region information piece, that is, the information piece 1), in the auxiliary information concerns a region or regions corresponding to one or more countries, one or more zones, or one or more spaces. Preferably, the region information piece represents designated one or ones of regions. Examples of regions are as follows. According to a first example, the word is divided into three regions using an NTSC television system, a PAL television system, and a SECAM television system respectively. According to a second example, the world is divided into six regions. According to a third example, the word is divided into regions corresponding to the respective countries. Each country-corresponding region may be divided into smaller regions corresponding to respective districts. In view of playback or reproduction of contents information within airplanes, spaces in the airplanes may be set as regions.

The individual ID information piece, that is, the information piece 2), in the auxiliary information represents, for example, a secret number known by only a related individual. According to a second example, the individual ID information piece represents an ID number preassigned to a related individual. According to a third example, the individual ID information piece represents a secret number or a registered number of a credit card. According to a fourth example, the individual ID information piece represents an information number generated on the basis of a physical character of a related individual. The physical character means a fingerprint, an iris pattern, or a DNA.

The group ID information piece, that is, the information piece 3), in the auxiliary information represents, for example, an ID number of a related family. According to a second example, the group ID information piece represents an ID number of a related party. According to a third example, the group ID information piece represents an ID number of a related club or a related team. According to a fourth example, the group ID information piece represents an ID number of a group of residents in a building such as a condominium or an apartment house.

The rating information piece, that is, the information piece 4), in the auxiliary information represents, for example, a number indicative of a level of violence scenes or sexual scenes. According to a second example, the rating information piece represents a number indicative of a level of a right to watch violence scenes or sexual scenes. According to a third example, the rating information piece represents a number calculated from the age of a person who will play back contents information.

Different ID code words are preassigned to apparatus makers (device makers), respectively. The apparatus maker ID information piece, that is, the information piece 5), in the auxiliary information represents an ID code word of a related apparatus maker. Each apparatus maker's name may be translated into an ASCII code word. In this case, 56 higher bits of the ASCII code word are used as the apparatus maker ID information piece.

Different ID code words are preassigned to movie makers for providing contents information, respectively. The contents provider ID information piece, that is, the information piece 6), in the auxiliary information represents an ID code word of a related movie maker. Each movie maker's name may be translated into an ASCII code word. In this case, 56 higher bits of the ASCII code word are used as the contents provider ID information piece.

The time information piece, that is, the information piece 7), in the auxiliary information piece represents, for example, a playback allowable time limit or a recording date. Year, month, day, and time may be converted into numerals. In this case, the time information piece is generated by assigning "0" to numerals less than a reference value, and assigning "1" to numerals equal to or greater than the reference value.

The contents author information piece, that is, the information piece 8), in the auxiliary information represents, for example, an ID number of a person who records and edits contents information. The contents author information piece represents ID numbers of persons who edit and process contents information, or an ID number of a company which edits and processes contents information in the case of making a package of previously-recorded contents information.

Serial numbers are given to players (reproducing apparatuses or reproducing devices), respectively. The reproducing apparatus ID information piece, that is, the information piece 9), in the auxiliary information represents, for example, a serial number of a related player.

The connection apparatus ID information piece, that is, the information piece 10), in the auxiliary information represents, for example, a number selected from among a serial number and a type-related number of a communication-opposite-party apparatus which is connected with the present apparatus when mutual authentication is executed therebetween.

Different ID code words are previously recorded on media, respectively. The ID code words may represent ID numbers peculiar to the media, respectively. Alternatively, the ID code words may represent serial numbers assigned to the media, respectively. The medium ID information piece, that is, the information piece 11), in the auxiliary information represents, for example, an ID code word of a used medium.

Different ID code words are preassigned to contents (for example, movies or music tunes) respectively. The contents ID information piece, that is, the information piece 12), in the auxiliary information represents, for example, an ID code word of one content.

The accounting information piece, that is, the information piece 13), in the auxiliary information represents, for example, an ID number of a program about which accounting is normally executed. According to a second example, the accounting information piece represents an ID number of an individual or a family normally executing accounting. Only in the case where accounting is executed, a specified secrete number may be issued. In this case, data representative of the specified secret number may be used as the accounting information piece.

The auxiliary information may include ID information for identifying a key or a key-base information piece. There may be a plurality of information pieces representative of different keys or a plurality of key-base information pieces.

For example, an ID number for identifying an effective key is recorded on each sector as auxiliary information. In this case, the ID number is in the range of 1 to N, where N denotes a predetermined natural number. ID information for identifying an effective key is settled when the readout of information from a related sector has been completed. Accordingly, the recorded ID information is set in a state delayed by one sector.

Fifth Embodiment

A fifth embodiment of this invention is based on the fourth embodiment thereof. In the fifth embodiment of this invention, auxiliary information contains 1) information related to a copyright and 2) information representing whether or not a recording medium storing contents information is legitimate. The auxiliary information includes authentication data. The authentication data represent ASCII characters which mean the name of a copyright holder, the name of a company, and the name of a studio performing an authoring procedure. Alternatively, the authentication data may represent a binary ID code word for identifying the name of a copyright holder, the name of a company, and the name of a studio performing an authoring procedure. The authentication data are composed of, for example, about 32 bits.

Information representing whether or not a recording medium storing contents information is legitimate is generated on the basis of an authentication system using public-key cryptography. Signature information indicates the legitimacy of contents information. For example, the signature information is generated by a general signature system (an RSA signature system or a DSS signature system) which applies a copyright-holder secret key to a message digest made by a hash function.

With reference to FIG. 23, a read-only recording medium 1501 stores a bit stream having a sequence of code words. The bit stream is inputted into a legitimate recorder 1502 from the read-only recording medium 1501. The legitimate recorder 1502 includes a demodulator 1503 and a modulator 1504. The demodulator 1503 is similar to the demodulator 76 (see FIG. 15). The modulator 1504 is similar to the modulator 1 (see FIG. 1). The demodulator 1503 recovers main data (main information) and auxiliary information from the input bit stream. The recovered main data are inputted into the modulator 1504. The recovered auxiliary information is inputted into the modulator 1504. The modulator 1504 combines and processes the main data and the auxiliary information into a bit stream having a sequence of code words. The modulator 1504 outputs the bit stream which is recorded on a duplicate recording medium 1505. As a result, the main data and the auxiliary data are recorded on the duplicate recording medium 1505.

The bit stream is inputted into a legitimate reproducing apparatus 1506 from the duplicate recording medium 1505. The legitimate reproducing apparatus 1506 includes a demodulator 1507, a recording and reproducing device 1509, and a legitimacy deciding device 1508. The demodulator 1507 is similar to the demodulator 76 (see FIG. 15). The demodulator 1507 recovers the main data and the auxiliary information from the input bit stream. The recovered main data are inputted into the recording and reproducing device 1509. The recovered auxiliary information is inputted into the legitimacy deciding device 1508. Since the auxiliary information has been recorded by the legitimate recorder 1502, the legitimacy deciding device 1508 confirms that authentication data in the auxiliary information are correct. When the legitimacy deciding device 1508 confirms that authentication data in the auxiliary information are correct, the legitimacy deciding device 1508 feeds a playback-permission signal to the recording and reproducing device 1509. The recording and reproducing device 1509 outputs the main data to a display 1510 in response to the playback-permission signal so that the main data are indicated on the display 1510. In this way, the main data are played back.

With reference to FIG. 24, a read-only recording medium 1501 stores a bit stream having a sequence of code words. The bit stream is inputted into an illegitimate recorder 1512 from the read-only recording medium 1501. The illegitimate recorder 1502 includes a demodulator 1513 and a modulator 1514. The demodulator 1513 recovers only main data (main information) from the input bit stream. The recovered main data are inputted into the modulator 1514. The modulator 1514 processes the main data into a bit stream having a sequence of code words. The modulator 1514 outputs the bit stream which is recorded on a duplicate recording medium 1515. As a result, only the main data are recorded on the duplicate recording medium 1515.

The bit stream is inputted into a legitimate reproducing apparatus 1506 from the duplicate recording medium 1515. In the legitimate reproducing apparatus 1506, a demodulator 1507 recovers only the main data from the input bit stream. The recovered main data are inputted into a recording and reproducing device 1509. Correct auxiliary information can not be inputted into a legitimacy deciding device 1508. Therefore, the legitimacy deciding device 1508 judges that authentication data are wrong. When the legitimacy deciding device 1508 judges that authentication data are wrong, the legitimacy deciding device 1508 feeds a playback-inhibition signal to the recording and reproducing device 1509. The recording and reproducing device 1509 is disabled by the playback-inhibition signal so that the main data are inhibited from being played back.

Recording may be controlled in response to a result of a decision about legitimacy. In this case, the auxiliary information may contain information representing a predetermined number of times recording is permitted. The auxiliary information may contain information representing a state such as "copy free", "once copy", or "never copy" in the CGMS. Recording control may be implemented as follows. After authentication has been successful, CGMS-related information (auxiliary information) is detected. In the case where the detected CGMS-related information denotes "copy free", data recording on a duplicate recording medium is permitted. In the case where the detected CGMS-related information denotes "once copy", the CGMS-related information is changed to a state of "never copy" and then data recording on a duplicate recording medium is permitted. In the case where the detected CGMS-related information denotes "never copy", data recording on a duplicate recording medium is inhibited.

Sixth Embodiment

A sixth embodiment of this invention is based on the fourth embodiment thereof. In the sixth embodiment of this invention, auxiliary information contains information related to an address to be accessed. Pieces of electronic data are arranged in an order different from an original playback order on a unit-by-unit basis (for example, a sector-by-sector basis) before being recorded on a recording medium. Each sector is loaded with auxiliary information representing the position of the head of a sector which should follow the sector in the original playback order. During playback, auxiliary information is reproduced, and jumps between sectors are executed in response to the reproduced auxiliary information to provide a sector sequence accorded with the original playback order.

A recording medium stores multiplexed audio information and video information which result from MPEG-based data compression. According to the MPEG-based data compression, a motion compensator generates data representing a decoding-resultant picture. An error between data representing an input picture and the data representing the decoding-resultant picture is calculated. Therefore, temporally-redundant portions of the input-picture data are reduced or deleted. The MPEG-based data compression implements prediction in a direction from the past, prediction in a direction from the future, or prediction in both a direction from the past and a direction from the future. The implemented prediction is changed on an MB-by-MB basis, where MB denotes a macro-block of picture data which corresponds to 16 pixels by 16 pixels. The direction of the implemented prediction is decided by the type of an input picture. Encoding data representative of a P picture is changed between first and second modes. According to the first mode, macro-blocks of the P-picture data are encoded by using the prediction in the direction from the past. According to the second mode, macro-blocks of the P-picture data are independently encoded without using any prediction. Encoding data representative of a B picture is changed among first, second, third, and fourth modes. According to the first mode, macro-blocks of the B-picture data are encoded by using the prediction in the direction from the future. According to the second mode, macro-blocks of the B-picture data are encoded by using the prediction in the direction from the past. According to the third mode, macro-blocks of the B-picture data are encoded by using the prediction in both the direction from the future and the direction from the past. According to the fourth mode, macro-blocks of the B-picture data are independently encoded without using any prediction. Macroblocks of data representative of an I picture are independently encoded without using any prediction.

Motion compensation implements pattern matching between two successive pictures on an MB-by-MB basis, thereby detecting motion vectors having an accuracy corresponding to a half pel (a half pixel). Shifts of picture segments are executed, and prediction is implemented on the basis of the shift-resultant picture segments. Motion vectors are in a horizontal direction and a vertical direction. There is an MC-mode signal (a motion-compensation-mode signal) indicating the starting position for the prediction. Motion vectors and an MC-mode signal are transmitted as added information related to every macro-block. Successive pictures starting from an I picture to a picture immediately-preceding a next I picture are referred to as a group of pictures (GOP). In general, one GOP is composed of about 15 pictures. Compression-resultant data are divided into unit portions of a common logical structure in which video data representative of one GOP and audio data corresponding to the playback time of the video data are multiplexed with each other. A unit portion of the compression-resultant data is referred to as a cell.

Figure 25:
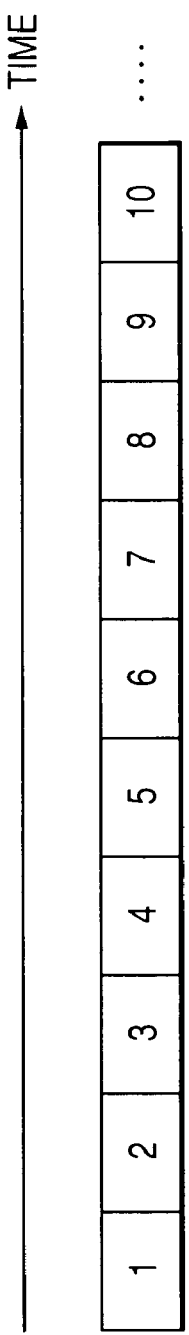
FIG. 25 is a time-domain diagram of a sequence of cells in an original playback order.
Figure 26:
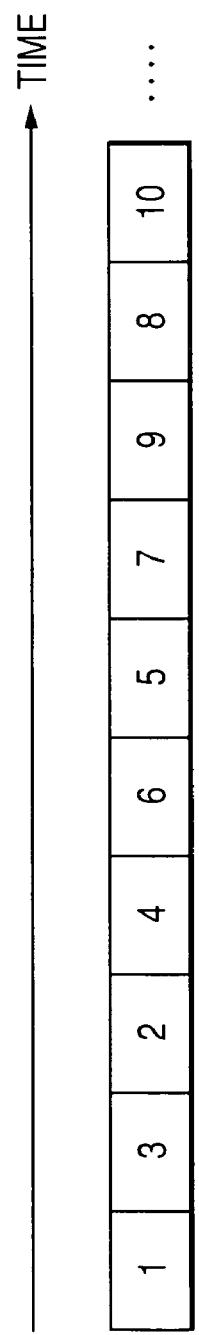
FIG. 26 is a time-domain diagram of a first sequence of cells in an order different from an original playback order.
Figure 27:
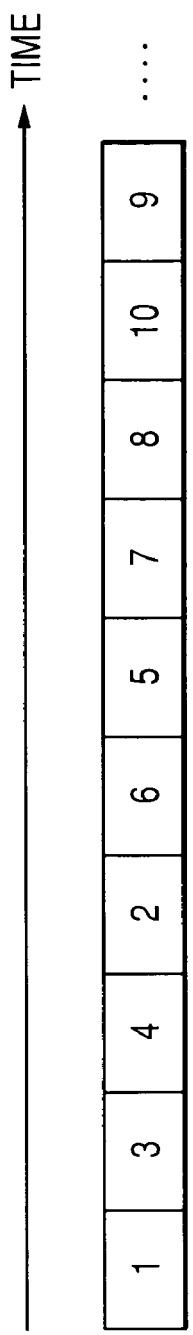
FIG. 27 is a time-domain diagram of a second sequence of cells in an order different from an original playback order.

Cells are reproduced in an original playback order as shown in FIG. 25 so that a program represented by the cells is continuously played back. Cells are rearranged in an order different from the original playback order before being recorded. As a result, the program represented by the cells is scrambled. FIG. 26 shows a first example of the rearranging-resultant order which is caused by jumping some cells to previous positions or later positions. FIG. 27 shows a second example of the rearranging-resultant order which is caused by jumping some cells to previous positions or later positions.

The auxiliary information has a word of a 3-bit code for each cell. Every 3-bit code word indicates the type of a jump by which a related cell can be returned to its correct position in an original playback order. Specifically, an auxiliary-information code word of "000" indicates that a jump is unnecessary. An auxiliary-information code word of "001" indicates a jump over one cell in the forward direction. An auxiliary-information code word of "010" indicates a jump over two cells in the forward direction. An auxiliary-information code word of "011" indicates a jump over three cells in the forward direction. An auxiliary-information code word of "100" indicates a jump over one cell in the backward direction. An auxiliary-information code word of "101" indicates a jump over two cells in the backward direction. An auxiliary-information code word of "110" indicates a jump over three cells in the backward direction. An auxiliary-information code word of "111" indicates a jump over four cells in the backward direction.

In the case where an auxiliary-information code word of "000" is detected during playback, a related cell is inhibited from being jumped. When an auxiliary-information code word of "001" is detected, a related cell is jumped over one cell in the forward direction. When an auxiliary-information code word of "100" is detected, a related cell is jumped over one cell in the backward direction.

A 3-bit code word is recorded as auxiliary information about every cell. A reproducing apparatus detects auxiliary information, and recovers a 3-bit code word therefrom. The reproducing apparatus jumps a related cell in response to the recovered 3-bit code word. As a result, cells are rearranged in the original playback order so that a program represented by the cells can be sequentially played back.

It is assumed that data are recorded on a duplicate recording medium 1515 by the illegitimate recorder 1512 of FIG. 24. Since the data recorded on the duplicate recording medium 1515 lack auxiliary information, the data reproduced from the duplicate recording medium 1515 are in an order different from an original playback order. Therefore, in this case, the contents represented by the data are prevented from being correctly played back.

In the case where an illegitimate reproducing apparatus incapable of reproducing auxiliary information reproduces data containing both main information and auxiliary information, the reproduced data are in an order different from an original playback order. Therefore, in this case, the contents represented by the reproduced data are prevented from being correctly played back.

Figure 28:
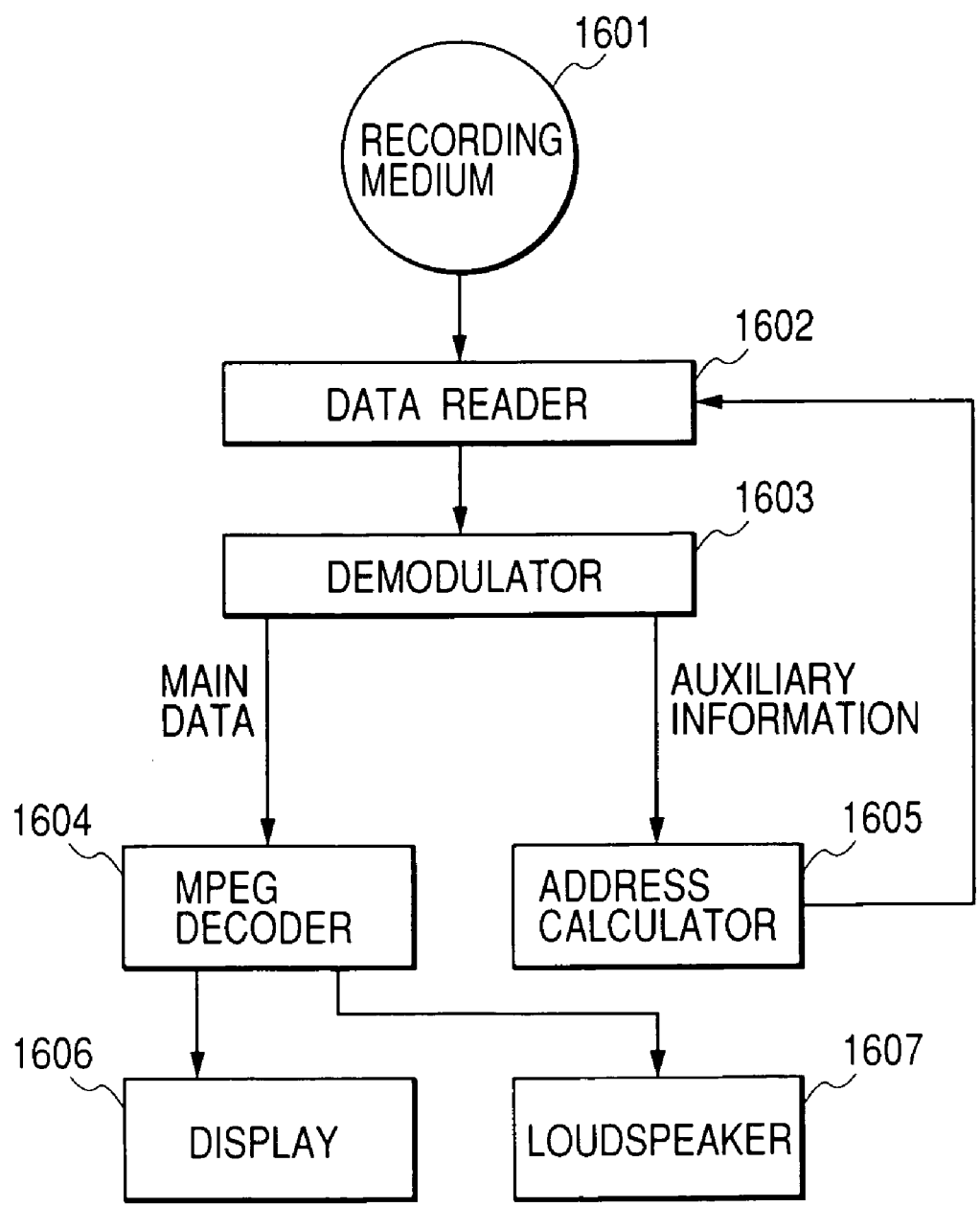
FIG. 28 is a block diagram of an information reproducing apparatus according to a sixth embodiment of this invention.

With reference to FIG. 28, a recording medium 1601 stores data in an order different from an original playback order. The stored data contain main data representing a set of audio information and video information placed in cells. The stored data also contain auxiliary information for every cell which indicates the type of a jump by which the related cell can be returned to its correct position in the original playback order. A data reader 1602 reads out the data from the recording medium 1601 on a cell-by-cell basis. The data reader 1602 feeds the read-out data to a demodulator 1603. The data reader 1602 notifies an address calculator 1605 of the currently-accessed point on the recording medium 1601. The demodulator 1603 is similar to the demodulator 76 (see FIG. 15). The demodulator 1603 reproduces main data and auxiliary information from the read-out data. The demodulator 1603 outputs the reproduced main data to an MPEG decoder 1604. The demodulator 1603 outputs the reproduced auxiliary information to the address calculator 1605. The MPEG decoder 1604 subjects the main data to an MPEG decoding procedure, thereby reproducing a video signal and an audio signal. The MPEG decoder 1604 feeds the reproduced video signal to a display 1606. The reproduced video signal is indicated on the display 1606. The MPEG decoder 1604 feeds the reproduced audio signal to a loudspeaker 1607. The reproduced audio signal is converted into corresponding sounds by the loudspeaker 1607.

The address calculator 1605 derives a 3-bit code word from the auxiliary information. The address calculator 1605 computes a jump-destination address from the derived 3-bit code word and the currently-accessed point on the recording medium 1601 which is notified by the data reader 1602. The jump-designation address denotes the position to which the currently-accessed point on the recording medium 1601 should be jumped, that is, the position of the head of a cell to be accessed next. The address calculator 1605 notifies the data reader 1602 of the computed jump-destination address. When the read-out of the data from the current cell has been completed, the data reader 1602 jumps the currently-accessed point on the recording medium 1601 to the position denoted by the jump-destination address and then starts reading out the data from a next cell.

Figure 29:
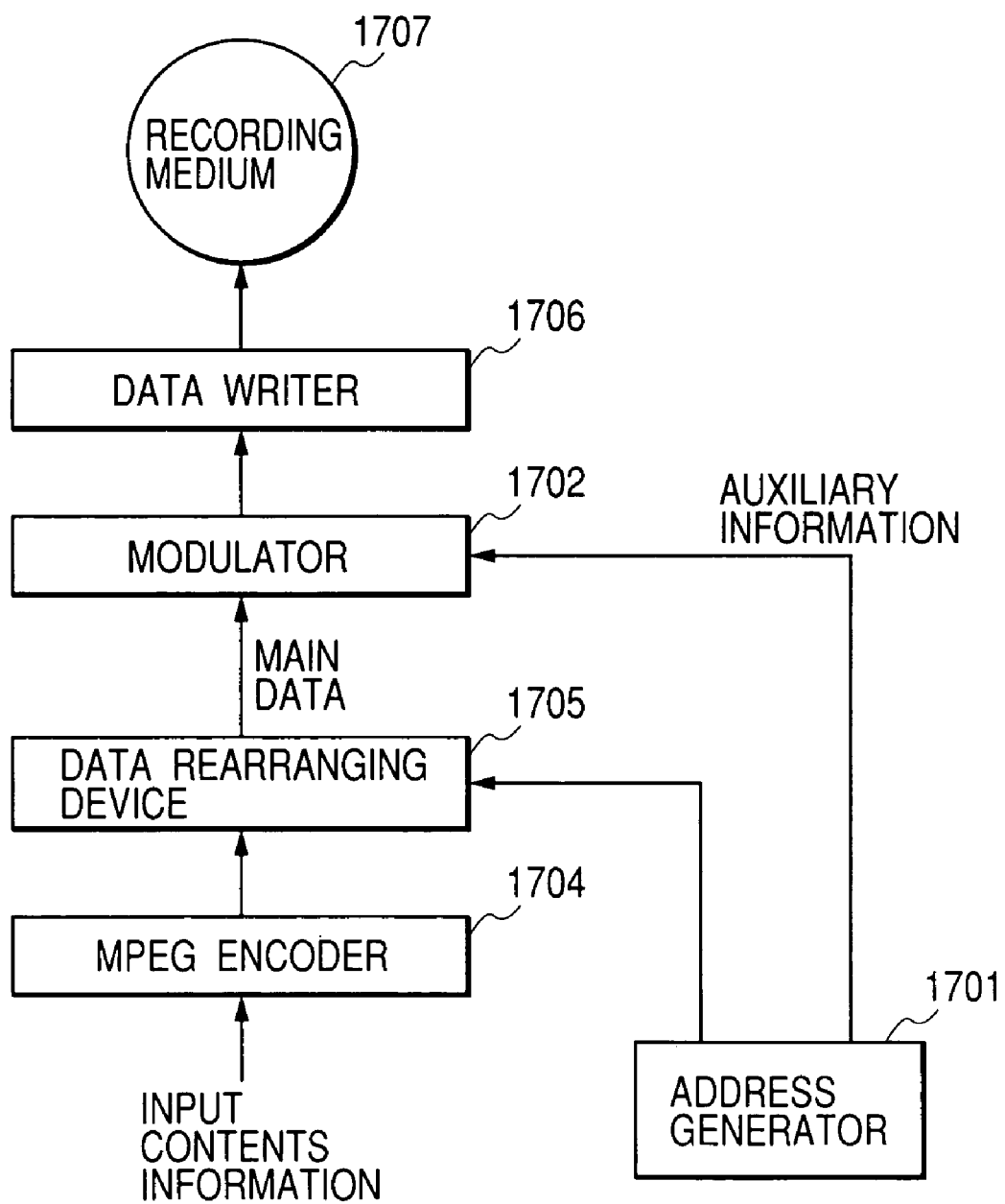
FIG. 29 is a block diagram of an information recording apparatus in the sixth embodiment of this invention.

With reference to FIG. 29, an MPEG encoder 1704 compressively encodes input contents data into MPEG contents data. The MPEG encoder 1704 outputs a sequence of cells of the MPEG contents data to a data rearranging device 1705. An address generator 1701 produces a jump-destination address for each cell. According to the produced jump-destination addresses, cells are rearranged in an order different from an original playback order. The address generator 1701 converts every jump-designation address into a 3-bit code word, and outputs the 3-bit code word to a modulator 1702 as auxiliary information. The address generator 1701 notifies the data rearranging device 1705 of every jump-destination address. The data rearranging device 1705 rearranges the cells of the MPEG contents data in an order being different from the original playback order and being determined by the jump-destination addresses. The date rearranging device 1705 outputs the cells of the MPEG contents data to the modulator 1702 in the rearranging-resultant order. The modulator 1702 is similar to the modulator 1 (see FIG. 1). The modulator 1702 handles the MPEG contents data as main information. The modulator 1702 processes the MPEG contents data and the auxiliary information into a composite digital signal having a bit stream. The modulator 1702 feeds the composite digital signal to a data writer 1706. The data writer 1706 writes the composite digital signal on a recording medium 1707.

It should be noted that a transmission encoder may receive the composite digital signal from the modulator 1702. The transmission encoder changes the composite digital signal into a second digital signal which is of a code suited for transmission via a communication network or a digital broadcasting network. The transmission encoder outputs the second digital signal to a transmission medium formed by a communication network or a digital broadcasting network. In this case, the second digital signal is sent to a user via the communication network or the digital broadcasting network.

What is claimed is:

1. A modulation method comprising the steps of:
generating a final 15-bit output code word in response to every 8-bit input code word by referring to a set of encoding tables, wherein the encoding tables contain output code words assigned to input code words, and contain state information accompanying each output code word, wherein the state information designates an encoding table among the encoding tables which is used next to generate an output code word immediately following the output code word accompanied with the state information in a manner such that a resultant succession of the output code words follows predetermined run length limiting rules, and wherein NRZI conversion results of output code words in first specified one of the encoding tables which are assigned to prescribed input code words are opposite in polarity to NRZI conversion results of output code words in second specified one of the encoding tables which are assigned to the prescribed input code words;

generating a first candidate current output code word in response to a current input code word equal to one of the prescribed input code words by referring to the first specified one of the encoding tables;

generating a second candidate current output code word in response to the current input code word equal to said one of the prescribed input code words by referring to the second specified one of the encoding tables;

calculating a first DSV from the first candidate current output code word and previous final output code words;

calculating a second DSV from the second candidate current output code word and previous final output code words;

determining which of an absolute value of the first DSV and an absolute value of the second DSV is smaller;

selecting one from the first and second candidate current output code words which corresponds to the smaller DSV absolute value as a final current output code word; and superimposing auxiliary information on a sequence of final output code words;

wherein the predetermined run length limiting rules causes a minimum run length in a result of NRZI conversion of the sequence of the final output code words except a sync signal to be equal to 3T, and causes a maximum run length therein to be equal to 14T or less, where T denotes a channel bit period related to the final output code words.

2. A modulation method as recited in claim 1, further comprising the step of selectively setting the maximum run length to either 11T or 14T.

3. A modulation method as recited in claim 1, wherein the superimposing step comprises changing the predetermined run length limiting rules to change the maximum run length in response to the auxiliary information.

4. A modulation method as recited in claim 1, wherein the auxiliary information comprises a sequence of unit blocks each having a predetermined number of bits.

5. A modulation apparatus for modulating input code words in the modulation method in claim 1.

6. A demodulation method of demodulating a sequence of code words which is generated by the modulation method in claim 1, the demodulation method comprising the steps of:

recovering encoding-state information from the code-word sequence, the encoding-state information representing which of encoding tables has been used in generating a code word immediately following a code word of interest;

demodulating the code word of interest into an original code word by referring to a decoding table in response to the generated encoding-state information; and reproducing auxiliary information from the code-word sequence.

7. A demodulation apparatus for demodulating a sequence of code words which is generated by the modulation method in claim 1, the demodulation apparatus comprising:

means for recovering encoding-state information from the code-word sequence, the encoding-state information representing which of encoding tables has been used in generating a code word immediately following a code word of interest:

means for demodulating the code word of interest into an original code word by referring to an encoding table in response to the generated encoding-state information; and means for reproducing auxiliary information from the code-word sequence.

8. A recording medium storing a sequence of code words which is generated by the modulation method in claim 1.

9. A recording medium storing a sequence of code words which is generated by the modulation apparatus in claim 5.

10. A transmission apparatus for transmitting a sequence of code words which is generated by the modulation method in claim 1.

11. A transmission apparatus for transmitting a sequence of code words which is generated by the modulation apparatus in claim 5.

12. A transmission method of transmitting a sequence of code words which is generated by the modulation method in claim 1.

13. A transmission method of transmitting a sequence of code words which is generated by the modulation apparatus in claim 5.

14. A method of recording auxiliary information, comprising the steps of:

generating a final 15-bit output code word in response to every 8-bit input code word by referring to a set of encoding tables, wherein the encoding tables contain output code words assigned to input code words, and contain state information accompanying each output code word, wherein the state information designates an encoding table among the encoding tables which is used next to generate an output code word immediately following the output code word accompanied with the state information in a manner such that a resultant succession of the output code words follows predetermined run length limiting rules, and wherein NRZI conversion results of output code words in first specified one of the encoding tables which are assigned to prescribed input code words are opposite in polarity to NRZI conversion results of output code words in second specified one of the encoding tables which are assigned to the prescribed input code words;

generating a first candidate current output code word in response to a current input code word equal to one of the prescribed input code words by referring to the first specified one of the encoding tables;

generating a second candidate current output code word in response to the current input code word equal to said one of the prescribed input code words by referring to the second specified one of the encoding tables;

calculating a first DSV from the first candidate current output code word and previous final output code words;

calculating a second DSV from the second candidate current output code word and previous final output code words;

determining which of an absolute value of the first DSV and an absolute value of the second DSV is smaller;

selecting one from the first and second candidate current output code words which corresponds to the smaller DSV absolute value as a final current output code word; and superimposing auxiliary information on a sequence of final output code words;

wherein the auxiliary information contains at least one of 1) an information piece about an encryption key, 2) an information piece being a base of an encryption key, 3) a designating information piece for identifying an encryption key, 4) a designating information piece for identifying a base of an encryption key, 5) an information piece about a region or regions corresponding to one or more countries, one or more zones, or one or more spaces, 6) an information piece about identification of an individual, 7) an information piece about identification of a group of persons, 8) an information piece about a rating, 9) an information piece about identification of an apparatus maker or a device maker, 10) an information piece about identification of a contents provider, 11) an information piece about time, 12) an information piece about contents authors, 13) an information piece about identification of a reproducing apparatus or a reproducing device, 14) an information piece about identification of a connection apparatus or a connection device, 15) an information piece about identification of a medium on which contents information is recorded, 16) an information piece about identification of contents information, 17) an information piece about accounting, 18) an information piece about playback control, 19) an information piece about an address to be accessed, 20) an information piece about recording control, 21) an information piece about a URL address related to contents information, 22) an information piece representing characters, 23) an information piece representing an auxiliary picture, 24) an information piece about audio, 25) an information piece about a copyright, and 26) an information piece about legitimacy of a recording medium storing data.

15. A method as recited in claim 14, wherein the predetermined run length limiting rules causes a minimum run length in a result of NRZI conversion of the sequence of the final output code words except a sync signal to be equal to 3T, and causes a maximum run length therein to be equal to 14T or less, where T denotes a channel bit period related to the final output code words, and further comprising the step of selectively setting the maximum run length to either 11T or 14T.

16. A method as recited in claim 14, wherein the superimposing step comprises changing the predetermined run length limiting rules to change the maximum run length in response to the auxiliary information.

17. A modulation method as recited in claim 14, wherein the auxiliary information comprises a sequence of unit blocks each having a predetermined number of bits.

18. A method of reproducing an auxiliary information from a sequence of code words which is generated by the method in claim 14, the reproducing method comprising the steps of:

recovering encoding-state information from the code-word sequence, the encoding-state information representing which of encoding tables has been used in generating a code word immediately following a code word of interest;

demodulating the code word of interest into an original code word by referring to a decoding table in response to the generated encoding-state information; and reproducing auxiliary information from the code-word sequence.

19. A recording medium storing a sequence of code words which is generated by the method in claim 14.

20. A transmission method of transmitting a sequence of code words which is generated by the method in claim 14.

21. A method of reproducing data from a sequence of code words which is generated by the method in claim 14, the reproducing method comprising the steps of:

recovering encoding-state information from the code-word sequence, the encoding-state information representing which of encoding tables has been used in generating a code word immediately following a code word of interest;

demodulating the code word of interest into an original code word by referring to a decoding table in response to the generated encoding-state information;

reproducing auxiliary information from the code-word sequence; and executing, in response to the reproduced auxiliary information, at least one of 1) generation of an encryption key, 2) identification of an encryption key, 3) identification of a base of an encryption key, 4) control of playback on the basis of a region, 5) control of playback on the basis of a rating, 6) control of recording and playback on the basis of identification information, 7) control of recording and playback on the basis of recording and playback control information, 8) decision about an address to be accessed, 9) access to an URL address related to contents information, 10) playback of character information, 11) playback of an auxiliary-picture information, 12) playback of audio visual information, and 13) authentication as to whether or not a recording medium is legitimate.

22. An apparatus for recording auxiliary information, comprising:

means for generating a final 15-bit output code word in response to every 8-bit input code word by referring to a set of encoding tables, wherein the encoding tables contain output code words assigned to input code words, and contain state information accompanying each output code word, wherein the state information designates an encoding table among the encoding tables which is used next to generate an output code word immediately following the output code word accompanied with the state information in a manner such that a resultant succession of the output code words follows predetermined run length limiting rules, and wherein NRZI conversion results of output code words in first specified one of the encoding tables which are assigned to prescribed input code words are opposite in polarity to NRZI conversion results of output code words in second specified one of the encoding tables which are assigned to the prescribed input code words;

means for generating a first candidate current output code word in response to a current input code word equal to one of the prescribed input code words by referring to the first specified one of the encoding tables;

means for generating a second candidate current output code word in response to the current input code word equal to said one of the prescribed input code words by referring to the second specified one of the encoding tables;

means for calculating a first DSV from the first candidate current output code word and previous final output code words;

means for calculating a second DSV from the second candidate current output code word and previous final output code words;

means for determining which of an absolute value of the first DSV and an absolute value of the second DSV is smaller;

means for selecting one from the first and second candidate current output code words which corresponds to the smaller DSV absolute value as a final current output code word; and means for superimposing auxiliary information on a sequence of final output code words;

wherein the auxiliary information contains at least one of 1) an information piece about an encryption key, 2) an information piece being a base of an encryption key, 3) a designating information piece for identifying an encryption key, 4) a designating information piece for identifying a base of an encryption key, 5) an information piece about a region or regions corresponding to one or more countries, one or more zones, or one or more spaces, 6) an information piece about identification of an individual, 7) an information piece about identification of a group of persons, 8) an information piece about a rating, 9) an information piece about identification of an apparatus maker or a device maker, 10) an information piece about identification of a contents provider, ii) an information piece about time, 12) an information piece about contents authors, 13) an information piece about identification of a reproducing apparatus or a reproducing device, 14) an information piece about identification of a connection apparatus or a connection device, 15) an information piece about identification of a medium on which contents information is recorded, 16) an information piece about identification of contents information, 17) an information piece about accounting, 18) an information piece about playback control, 19) an information piece about an address to be accessed, 20) an information piece about recording control, 21) an information piece about a URL address related to contents information, 22) an information piece representing characters, 23) an information piece representing an auxiliary picture, 24) an information piece about audio, 25) an information piece about a copyright, and 26) an information piece about legitimacy of a recording medium storing data.

23. An apparatus as recited in claim 22, wherein the predetermined run length limiting rules causes a minimum run length in a result of NRZI conversion of the sequence of the final output code words except a sync signal to be equal to 3T, and causes a maximum run length therein to be equal to 14T or less, where T denotes a channel bit period related to the final output code words, and further comprising means for selectively setting the maximum run length to either 11T or 14T.

24. An apparatus as recited in claim 22, wherein the superimposing means comprises means for changing the predetermined run length limiting rules to change the maximum run length in response to the auxiliary information.

25. An apparatus as recited in claim 22, wherein the auxiliary information comprises a sequence of unit blocks each having a predetermined number of bits.

26. An apparatus for reproducing an auxiliary information from a sequence of code words which is generated by the apparatus in claim 22, the reproducing apparatus comprising:

means for recovering encoding-state information from the code-word sequence, the encoding-state information representing which of encoding tables has been used in generating a code word immediately following a code word of interest;

means for demodulating the code word of interest into an original code word by referring to a decoding table in response to the generated encoding-state information; and means for reproducing auxiliary information from the code-word sequence.

27. A transmission apparatus for transmitting a sequence of code words which is generated by the apparatus in claim 22.

28. An apparatus for reproducing an auxiliary information from a sequence of code words which is generated by the apparatus in claim 22, the reproducing apparatus comprising:

means for recovering encoding-state information from the code-word sequence, the encoding-state information representing which of encoding tables has been used in generating a code word immediately following a code word of interest;

means for demodulating the code word of interest into an original code word by referring to a decoding table in response to the generated encoding-state information;

means for reproducing auxiliary information from the code-word sequence; and means for executing, in response to the reproduced auxiliary information, at least one of 1) generation of an encryption key, 2) identification of an encryption key, 3) identification of a base of an encryption key, 4) control of playback on the basis of a region, 5) control of playback on the basis of a rating, 6) control of recording and playback on the basis of identification information, 7) control of recording and playback on the basis of recording and playback control information, 8) decision about an address to be accessed, 9) access to an URL address related to contents information, 10) playback of character information, 11) playback of an auxiliary-picture information, 12) playback of audio visual information, and 13) authentication as to whether or not a recording medium is legitimate.

29. A modulation apparatus comprising:

means for generating a final 15-bit output code word in response to every 8-bit input code word by referring to a set of encoding tables, wherein the encoding tables contain output code words assigned to input code words, and contain state information accompanying each output code word, wherein the state information designates an encoding table among the encoding tables which is used next to generate an output code word immediately following the output code word accompanied with the state information;

means for generating a first candidate current output code word in response to a current input code word equal to one of prescribed input code words by referring to one of first and second specified encoding tables among the encoding tables which is designated by state information accompanying an immediately-preceding final output code word;

means for generating a second candidate current output code word in response to the current input code word equal to said one of the prescribed input code words by referring to the other of the first and second specified encoding tables under conditions where a succession of the second candidate current output code word and the immediately-preceding final output code word follows a run length limiting rule;

means for calculating a first DSV from the first candidate current output code word and previous final output code words;

means for calculating a second DSV from the second candidate current output code word and previous final output code words;

means for determining which of an absolute value of the first DSV and an absolute value of the second DSV is smaller;

means for selecting one from the first and second candidate current output code words which corresponds to the smaller DSV absolute value as a final current output code word; and means for changing the run length limiting rule to change a maximum run length in a sequence of final output code words in response to auxiliary information to superimpose the auxiliary information on the sequence of the final output code words.

30. A modulation apparatus as recited in claim 29, wherein the sequence of the final output code words represents encryption-resultant main information, and the auxiliary information contains an information piece for decrypting the encryption-resultant main information.

31. A modulation apparatus as recited in claim 29, wherein the sequence of the final output code words represents scrambling-resultant main information, and the auxiliary information contains an information piece for descrambling the scrambling-resultant main information.

32. A modulation method comprising the steps of:

generating a final 15-bit output code word in response to every S-bit input code word by referring to a set of encoding tables, wherein the encoding tables contain output code words assigned to input code words, and contain state information accompanying each output code word, wherein the state information designates an encoding table among the encoding tables which is used next to generate an output code word immediately following the output code word accompanied with the state information;

generating a first candidate current output code word in response to a current input code word equal to one of prescribed input code words by referring to one of first and second specified encoding tables among the encoding tables which is designated by state information accompanying an immediately-preceding final output code word;

generating a second candidate current output code word in response to the current input code word equal to said one of the prescribed input code words by referring to the other of the first and second specified encoding tables under conditions where a succession of the second candidate current output code word and the immediately-preceding final output code word follows a run length limiting rule;

calculating a first DSV from the first candidate current output code word and previous final output code words:

calculating a second DSV from the second candidate current output code word and previous final output code words;

determining which of an absolute value of the first DSV and an absolute value of the second DSV is smaller;

selecting one from the first and second candidate current output code words which corresponds to the smaller DSV absolute value as a final current output code word; and changing the run length limiting rule to change a maximum run length in a sequence of final output code words in response to auxiliary information to superimpose the auxiliary information on the sequence of the final output code words.

33. A modulation method as recited in claim 32, wherein the sequence of the final output code words represents encryption-resultant main information, and the auxiliary information contains an information piece for decrypting the encryption-resultant main information.

34. A modulation method as recited in claim 32, wherein the sequence of the final output code words represents scrambling-resultant main information, and the auxiliary information contains an information piece for descrambling the scrambling-resultant main information.

* * * * *